(12) United States Patent
Jeong et al.

(10) Patent No.: US 9,602,245 B2
(45) Date of Patent: Mar. 21, 2017

(54) TRANSMITTING APPARATUS AND INTERLEAVING METHOD THEREOF

(71) Applicant: SAMSUNG ELECTRONICS CO., LTD., Suwon-si (KR)

(72) Inventors: Hong-sil Jeong, Suwon-si (KR); Kyung-joong Kim, Seoul (KR); Se-ho Myung, Yongin-si (KR); Daniel Ansorregui Lobete, Staines (GB); Belkacem Mouhouche, Staines (GB)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/716,124

(22) Filed: May 19, 2015

(65) Prior Publication Data
US 2015/0341052 A1 Nov. 26, 2015

Related U.S. Application Data

(60) Provisional application No. 62/001,168, filed on May 21, 2014.

(30) Foreign Application Priority Data

Jan. 5, 2015 (KR) ........................ 10-2015-0000672

(51) Int. Cl.
*H03M 13/00* (2006.01)
*H04L 1/00* (2006.01)
(Continued)

(52) U.S. Cl.
CPC ........ *H04L 1/0057* (2013.01); *G06F 11/1004* (2013.01); *H03M 13/1102* (2013.01);
(Continued)

(58) Field of Classification Search
CPC ........ H03M 13/1102; H03M 13/2778; H03M 13/616; H03M 13/11; H03M 13/27;
(Continued)

(56) References Cited

U.S. PATENT DOCUMENTS 8,170,092 B2 * 5/2012 Atungsiri ............ H04L 27/2602
375/230
8,230,295 B2 * 7/2012 Jeong ...................... H03M 13/11
714/752

(Continued)

OTHER PUBLICATIONS

Proposal to the ATSC 3.0 PHY Layer CfP—Cloud Transmission for the ATSC 3.0 PHY Layer Sep. 26, 2013.*

(Continued)

*Primary Examiner* — Guerrier Merant
(74) *Attorney, Agent, or Firm* — Sughrue Mion, PLLC

(57) ABSTRACT

A transmitting apparatus is provided. The transmitting apparatus includes: an encoder configured to perform a low-density parity check (LDPC) encoding on input bits using a parity check matrix to generate an LDPC codeword comprising information word bits and parity bits; an interleaver configured to interleave the LDPC codeword; and a modulator configured to map the interleaved LDPC codeword onto a modulation symbol, wherein the modulator is further configured to map a bit included in a predetermined bit group from among a plurality of bit groups constituting the LDPC codeword onto a predetermined bit of the modulation symbol.

3 Claims, 45 Drawing Sheets

(51) Int. Cl.
*H03M 13/11* (2006.01)
*H03M 13/27* (2006.01)
*H03M 13/25* (2006.01)
*G06F 11/10* (2006.01)
*H04L 27/36* (2006.01)
*H03M 13/15* (2006.01)

(52) U.S. Cl.
CPC ....... *H03M 13/253* (2013.01); *H03M 13/255* (2013.01); *H03M 13/2707* (2013.01); *H03M 13/2778* (2013.01); *H03M 13/2792* (2013.01); *H03M 13/616* (2013.01); *H04L 1/0041* (2013.01); *H04L 1/0058* (2013.01); *H04L 1/0071* (2013.01); *H04L 27/36* (2013.01); *H03M 13/1165* (2013.01); *H03M 13/152* (2013.01)

(58) Field of Classification Search
CPC ............. H03M 13/253; H03M 13/255; H03M 13/2707; H03M 13/2792; H03M 13/1165; H03M 13/152; H03M 13/251; H04L 1/0041; H04L 1/0071; H04L 1/00; H04L 1/0058; H04L 27/2649; H04L 27/2627
See application file for complete search history.

(56) References Cited

U.S. PATENT DOCUMENTS

| | | | | |
|---|---|---|---|---|
| 8,448,049 | B2* | 5/2013 | Sakai | H03M 13/116 714/752 |
| 8,677,219 | B2* | 3/2014 | Lei | H03M 13/11 714/774 |
| 2009/0063929 | A1 | 3/2009 | Jeong et al. | |
| 2009/0125780 | A1* | 5/2009 | Taylor | H03M 13/1137 714/752 |
| 2009/0125781 | A1* | 5/2009 | Jeong | H03M 13/11 714/752 |
| 2009/0158129 | A1 | 6/2009 | Myung et al. | |
| 2011/0119568 | A1 | 5/2011 | Jeong et al. | |
| 2012/0051460 | A1 | 3/2012 | Jeong et al. | |
| 2013/0216001 | A1 | 8/2013 | Petrov | |
| 2015/0039973 | A1* | 2/2015 | Jeong | H04L 1/0041 714/776 |
| 2015/0121176 | A1* | 4/2015 | Myung | H04L 1/0041 714/776 |
| 2015/0128005 | A1* | 5/2015 | Jeong | H03M 13/036 714/752 |
| 2015/0236721 | A1* | 8/2015 | Kim | H04L 1/0041 714/776 |
| 2015/0236816 | A1* | 8/2015 | Myung | H04L 1/0041 714/776 |
| 2015/0236884 | A1* | 8/2015 | Suh | H04L 27/2649 375/295 |
| 2015/0270853 | A1* | 9/2015 | Jeong | H03M 13/2792 714/752 |
| 2015/0341052 | A1* | 11/2015 | Jeong | H03M 13/1102 714/776 |
| 2015/0341053 | A1* | 11/2015 | Kim | H03M 13/1102 714/776 |
| 2015/0341054 | A1* | 11/2015 | Myung | H03M 13/1102 714/776 |
| 2016/0156371 | A1* | 6/2016 | Ikegaya | H03M 13/19 714/776 |

OTHER PUBLICATIONS

Search Report issued Sep. 7, 2015, issued by the International Searching Authority in counterpart International Patent Application No. PCT/KR2015/005101 (PCT/ISA/210).

Written Opinion issued Sep. 7, 2015, issued by the International Searching Authority in counterpart International Patent Application No. PCT/KR2015/005101 (PCT/ISA/237).

* cited by examiner

TRANSMITTING APPARATUS AND INTERLEAVING METHOD THEREOF

This application claims priority from U.S. Provisional Application No. 62/001,168 field on May 21, 2014 and Korean Patent Application No. 10-2015-0000672 filed on Jan. 5, 2015, the disclosures of which are incorporated herein by reference in their entirety.

BACKGROUND

1. Field

Apparatuses and methods consistent with exemplary embodiments relate to a transmitting apparatus which processes and transmits data, and an interleaving method thereof.

2. Description of the Related Art

In the 21st century information-oriented society, broadcasting communication services are moving into the era of digitalization, multi-channel, wideband, and high quality. In particular, as high quality digital televisions, portable multimedia players and portable broadcasting equipment are increasingly used in recent years, there is an increasing demand for methods for supporting various receiving methods of digital broadcasting services.

In order to meet such demand, standard groups are establishing various standards and are providing a variety of services to satisfy users' needs. Therefore, there is a need for a method for providing improved services to users with high decoding and receiving performance.

SUMMARY

Exemplary embodiments of the inventive concept may overcome the above disadvantages and other disadvantages not described above. However, it is understood that the exemplary embodiment are not required to overcome the disadvantages described above, and may not overcome any of the problems described above.

The exemplary embodiments provide a transmitting apparatus which can map a bit included in a predetermined bit group from among a plurality of bit groups of a low density parity check (LDPC) codeword onto a predetermined bit of a modulation symbol, and transmit the bit, and an interleaving method thereof.

According to an aspect of an exemplary embodiment, there is provided a transmitting apparatus which may include: an encoder configured to perform an LDPC encoding on input bits using a parity check matrix to generate an LDPC codeword comprising information word bits and parity bits; an interleaver configured to interleave the LDPC codeword; and a modulator configured to map the interleaved LDPC codeword onto a modulation symbol, wherein the modulator is further configured to map a bit included in a predetermined bit group from among a plurality of bit groups constituting the LDPC codeword onto a predetermined bit of the modulation symbol.

The parity check matrix may be formed of an information word submatrix and a parity submatrix. Each of the plurality of bit groups constituting the LDPC codeword may be formed of M number of bits. M may be a common divisor of $N_{ldpc}$ and $K_{ldpc}$ and may be determined to satisfy $Q_{ldpc} = (N_{ldpc} - K_{ldpc})/M$. In this case, $Q_{ldpc}$ may be a cyclic shift parameter value regarding columns in a column group of the information word submatrix of the parity check matrix, $N_{ldpc}$ may be a length of the LDPC codeword, and $K_{ldpc}$ may be a length of the information word bits of the LDPC codeword.

The interleaver may include: a parity interleaver configured to interleave the parity bits of the LDPC codeword; a group interleaver configured to divide the parity-interleaved LDPC codeword into the plurality of bit groups and rearrange an order of the plurality of bit groups in bit group wise; and a block interleaver configured to interleave the plurality of bit groups the order of which is rearranged.

The group interleaver may be configured to rearrange the order of the plurality of bit groups in bit group wise by using Equation 21.

Here, in Equation 21, π(j) may be determined based on at least one of a length of the LDPC codeword, a modulation method, and a code rate.

In Equation 21, π(j) can be defined as Table 15, when a length of the LDPC codeword is 16200, the modulation method is 256-QAM, and the code rate is 5/15.

The block interleaver may be configured to interleave by writing bits included in the plurality of bit groups in a plurality of columns in bit group wise in a column direction, and reading the plurality of columns in which the plurality of bit groups are written in bit group wise in a row direction.

The block interleaver may be configured to serially write, in the plurality of columns, bits included in at least some bit groups which are writable in the plurality of columns in bit group wise from among the plurality of bit groups, and divide bits included in bit groups other than the at least some bit groups in an area which is different from an area where the at least some bit groups are written in the plurality of columns in bit group wise.

The block interleaver may be configured to divide the plurality of columns, each including a plurality of rows, into a first part and a second part, write bits included in at least some bit groups in the first part such that bits included in a same bit group is written in a same column, and write bits included in at least one bit group other than the at least some bit groups in the second part.

The block interleaver may be configured to divide the plurality of columns into the first and second parts based on at least one of a number of the columns, a number of the bit groups constituting the LDPC codeword, and a number of bits constituting each of the bit groups.

If a number of bit groups constituting the LDPC codeword is an integer multiple of a number of the columns, the block interleaver may be configured to write all bits included in the bit groups serially in the plurality of columns without dividing the plurality of columns into the first and second parts.

According to an aspect of another exemplary embodiment, there is provided an interleaving method of a transmitting apparatus. The method may include: performing an LDPC encoding on input bits using a parity check matrix to generate an LDPC codeword comprising information word bits and parity bits; interleaving the LDPC codeword; and mapping the interleaved LDPC codeword onto a modulation symbol, wherein the mapping comprises mapping a bit included in a predetermined bit group from among a plurality of bit groups constituting the LDPC codeword onto a predetermined bit of the modulation symbol.

The parity check matrix may be formed of an information word submatrix and a parity submatrix. Each of the plurality of bit groups may be formed of M number of bits, and M may be a common divisor of $N_{ldpc}$ and $K_{ldpc}$ and may be determined to satisfy $Q_{ldpc} = (N_{ldpc} - K_{ldpc})/M$. In this case, $Q_{ldpc}$ may be a cyclic shift parameter value regarding columns in a column group of the information word submatrix of the parity check matrix, $N_{ldpc}$ may be a length of the LDPC codeword, and $K_{ldpc}$ may be a length of the information word bits of the LDPC codeword.

The interleaving may include: interleaving parity bits of the LDPC codeword; dividing the parity-interleaved LDPC codeword into the plurality of bit groups and rearranging an order of the plurality of bit groups in bit group wise; and interleaving the plurality of bit groups the order of which is rearranged.

The rearranging an order of the plurality of bit groups in bit group wise may include rearranging the order of the plurality of bit groups in bit group wise by using the Equation 21.

In Equation 21, π(j) may be determined based on at least one of a length of the LDPC codeword, a modulation method, and a code rate.

In Equation 21, when a length of the LDPC codeword is 16200, the modulation method is 256-QAM, and the code rate is 5/15, π(j) may be defined as Table 15.

The interleaving the plurality of bit groups may include interleaving by writing bits included in the plurality of bit groups in a plurality of columns in bit group wise in a column direction, and reading each row of the plurality of columns in which the bits included in the plurality of bit groups are written in bit group wise in a row direction.

The interleaving the plurality of bit groups may include serially writing, in the plurality of columns, bits included in at least some bit groups which are writable in the plurality of columns in bit group wise from among the plurality of bit groups, and dividing bits included in bit groups other than the at least some bit groups in an area which is different from an area where the at least some bit groups are written in the plurality of columns in bit group wise.

The interleaving the plurality of bit groups may include: dividing the plurality of columns, each including a plurality of rows, into a first part and a second part; and writing bits included in at least some bit groups in the first part such that bits included in a same bit group is written in a same column, and writing bits included in at least one bit group other than the at least some bit groups in the second part.

The dividing the plurality of columns into the first and second parts may be performed based on at least one of a number of the columns, a number of the bit groups constituting the LDPC codeword, and a number of bits constituting each of the bit groups.

If a number of bit groups constituting the LDPC codeword is an integer multiple of a number of the columns, the interleaving the plurality of bit groups may be performed by writing all bits included in the bit groups serially in the plurality of columns without the dividing the plurality of columns into the first and second parts.

According to various exemplary embodiments, improved decoding and receiving performance can be provided.

BRIEF DESCRIPTION OF THE DRAWINGS

The above and/or other aspects will be more apparent by describing in detail exemplary embodiments, with reference to the accompanying drawings, in which.

DETAILED DESCRIPTION OF THE EXEMPLARY EMBODIMENTS

Figure 1A:
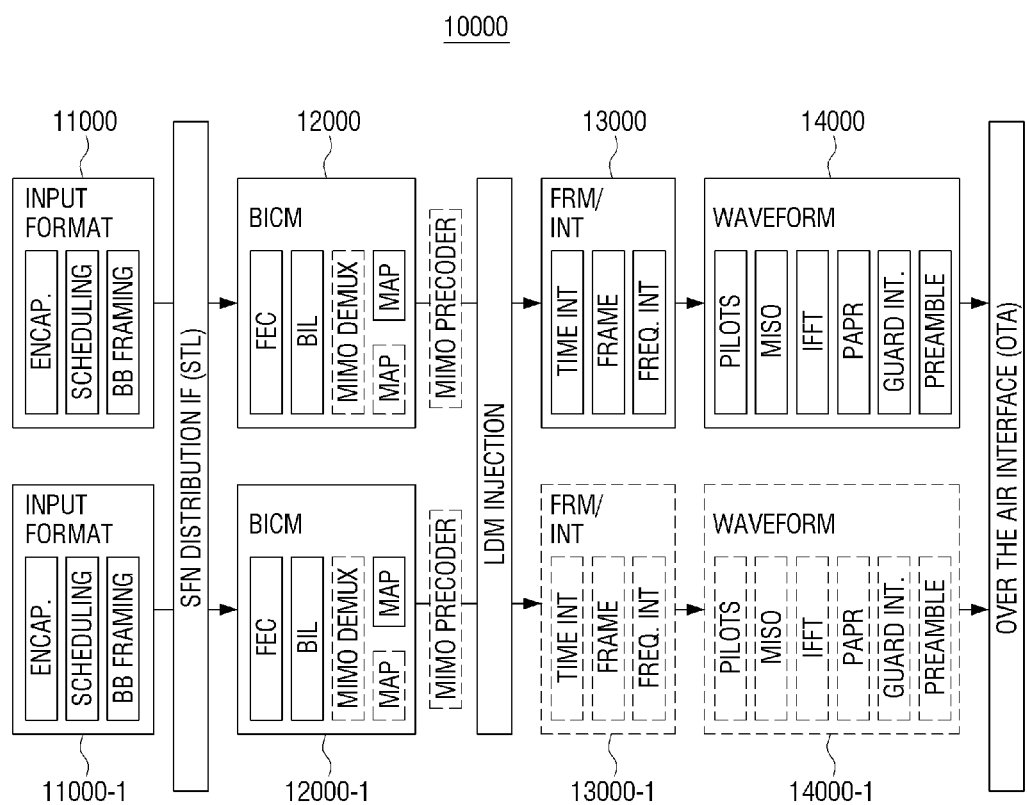
FIGS. 1A to 12 are views to illustrate a transmitting apparatus according to exemplary embodiments.

Hereinafter, various exemplary embodiments will be described in greater detail with reference to the accompanying drawings.

In the following description, same reference numerals are used for the same elements when they are depicted in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

FIG. 1A is provided to explain transmitting apparatus according to an exemplary embodiment.

According to FIG. 1A, a transmitting apparatus 10000 according to an exemplary embodiment may include an Input Formatting Block (or part) 11000, 11000-1, a BIT Interleaved and Coded Modulation (BICM) block 12000, 12000-1, a Framing/Interleaving block 13000, 13000-1 and a Waveform Generation block 14000, 14000-1.

The transmitting apparatus 10000 according to an exemplary embodiment illustrated in FIG. 1A includes normative blocks shown by solid lines and informative blocks shown by dotted lines. Here, the blocks shown by solid lines are normal blocks, and the blocks shown by dotted lines are blocks which may be used when implementing an informative MIMO.

The Input Formatting block 11000, 11000-1 generates a baseband frame (BBFRAME) from an input stream of data to be serviced. Herein, the input stream may be a transport stream (TS), Internet protocol (IP) stream, a generic stream (GS), a generic stream encapsulation (GSE), etc.

The BICM block 12000, 12000-1 determines a forward error correction (FEC) coding rate and a constellation order depending on a region where the data to be serviced will be transmitted (e.g., a fixed PHY frame or mobile PHY frame), and then, performs encoding. Signaling information on the data to be serviced may be encoded through a separate BICM encoder (not illustrated) or encoded by sharing the BICM encoder 12000, 12000-1 with the data to be serviced, depending on a system implementation.

The Framing/Interleaving block 13000, 13000-1 combines time interleaved data with signaling information to generate a transmission frame.

The Waveform Generation block 14000, 14000-1 generates an OFDM signal in the time domain on the generated transmission frame, modulates the generated OFDM signal to a radio frequency (RF) signal and transmits the modulated RF signal to a receiver.

Figure 1B:
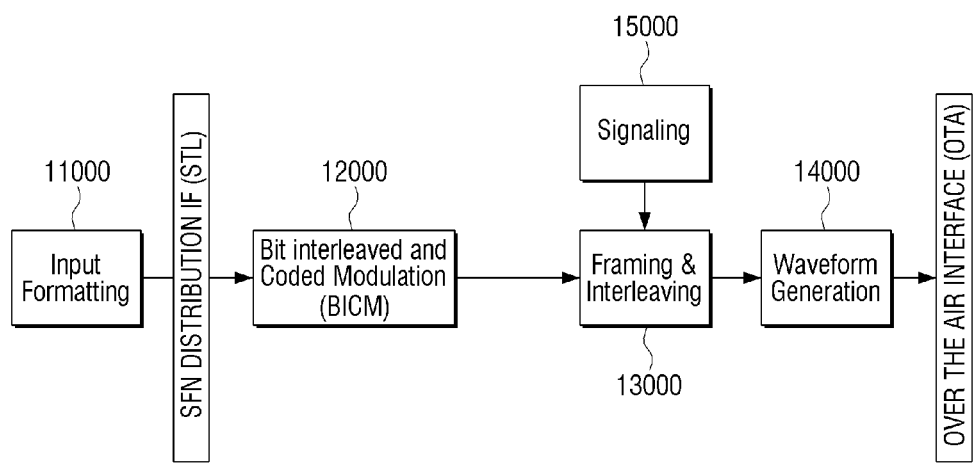
Figure 1C:
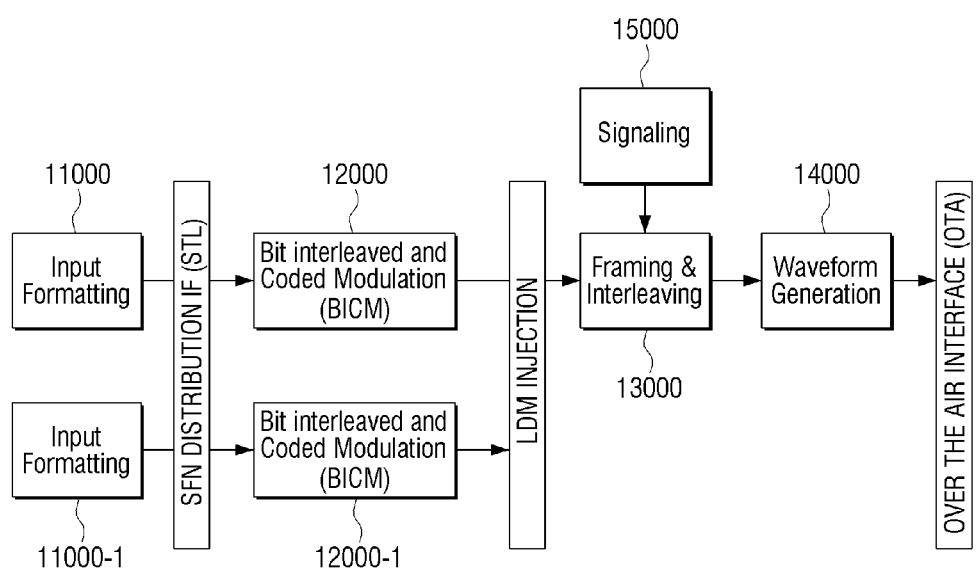

FIGS. 1B and 1C are provided to explain methods of multiplexing according to an exemplary embodiment.

FIG. 1B illustrates a block diagram to implement a Time Division Multiplexing according to an exemplary embodiment.

In the TDM system architecture, there are four main blocks (or parts): the Input Formatting block 11000, the BICM block 12000, the Framing/Interleaving block 13000, and the Waveform Generation block 14000.

Data is input and formatted in the Input Formatting block, and forward error correction applied and mapped to constellations in the BICM block 12000. Interleaving, both time and frequency, and frame creation done in the Framing/Interleaving block 13000. Subsequently, the output waveform is created in the Waveform Generation block 14000.

FIG. 2B illustrates a block diagram to implement a Layered Division Multiplexing (LDM) according to another exemplary embodiment.

In the LDM system architecture, there are several different blocks compared with the TDM system architecture. Specifically, there are two separate Input Formatting blocks 11000, 11000-1 and BICM blocks 12000, 12000-1, one for each of the layers in LDM. These are combined before the Framing/Interleaving block 13000 in the LDM Injection block. The Waveform Generation block 14000 is similar to TDM.

Figure 2:
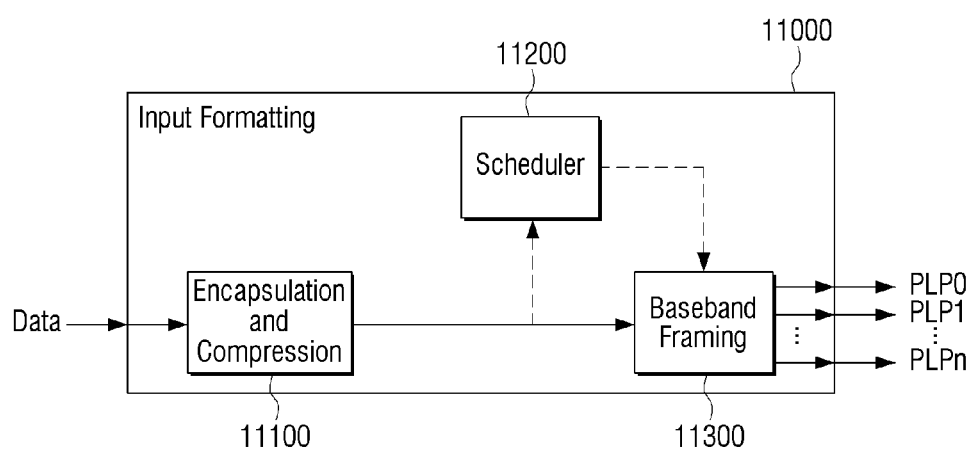

FIG. 2 is a block diagram which illustrates detailed configuration of the Input Formatting block illustrated in FIG. 1A.

As illustrated in FIG. 2, the Input Formatting block 11000 consists of three blocks which control packets distributed into PLPs. Specifically, the Input Formatting block 11000 includes a packet encapsulation and compression block 11100, a baseband framing block 11200 and a scheduler block 11300.

Input data packets input to the Input Formatting block 11000 can consist of various types, but at the encapsulation operation these different types of packets become generic packets which configure baseband frames. Here, the format of generic packets is variable. It is possible to easily extract the length of the generic packet from the packet itself without additional information. The maximum length of the generic packet is 64 kB. The maximum length of the generic packet, including header, is four bytes. Generic packets must be of integer byte length.

The scheduler 11200 receives an input stream of encapsulated generic packets and forms them into physical layer pipes (PLPs), in the form of baseband frames. In the above-mentioned TDM system there may be only one PLP, called single PLP or S-PLP, or there may be multiple PLPs, called M-PLP. One service cannot use more than four PLPs. In the case of an LDM system consisting of two layers, two PLPs are used, one for each layer.

The scheduler 11200 receives encapsulated input packet streams and directs how these packets are allocated to physical layer resources. Specifically, the scheduler 11200 directs how the baseband framing block will output baseband frames.

The functional assets of the Scheduler 11200 are defined by data size(s) and time(s). The physical layer can deliver portions of data at these discrete times. The scheduler 11200 uses the inputs and information including encapsulated data packets, quality of service metadata for the encapsulated data packets, a system buffer model, constraints and configuration from system management, and creates a conforming solution in terms of configuration of the physical layer parameters. The corresponding solution is subject to the configuration and control parameters and the aggregate spectrum available.

Meanwhile, the operation of the Scheduler 11200 is constrained by combination of dynamic, quasi-static, and static configurations. The definition of these constraints is left to implementation.

Figure 3A:
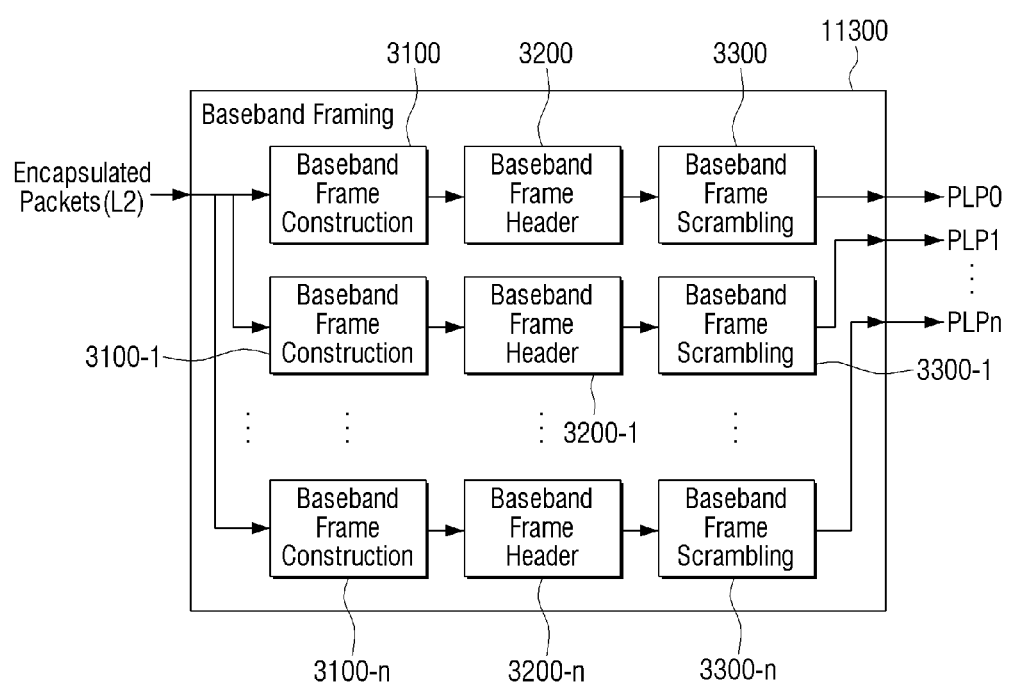

In addition, for each service a maximum of four PLPs shall be used. Multiple services consisting of multiple time interleaving blocks may be constructed, up to a total maximum of 64 PLPs for bandwidths of 6, 7 or 8 MHz. The baseband framing block 11300, as illustrated in FIG. 3A, consists of three blocks, baseband frame construction 3100, 3100-1, . . . 3100-n, baseband frame header construction block 3200, 3200-1, . . . 3200-n, and the baseband frame scrambling block 3300, 3300-1, . . . 3300-n. In a M-PLP operation, the baseband framing block creates multiple PLPs as necessary.

Figure 3B:
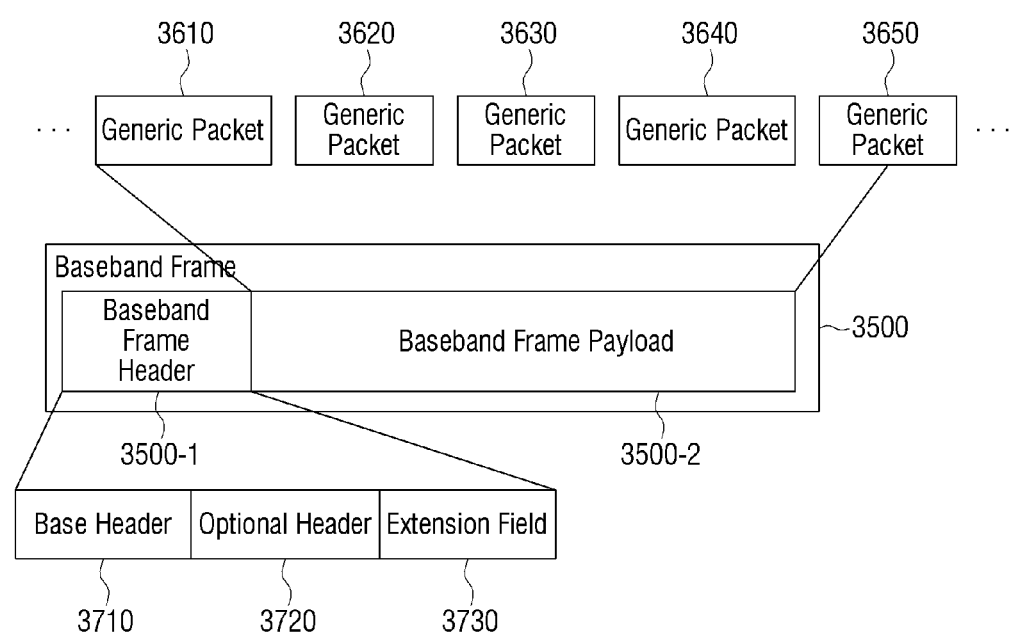

A baseband frame 3500, as illustrated in FIG. 3B, consists of a baseband frame header 3500-1 and payload 3500-2 consisting of generic packets. Baseband frames have fixed length $K_{payload}$. Generic packets 3610-3650 shall be mapped to baseband frames 3500 in order. If generic packets 3610-3650 do not completely fit within a baseband frame, packets are split between the current baseband frame and the next baseband frame. Packet splits shall be in byte units only.

The baseband frame header construction block 3200, 3200-1, . . . 3200-n configures the baseband frame header. The baseband frame header 3500-1, as illustrated in FIG. 3B, is composed of three parts, including the base header 3710, the optional header (or option field 3720) and the extension field 3730. Here, the base header 3710 appears in every baseband frame, and the optional header 3720 and the extension field 3730 may not be present in every time.

The main feature of the base header 3710 is to provide a pointer including an offset value in bytes as an initiation of the next generic packet within the baseband frame. When the generic packet initiates the baseband frame, the pointer value becomes zero. If there is no generic packet which is initiated within the baseband frame, the pointer value is 8191, and a 2-byte base header may be used.

The extension field (or extension header) 3730 may be used later, for example, for the baseband frame packet counter, baseband frame time stamping, and additional signaling, etc.

The baseband frame scrambling block 3300, 3300-1, . . . 3300-n scrambles the baseband frame.

In order to ensure that the payload data when mapped to constellations does not always map to the same point, such as when the payload mapped to constellations consists of a repetitive sequence, the payload data shall always be scrambled before forward error correction encoding.

The scrambling sequences shall be generated by a 16-bit shift register that has 9 feedback taps. Eight of the shift register outputs are selected as a fixed randomizing byte, where each bit from this byte is used to individually XOR the corresponding input data. The data bits are XORed MSB to MSB and so on until LSB to LSB. The generator polynomial is $G(x)=1+X+X^3+X^6+X^7+X^{11}+X^{12}+X^{13}+X^{16}$.

Figure 4:
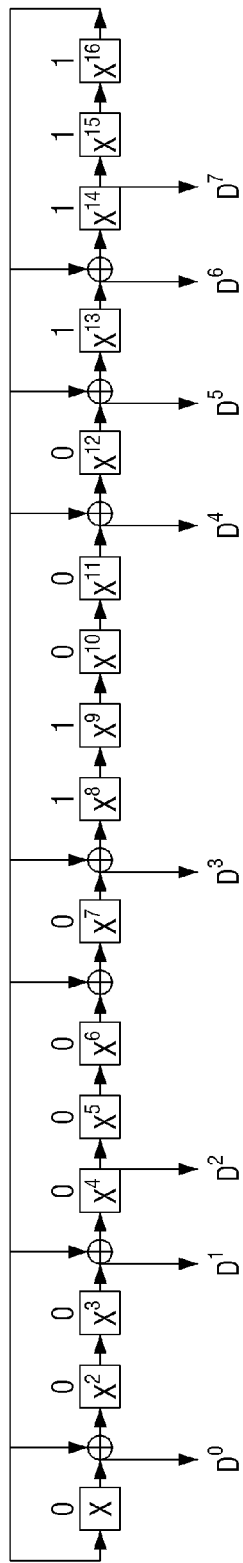

FIG. 4 illustrates a shift register of a PRBS encoder for scrambling a baseband according to an exemplary embodiment, wherein loading of the sequence into the PRBS register, as illustrated in FIG. 4 and shall be initiated at the start of every baseband frame.

Figure 5:
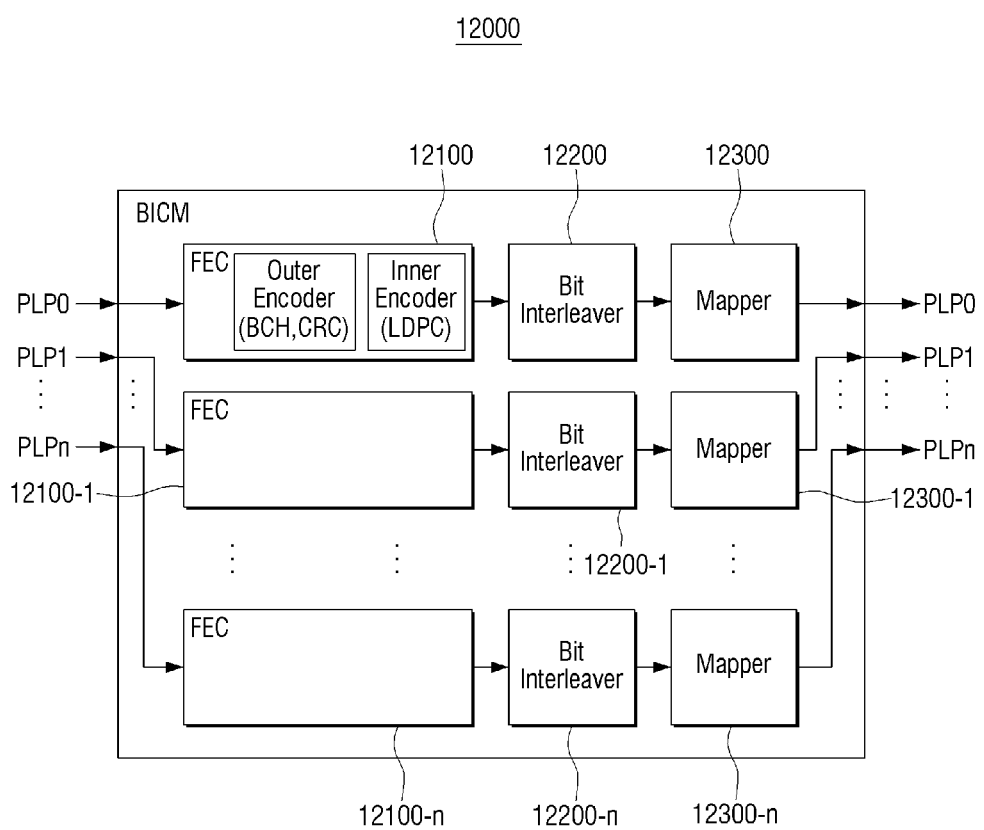

FIG. 5 is a block diagram provided to explain detailed configuration of the BICM block illustrated in FIG. 1A.

As illustrated in FIG. 5, the BICM block includes the FEC block 14100, 14100-1, . . . , 14100-n, Bit Interleaver block 14200, 14200-1, . . . , 14200-n and Mapper blocks 14300, 14300-1, . . . , 14300-n.

Figure 6A:
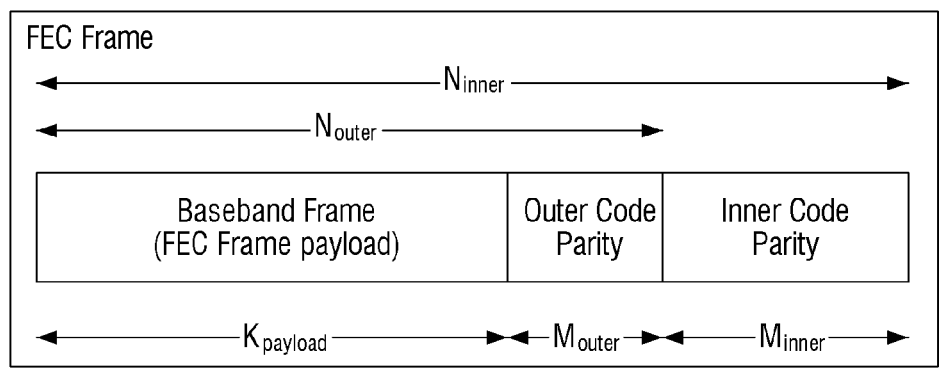

The input to the FEC block 1400, 14100-1, . . . , 14100-n is a Baseband frame, of length $K_{payload}$, and the output from the FEC block is a FEC frame. The FEC block 14100, 14100-1, . . . , 14100-n is implemented by concatenation of an outer code and an innter code with the information part. The FEC frame has length $N_{inner}$. There are two different lengths of LDPC code defined: $N_{inner}=64800$ bits and $N_{inner}=16200$ bits The outer code is realized as one of either Bose, Ray-Chaudhuri and Hocquenghem (BCH) outer code, a Cyclic Redundancy Check (CRC) or other code. The inner code is realized as a Low Density Parity Check (LDPC) code. Both BCH and LDPC FEC codes are systematic codes where the information part I contained within the codeword. The resulting codeword is thus a concatenation of information or payload part, BCH or CRC parities and LDPC parities, as shown in FIG. 6A.

The use of LDPC code is mandatory and is used to provide the redundancy needed for the code detection. There are two different LDPC structures that are defined, these are called Type A and Type B. Type A has a code structure that shows better performance at low code rates while Type B code structure shows better performance at high code rates. In general $N_{inner}=64800$ bit codes are expected to be employed. However, for applications where latency is critical, or a simpler encoder/decoder structure is preferred, $N_{inner}=16200$ bit codes may also be used.

Figure 6B:
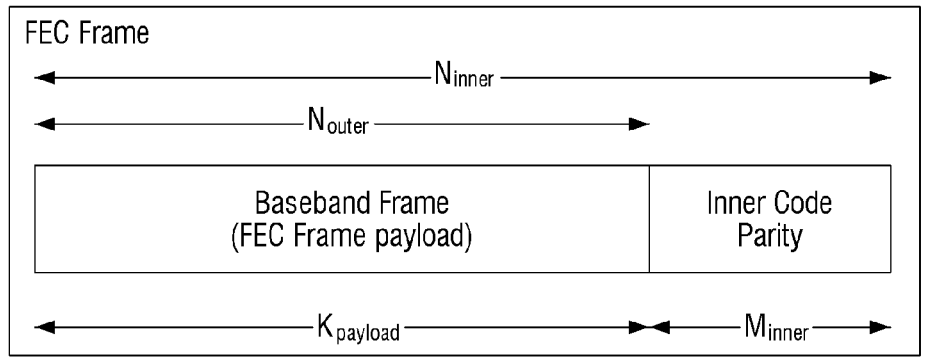

The outer code and CRC consist of adding $M_{outer}$ bits to the input baseband frame. The outer BCH code is used to lower the inherent LDPC error floor by correcting a predefined number of bit errors. When using BCH codes the length of $M_{outer}$ is 192 bits ($N_{inner}=64800$ bit codes) and 168 bits (for $N_{inner}=16200$ bit codes). When using CRC the length of $M_{outer}$ is 32 bits. When neither BCH nor CRC are used the length of $M_{outer}$ is zero. The outer code may be omitted if it is determined that the error correcting capability of the inner code is sufficient for the application. When there is no outer code the structure of the FEC frame is as shown in FIG. 6B.

Figure 7:
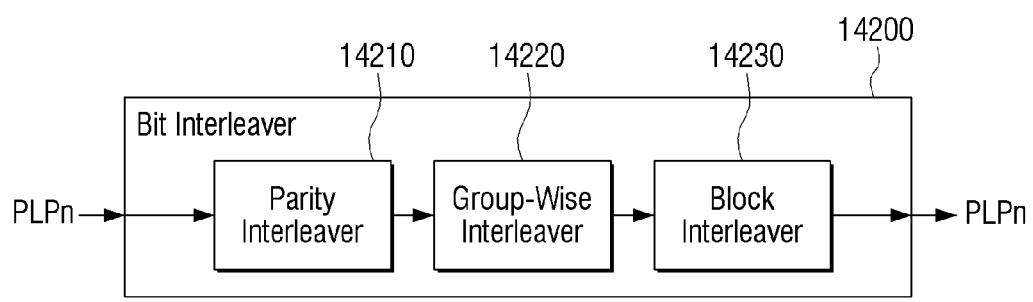

FIG. 7 is a block diagram provided to explain detailed configuration of the Bit Interleaver block illustrated in FIG. 6.

The LDPC codeword of the LDPC encoder, i.e., a FEC Frame, shall be bit interleaved by a Bit Interleaver block 14200. The Bit Interleaver block 14200 includes a parity interleaver 14210, a group-wise interleaver 14220 and a block interleaver 14230. Here, the parity interleaver is not used for Type A and is only used for Type B codes.

The parity interleaver 14210 converts the staircase structure of the parity-part of the LDPC parity-check matrix into a quasi-cyclic structure similar to the information-part of the matrix.

Meanwhile, the parity interleaved LDPC coded bits are split into $N_{group}=N_{inner}/360$ bit groups, and the group-wise interleaver 14220 rearranges the bit groups.

The block interleaver 14230 block interleaves the group-wise interleaved LDPC codeword.

Specifically, the block interleaver 14230 divides a plurality of columns into part 1 and part 2 based on the number of columns of the block interleaver 14230 and the number of bits of the bit groups. In addition, the block interleaver 14230 writes the bits into each column configuring part 1 column wise, and subsequently writes the bits into each column configuring part 2 column wise, and then reads out row wise the bits written in each column.

In this case, the bits constituting the bit groups in the part 1 may be written into the same column, and the bits constituting the bit groups in the part 2 may be written into at least two columns.

Back to FIG. 5, the Mapper block 14300, 14300-1, . . . , 14300-n maps FEC encoded and bit interleaved bits to complex valued quadrature amplitude modulation (QAM) constellation points. For the highest robustness level, quaternary phase shift keying (QPSK) is used. For higher order constellations (16-QAM up to 4096-QAM), non-uniform constellations are defined and the constellations are customized for each code rate.

Each FEC frame shall be mapped to a FEC block by first de-multiplexing the input bits into parallel data cell words and then mapping these cell words into constellation values.

Figure 8:
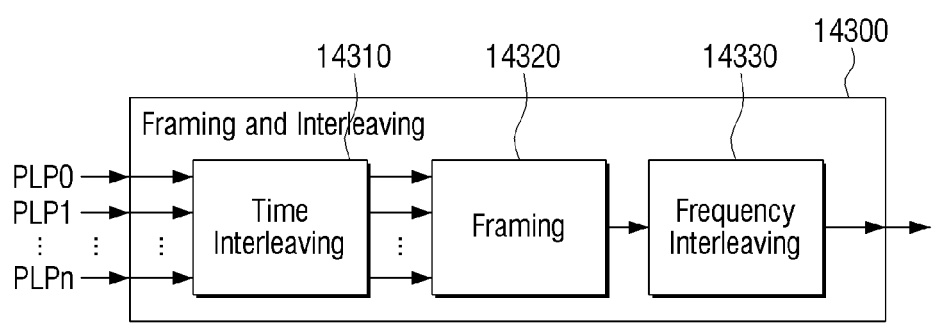

FIG. 8 is a block diagram provided to explain detailed configuration of a Framing/Interleaving block illustrated in FIG. 1A.

As illustrated in FIG. 8, the Framing/Interleaving block 14300 includes a time interleaving block 14310, a framing block 14320 and a frequency interleaving block 14330.

The input to the time interleaving block 14310 and the framing block 14320 may consist of M-PLPs however the output of the framing block 14320 is OFDM symbols, which are arranged in frames. The frequency interleaver included in the frequency interleaving block 14330 operates an OFDM symbols.

The time interleaver (TI) configuration included in the time interleaving block 14310 depends on the number of PLPs used. When there is only a single PLP or when LDM is used, a sheer convolutional interleaver is used, while for multiple PLP a hybrid interleaver consisting of a cell interleaver, a block interleaver and a convolutional interleaver is used. The input to the time interleaving block 14310 is a stream of cells output from the mapper block (FIG. 5, 14300, 14300-1, . . . , 14300-n), and the output of the time interleaving block 14310 is also a stream of time-interleaved cells.

Figure 9A:
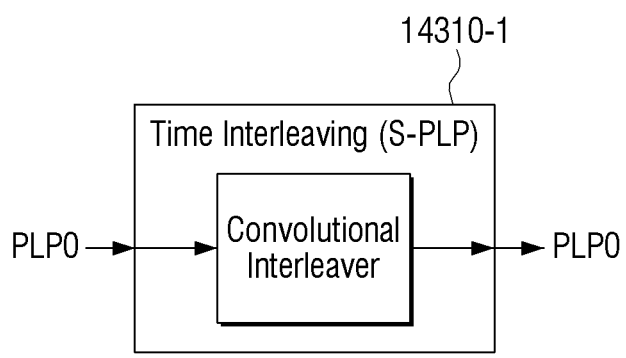

FIG. 9A illustrates the time interleaving block for a single PLP (S-PLP), and it consists of a convolutional interleaver only.

Figure 9B:
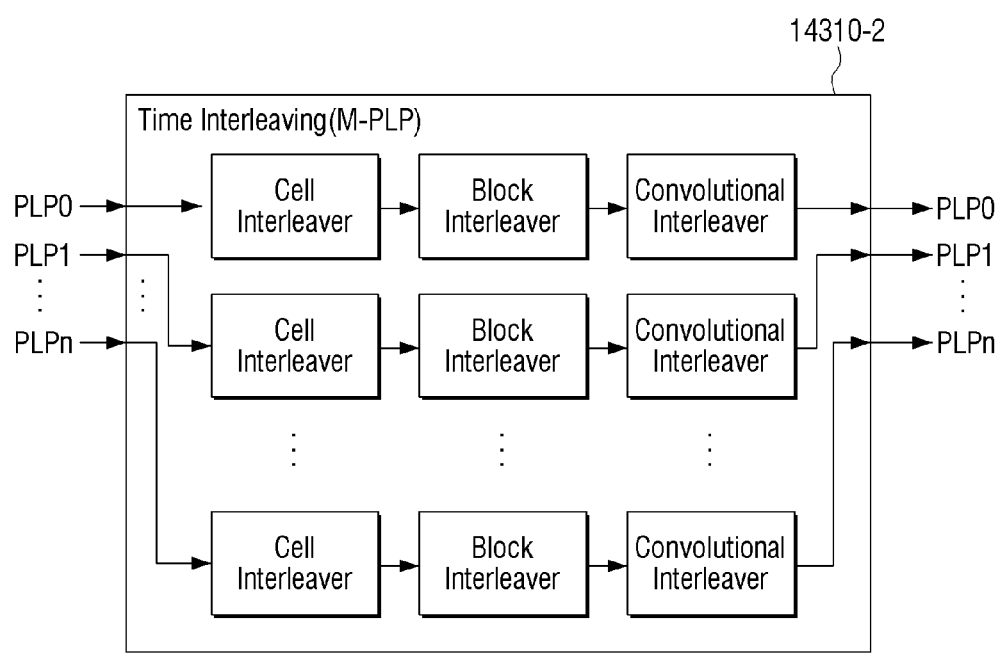

FIG. 9B illustrates the time interleaving block for a plurality of PLPs (M-PLP), and it can be divided in several sub-blocks as illustrated.

The framing block 14320 maps the interleaved frames onto at least one transmitter frame. The framing block 14320, specifically, receives inputs (e.g. data cell) from at least one physical layer pipes and outputs symbols.

In addition, the framing block 14320 creates at least one special symbol known as preamble symbols. These symbols undergo the same processing in the waveform block mentioned later.

Figure 10:
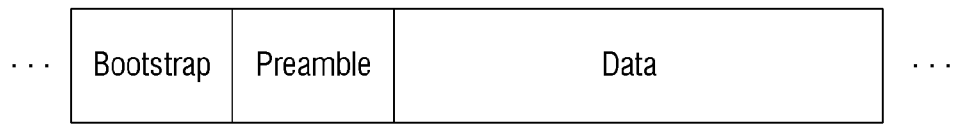

FIG. 10 is a view illustrating an example of a transmission frame according to an exemplary embodiment.

As illustrated in FIG. 10, the transmission frame consists of three parts, the bootstrap, preamble and data payload. Each of the three parts consists of at least one symbol.

Meanwhile, the purpose of the frequency interleaving block 14330 is to ensure that sustained interference in one part of the spectrum will not degrade the performance of a particular PLP disproportionately compared to other PLPs. The frequency interleaver 14330, operating on the all the data cells of one OFDM symbol, maps the data cells from the framing block 14320 onto the N data carriers.

Figure 11:
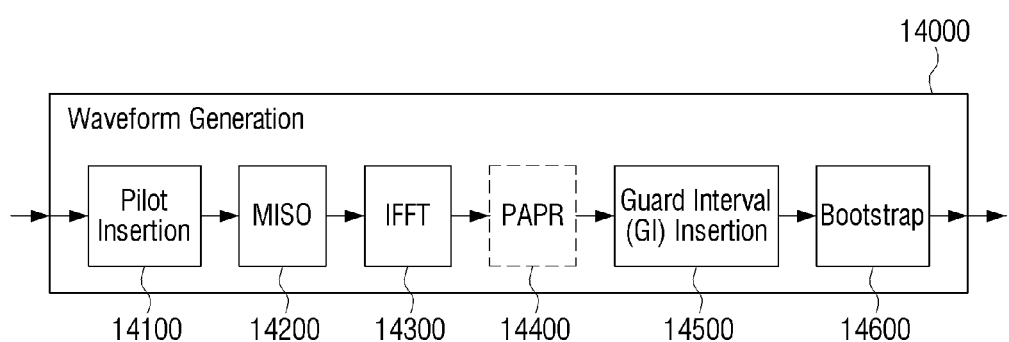

FIG. 11 is a block diagram provided to explain detailed configuration of a Waveform Generation block illustrated in FIG. 1A.

As illustrated in FIG. 11, the Waveform Generation block 14000 includes a pilot inserting block 14100, a MISO block 14200, an IFFT block 14300, a PAPR block 14400, a GI inserting block 14500 and a bootstrap block 14600.

The pilot inserting block 14100 inserts a pilot to various cells within the OFDM frame.

Various cells within the OFDM frame are modulated with reference information whose transmitted value is known to the receiver.

Cells containing the reference information are transmitted at a boosted power level. The cells are called scattered, continual, edge, preamble or frame-closing pilot cells. The value of the pilot information is derived from a reference sequence, which is a series of values, one for each transmitted carrier on any given symbol.

The pilots can be used for frame synchronization, frequency synchronization, time synchronization, channel estimation, transmission mode identification and can also be used to follow the phase noise.

The pilots are modulated according to reference information, and the reference sequence is applied to all the pilots (e.g. scattered, continual edge, preamble and frame closing pilots) in every symbol including preamble and the frame-closing symbol of the frame.

The reference information, taken from the reference sequence, is transmitted in scattered pilot cells in every symbol except the preamble and the frame-closing symbol of the frame.

In addition to the scattered pilots described above, a number of continual pilots are inserted in every symbol of the frame except for Preamble and the frame-closing symbol. The number and location of continual pilots depends on both the FFT size and scattered pilot pattern in use.

The MISO block 14200 applies a MISO processing.

The Transmit Diversity Code Filter Set is a MISO pre-distortion technique that artificially decorrelates signals from multiple transmitters in a Single Frequency Network in order to minimize potential destructive interference. Linear frequency domain filters are used so that the compensation in the receiver can be implemented as part of the equalizer process. The filter design is based on creating all-pass filters with minimized cross-correlation over all filter pairs under the constraints of the number of transmitters M∈{2, 3, 4} and the time domain span of the filters N∈{64,256}. The longer time domain span filters will increase the decorrelation level, but the effective guard interval length will be decreased by the filter time domain span and this should be taken into consideration when choosing a filter set for a particular network topology.

The IFFT block 14300 specifies the OFDM structure to use for each transmission mode. The transmitted signal is organized in frames. Each frame has a duration of $T_F$, and consists of $L_F$ OFDM symbols. N frames constitute one super-frame. Each symbol is constituted by a set of $K_{total}$ carriers transmitted with a duration $T_S$. Each symbol is composed of a useful part with duration $T_U$ and a guard interval with a duration Δ. The guard interval consists of a cyclic continuation of the useful part, $T_U$, and is inserted before it.

The PAPR block 14400 applies the Peak to Average Power Reduction technique.

The GI inserting block 14500 inserts the guard interval into each frame.

The bootstrap block 14600 prefixes the bootstrap signal to the front of each frame.

Figure 12:
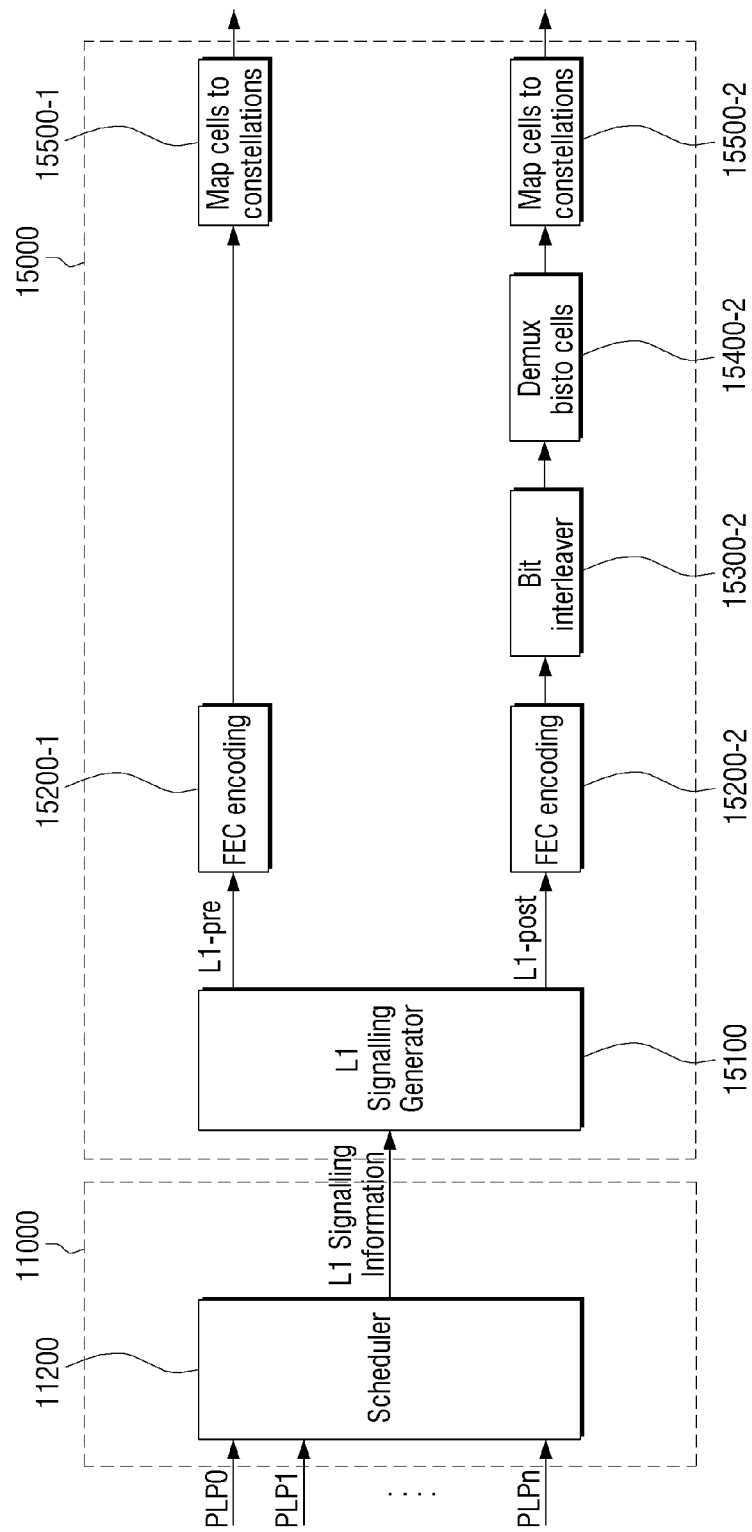

FIG. 12 is a block diagram provided to explain a configuration of signaling information according to an exemplary embodiment.

The input processing block 11000 includes a scheduler 11200. The BICM block 15000 includes an L1 signaling generator 15100, an FEC encoder 15200-1 and 15200-2, a bit interleaver 15300-2, a demux 15400-2, constellation mappers 15500-1 and 15500-2. The L1 signaling generator 15100 may be included in the input processing block 11000, according to an exemplary embodiment.

An n number of service data are mapped to a PLP0 to a PLPn respectively. The scheduler 11200 determines a position, modulation and coding rate for each PLP in order to map a plurality of PLPs to a physical layer of T2. In other words, the scheduler 11200 generates L1 signaling information. The scheduler 11200 may output dynamic field information among L1 post signaling information of a current frame, using the Framing/Interleavingblock 13000 (FIG. 1) which may be referred to as a frame builder. Further, the scheduler 11200 may transmit the L1 signaling information to the BICM block 15000. The L1 signaling information includes L1 pre signaling information and L1 post signaling information.

The L1 signaling generator 15100 may differentiate the L1 pre signaling information from the L1 post signaling information to output them. The FEC encoders 15200-1 and 15200-2 perform respective encoding operations which include shortening and puncturing for the L1 pre signaling information and the L1 post signaling information. The bit interleaver 15300-2 performs interleaving by bit for the encoded L1 post signaling information. The demux 15400-2 controls robustness of bits by modifying an order of bits constituting cells and outputs the cells which include bits. Two constellation mappers 15500-1 and 15500-2 map the L1 pre signaling information and the L1 post signaling information to constellations, respectively. The L1 pre signaling information and the L1 post signaling information processed through the above described processes are output to be included in each frame by the Framing/Interleaving block 13000 (FIG. 1).

Figure 13:
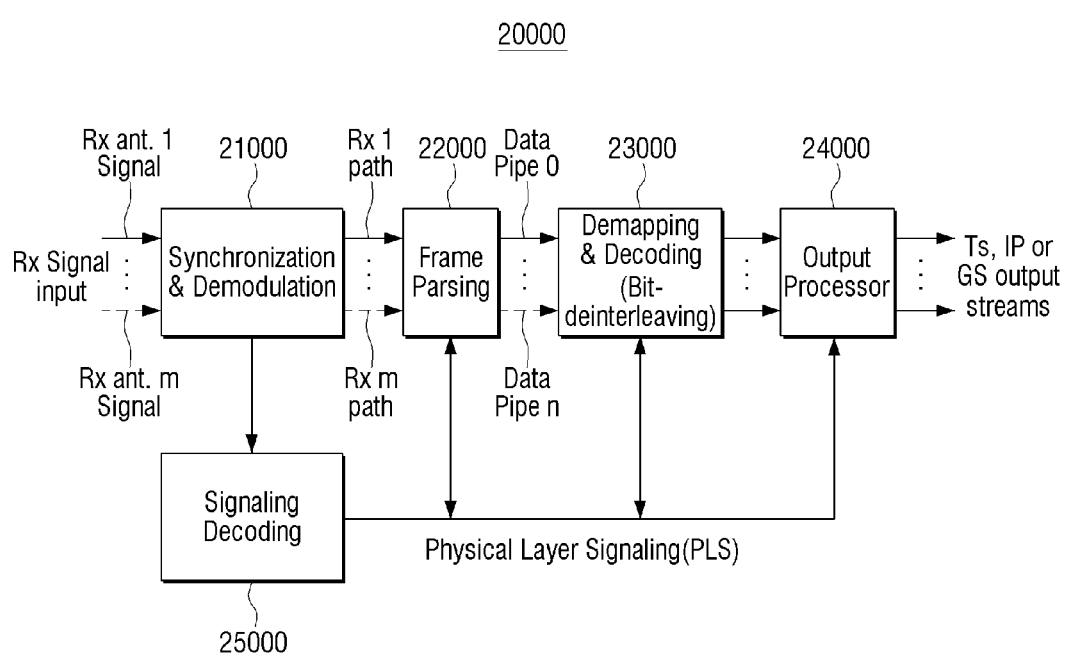
FIGS. 13 to 18 are views to illustrate a receiving apparatus according to exemplary embodiments.

FIG. 13 illustrates a structure of an receiving apparatus according to an embodiment of the present invention.

The apparatus 20000 for receiving broadcast signals according to an embodiment of the present invention can correspond to the apparatus 10000 for transmitting broadcast signals, described with reference to FIG. 1. The apparatus 20000 for receiving broadcast signals according to an embodiment of the present invention can include a synchronization & demodulation module 21000, a frame parsing module 22000, a demapping & decoding module 23000, an output processor 24000 and a signaling decoding module 25000. A description will be given of operation of each module of the apparatus 20000 for receiving broadcast signals.

The synchronization & demodulation module 21000 can receive input signals through m Rx antennas, perform signal detection and synchronization with respect to a system corresponding to the apparatus 20000 for receiving broadcast signals and carry out demodulation corresponding to a reverse procedure of the procedure performed by the apparatus 10000 for transmitting broadcast signals.

The frame parsing module 22000 can parse input signal frames and extract data through which a service selected by a user is transmitted. If the apparatus 10000 for transmitting broadcast signals performs interleaving, the frame parsing module 22000 can carry out deinterleaving corresponding to a reverse procedure of interleaving. In this case, the positions of a signal and data that need to be extracted can be obtained by decoding data output from the signaling decoding module 25200 to restore scheduling information generated by the apparatus 10000 for transmitting broadcast signals.

The demapping & decoding module 23000 can convert the input signals into bit domain data and then deinterleave the same as necessary. The demapping & decoding module 23000 can perform demapping for mapping applied for transmission efficiency and correct an error generated on a transmission channel through decoding. In this case, the demapping & decoding module 23000 can obtain transmission parameters necessary for demapping and decoding by decoding the data output from the signaling decoding module 25000.

The output processor 24000 can perform reverse procedures of various compression/signal processing procedures which are applied by the apparatus 10000 for transmitting broadcast signals to improve transmission efficiency. In this case, the output processor 24000 can acquire necessary control information from data output from the signaling decoding module 25000. The output of the output processor 24000 corresponds to a signal input to the apparatus 10000 for transmitting broadcast signals and may be MPEG-TSs, IP streams (v4 or v6) and generic streams.

The signaling decoding module 25000 can obtain PLS information from the signal demodulated by the synchronization & demodulation module 21000. As described above, the frame parsing module 22000, demapping & decoding module 23000 and output processor 24000 can execute functions thereof using the data output from the signaling decoding module 25000.

Figure 14:
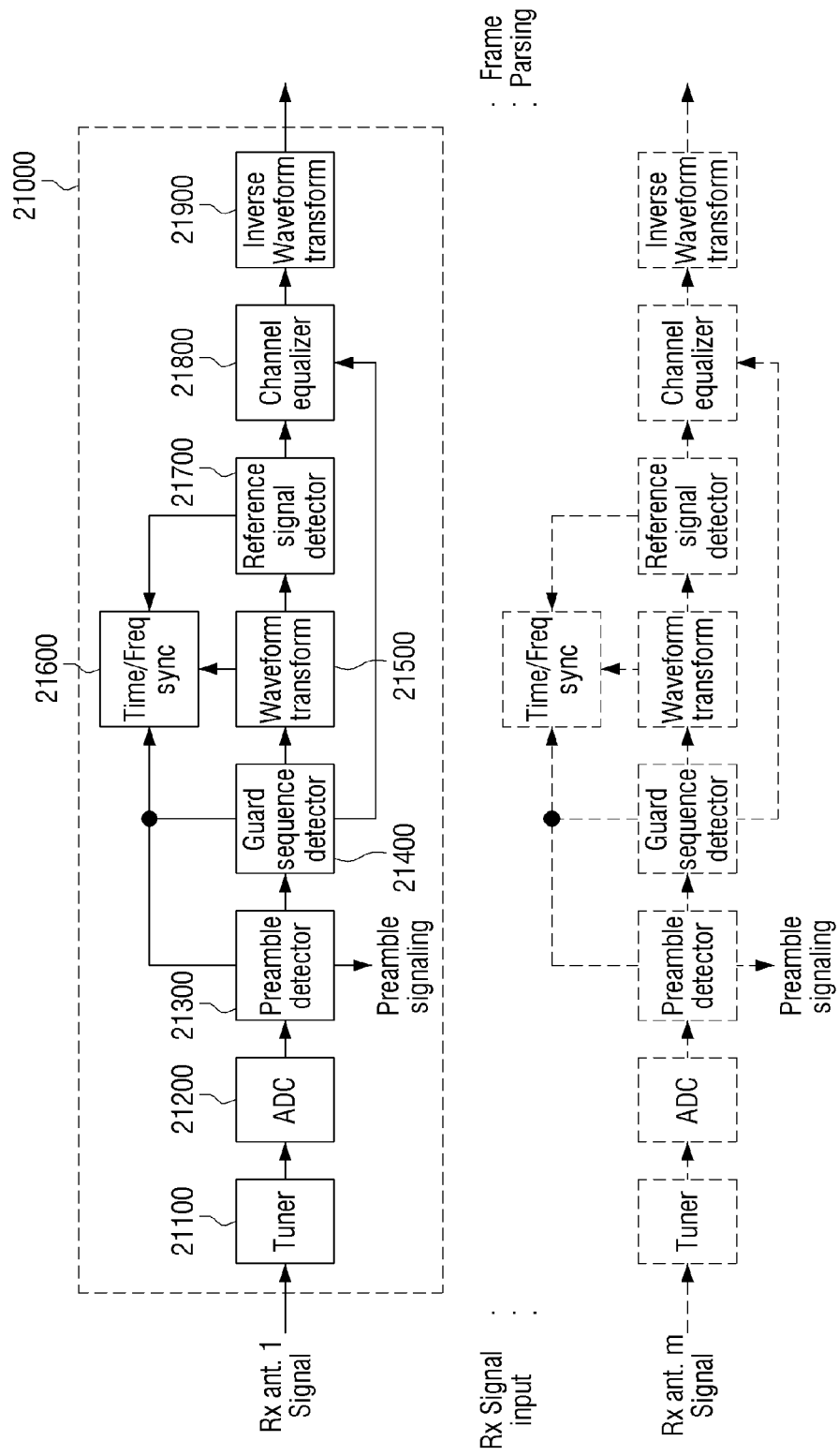

FIG. 14 illustrates a synchronization & demodulation module according to an embodiment of the present invention.

As shown in FIG. 14, the synchronization & demodulation module 21000 according to an embodiment of the present invention corresponds to a synchronization & demodulation module of an apparatus 20000 for receiving broadcast signals using m Rx antennas and can include m processing blocks for demodulating signals respectively input through m paths. The m processing blocks can perform the same processing procedure. A description will be given of operation of the first processing block 21000 from among the m processing blocks.

The first processing block 21000 can include a tuner 21100, an ADC block 21200, a preamble detector 21300, a guard sequence detector 21400, a waveform transform block 21500, a time/frequency synchronization block 21600, a reference signal detector 21700, a channel equalizer 21800 and an inverse waveform transform block 21900.

The tuner 21100 can select a desired frequency band, compensate for the magnitude of a received signal and output the compensated signal to the ADC block 21200.

The ADC block 21200 can convert the signal output from the tuner 21100 into a digital signal.

The preamble detector 21300 can detect a preamble (or preamble signal or preamble symbol) in order to check whether or not the digital signal is a signal of the system corresponding to the apparatus 20000 for receiving broadcast signals. In this case, the preamble detector 21300 can decode basic transmission parameters received through the preamble.

The guard sequence detector 21400 can detect a guard sequence in the digital signal. The time/frequency synchronization block 21600 can perform time/frequency synchronization using the detected guard sequence and the channel equalizer 21800 can estimate a channel through a received/restored sequence using the detected guard sequence.

The waveform transform block 21500 can perform a reverse operation of inverse waveform transform when the apparatus 10000 for transmitting broadcast signals has performed inverse waveform transform. When the broadcast transmission/reception system according to one embodiment of the present invention is a multi-carrier system, the waveform transform block 21500 can perform FFT. Furthermore, when the broadcast transmission/reception system according to an embodiment of the present invention is a single carrier system, the waveform transform block 21500 may not be used if a received time domain signal is processed in the frequency domain or processed in the time domain.

The time/frequency synchronization block 21600 can receive output data of the preamble detector 21300, guard sequence detector 21400 and reference signal detector 21700 and perform time synchronization and carrier frequency synchronization including guard sequence detection and block window positioning on a detected signal. Here, the time/frequency synchronization block 21600 can feed back the output signal of the waveform transform block 21500 for frequency synchronization.

The reference signal detector 21700 can detect a received reference signal. Accordingly, the apparatus 20000 for receiving broadcast signals according to an embodiment of the present invention can perform synchronization or channel estimation.

The channel equalizer 21800 can estimate a transmission channel from each Tx antenna to each Rx antenna from the guard sequence or reference signal and perform channel equalization for received data using the estimated channel.

The inverse waveform transform block 21900 may restore the original received data domain when the waveform transform block 21500 performs waveform transform for efficient synchronization and channel estimation/equalization. If the broadcast transmission/reception system according to an embodiment of the present invention is a single carrier system, the waveform transform block 21500 can perform FFT in order to carry out synchronization/channel estimation/equalization in the frequency domain and the inverse waveform transform block 21900 can perform IFFT on the channel-equalized signal to restore transmitted data symbols. If the broadcast transmission/reception system according to an embodiment of the present invention is a multi-carrier system, the inverse waveform transform block 21900 may not be used.

The above-described blocks may be omitted or replaced by blocks having similar or identical functions according to design.

Figure 15:
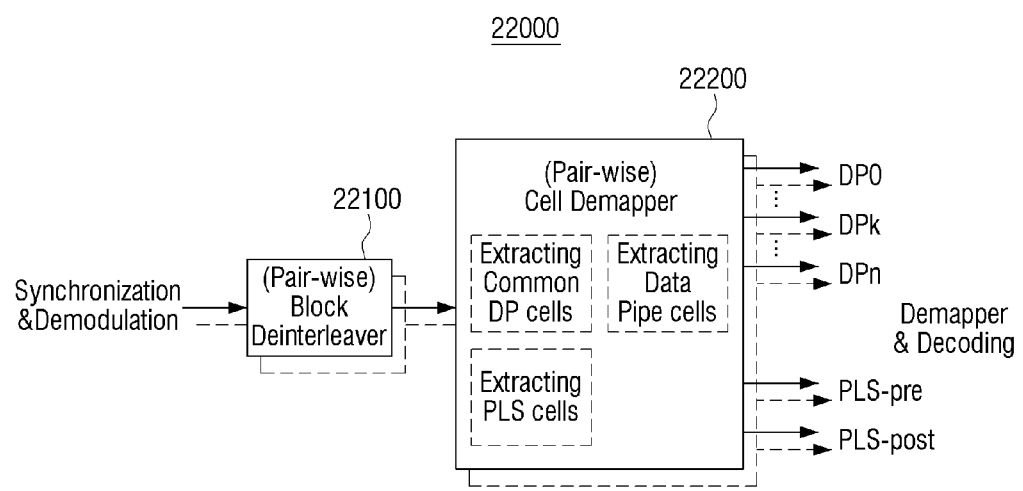

FIG. 15 illustrates a frame parsing module according to an embodiment of the present invention.

As shown in FIG. 15, the frame parsing module 22000 according to an embodiment of the present invention can include at least one block interleaver 22100 and at least one cell demapper 22200.

The block interleaver 22100 can deinterleave data input through data paths of the m Rx antennas and processed by the synchronization & demodulation module 21000 on a signal block basis. In this case, if the apparatus 10000 for transmitting broadcast signals performs pair-wise interleaving, the block interleaver 22100 can process two consecutive pieces of data as a pair for each input path. Accordingly, the block interleaver 22100 can output two consecutive pieces of data even when deinterleaving has been performed. Furthermore, the block interleaver 22100 can perform a reverse operation of the interleaving operation performed by the apparatus 10000 for transmitting broadcast signals to output data in the original order.

The cell demapper 22200 can extract cells corresponding to common data, cells corresponding to data pipes and cells corresponding to PLS data from received signal frames. The cell demapper 22200 can merge data distributed and transmitted and output the same as a stream as necessary. When two consecutive pieces of cell input data are processed as a pair and mapped in the apparatus 10000 for transmitting broadcast signals, the cell demapper 22200 can perform pair-wise cell demapping for processing two consecutive input cells as one unit as a reverse procedure of the mapping operation of the apparatus 10000 for transmitting broadcast signals.

In addition, the cell demapper 22200 can extract PLS signaling data received through the current frame as PLS-pre & PLS-post data and output the PLS-pre & PLS-post data.

The above-described blocks may be omitted or replaced by blocks having similar or identical functions according to design.

Figure 16:
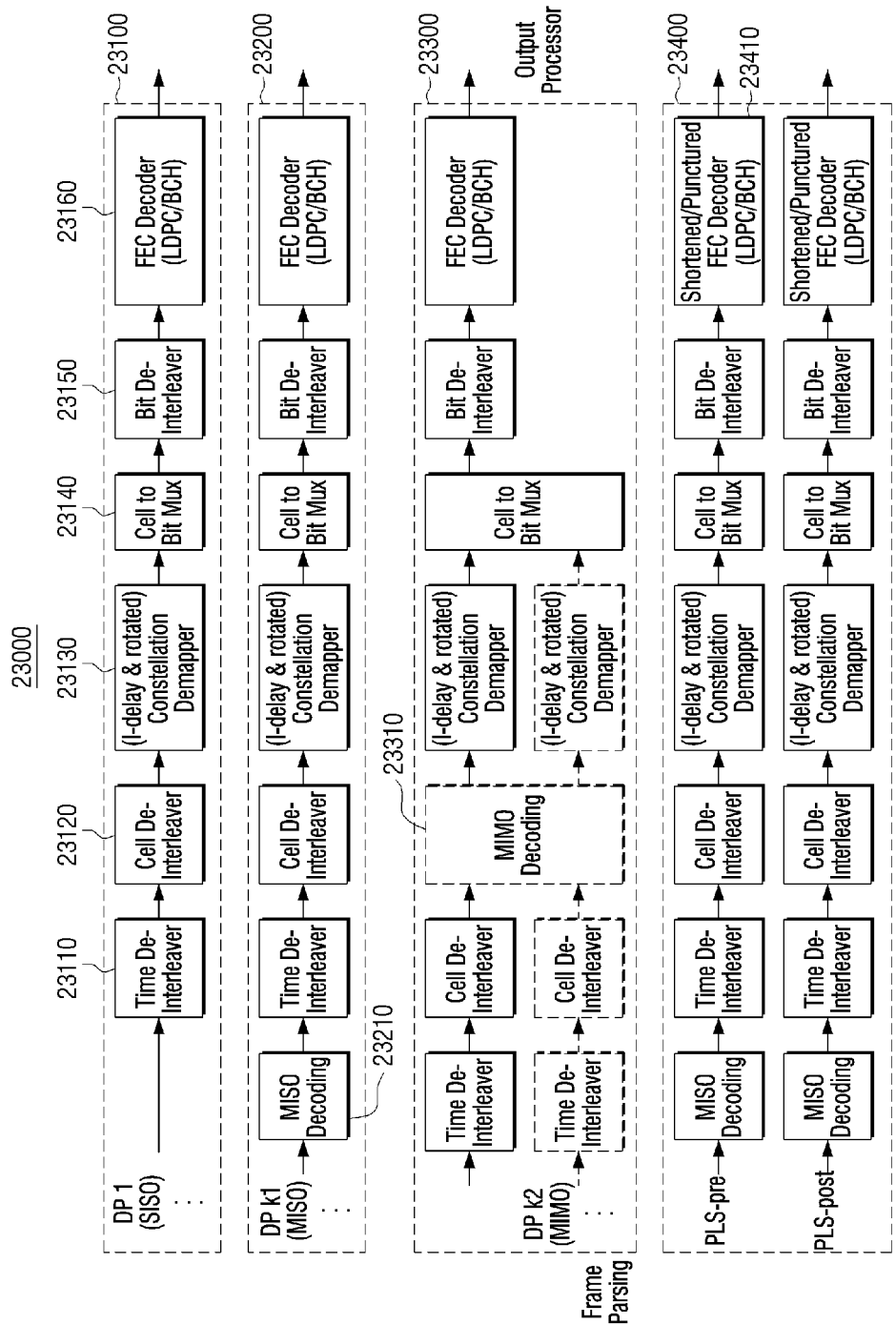

FIG. 16 illustrates a demapping & decoding module according to an embodiment of the present invention.

The demapping & decoding module 23000 shown in FIG. 16 can perform a reverse operation of the operation of the bit interleaved and coded & modulation module illustrated in FIG. 1.

The bit interleaved and coded & modulation module of the apparatus 10000 for transmitting broadcast signals according to an embodiment of the present invention can process input data pipes by independently applying SISO, MISO and MIMO thereto for respective paths, as described above. Accordingly, the demapping & decoding module 23000 illustrated in FIG. 16 can include blocks for processing data output from the frame parsing module according to SISO, MISO and MIMO in response to the apparatus 10000 for transmitting broadcast signals.

As shown in FIG. 16, the demapping & decoding module 23000 according to an embodiment of the present invention can include a first block 23100 for SISO, a second block 23200 for MISO, a third block 23300 for MIMO and a fourth block 23400 for processing the PLS-pre/PLS-post information. The demapping & decoding module 23000 shown in FIG. 16 is exemplary and may include only the first block 23100 and the fourth block 23400, only the second block 23200 and the fourth block 23400 or only the third block 23300 and the fourth block 23400 according to design. That is, the demapping & decoding module 23000 can include blocks for processing data pipes equally or differently according to design.

A description will be given of each block of the demapping & decoding module 23000.

The first block 23100 processes an input data pipe according to SISO and can include a time deinterleaver block 23110, a cell deinterleaver block 23120, a constellation demapper block 23130, a cell-to-bit mux block 23140, a bit deinterleaver block 23150 and an FEC decoder block 23160.

The time deinterleaver block 23110 can perform a reverse process of the process performed by the time interleaving block 14310 illustrated in FIG. 8. That is, the time deinterleaver block 23110 can deinterleave input symbols interleaved in the time domain into original positions thereof.

The cell deinterleaver block 23120 can perform a reverse process of the process performed by the cell interleaver block illustrated in FIG. 9a. That is, the cell deinterleaver block 23120 can deinterleave positions of cells spread in one FEC block into original positions thereof. The cell deinterleaver block 23120 may be omitted.

The constellation demapper block 23130 can perform a reverse process of the process performed by the mapper 12300 illustrated in FIG. 5. That is, the constellation demapper block 23130 can demap a symbol domain input signal to bit domain data. In addition, the constellation demapper block 23130 may perform hard decision and output decided bit data. Furthermore, the constellation demapper block 23130 may output a log-likelihood ratio (LLR) of each bit, which corresponds to a soft decision value or probability value. If the apparatus 10000 for transmitting broadcast signals applies a rotated constellation in order to obtain additional diversity gain, the constellation demapper block 23130 can perform 2-dimensional LLR demapping corresponding to the rotated constellation. Here, the constellation demapper block 23130 can calculate the LLR such that a delay applied by the apparatus 10000 for transmitting broadcast signals to the I or Q component can be compensated.

The cell-to-bit mux block 23140 can perform a reverse process of the process performed by the mapper 12300 illustrated in FIG. 5. That is, the cell-to-bit mux block 23140 can restore bit data mapped to the original bit streams.

The bit deinterleaver block 23150 can perform a reverse process of the process performed by the bit interleaver 12200 illustrated in FIG. 5. That is, the bit deinterleaver block 23150 can deinterleave the bit streams output from the cell-to-bit mux block 23140 in the original order.

The FEC decoder block 23460 can perform a reverse process of the process performed by the FEC encoder 12100 illustrated in FIG. 5. That is, the FEC decoder block 23460 can correct an error generated on a transmission channel by performing LDPC decoding and BCH decoding.

The second block 23200 processes an input data pipe according to MISO and can include the time deinterleaver block, cell deinterleaver block, constellation demapper block, cell-to-bit mux block, bit deinterleaver block and FEC decoder block in the same manner as the first block 23100, as shown in FIG. 16. However, the second block 23200 is distinguished from the first block 23100 in that the second block 23200 further includes a MISO decoding block 23210. The second block 23200 performs the same procedure including time deinterleaving operation to outputting operation as the first block 23100 and thus description of the corresponding blocks is omitted.

The MISO decoding block 11110 can perform a reverse operation of the operation of the MISO processing in the apparatus 10000 for transmitting broadcast signals. If the broadcast transmission/reception system according to an embodiment of the present invention uses STBC, the MISO decoding block 11110 can perform Alamouti decoding.

The third block 23300 processes an input data pipe according to MIMO and can include the time deinterleaver block, cell deinterleaver block, constellation demapper block, cell-to-bit mux block, bit deinterleaver block and FEC decoder block in the same manner as the second block 23200, as shown in FIG. 16. However, the third block 23300 is distinguished from the second block 23200 in that the third block 23300 further includes a MIMO decoding block 23310. The basic roles of the time deinterleaver block, cell deinterleaver block, constellation demapper block, cell-to-bit mux block and bit deinterleaver block included in the third block 23300 are identical to those of the corresponding blocks included in the first and second blocks 23100 and 23200 although functions thereof may be different from the first and second blocks 23100 and 23200.

The MIMO decoding block 23310 can receive output data of the cell deinterleaver for input signals of the m Rx antennas and perform MIMO decoding as a reverse operation of the operation of the MIMO processing in the apparatus 10000 for transmitting broadcast signals. The MIMO decoding block 23310 can perform maximum likelihood decoding to obtain optimal decoding performance or carry out sphere decoding with reduced complexity. Otherwise, the MIMO decoding block 23310 can achieve improved decoding performance by performing MMSE detection or carrying out iterative decoding with MMSE detection.

The fourth block 23400 processes the PLS-pre/PLS-post information and can perform SISO or MISO decoding.

The basic roles of the time deinterleaver block, cell deinterleaver block, constellation demapper block, cell-to-bit mux block and bit deinterleaver block included in the fourth block 23400 are identical to those of the corresponding blocks of the first, second and third blocks 23100, 23200 and 23300 although functions thereof may be different from the first, second and third blocks 23100, 23200 and 23300.

The shortened/punctured FEC decoder 23410 can perform de-shortening and de-puncturing on data shortened/punctured according to PLS data length and then carry out FEC decoding thereon. In this case, the FEC decoder used for data pipes can also be used for PLS. Accordingly, additional FEC decoder hardware for the PLS only is not needed and thus system design is simplified and efficient coding is achieved.

The above-described blocks may be omitted or replaced by blocks having similar or identical functions according to design.

The demapping & decoding module according to an embodiment of the present invention can output data pipes and PLS information processed for the respective paths to the output processor, as illustrated in FIG. 16.

Figure 17:
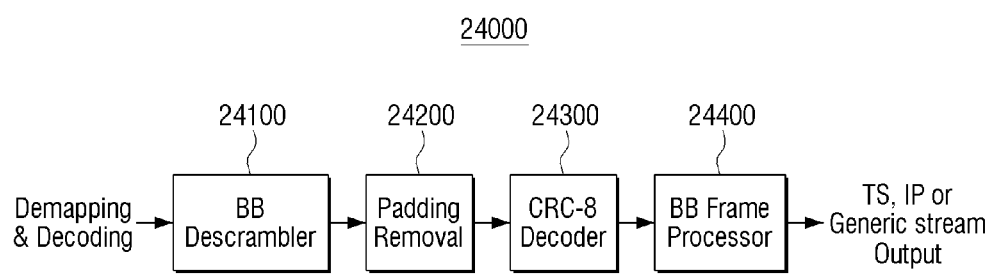
Figure 18:
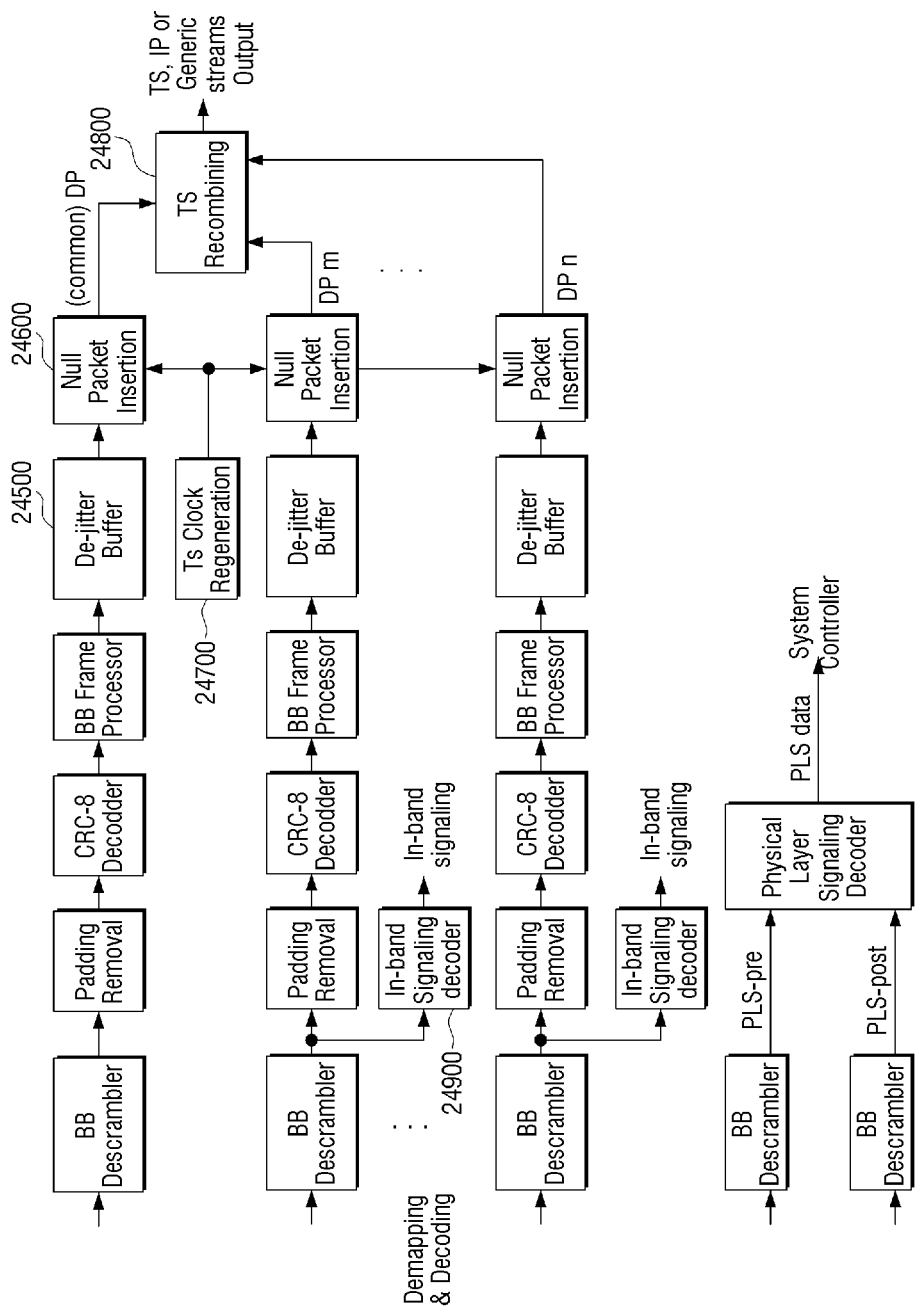

FIGS. 17 and 18 illustrate output processors according to embodiments of the present invention.

FIG. 17 illustrates an output processor 24000 according to an embodiment of the present invention. The output processor 24000 illustrated in FIG. 17 receives a single data pipe output from the demapping & decoding module and outputs a single output stream.

The output processor 24000 shown in FIG. 17 can include a BB scrambler block 24100, a padding removal block 24200, a CRC-8 decoder block 24300 and a BB frame processor block 24400.

The BB scrambler block 24100 can descramble an input bit stream by generating the same PRBS as that used in the apparatus for transmitting broadcast signals for the input bit stream and carrying out an XOR operation on the PRBS and the bit stream.

The padding removal block 24200 can remove padding bits inserted by the apparatus for transmitting broadcast signals as necessary.

The CRC-8 decoder block 24300 can check a block error by performing CRC decoding on the bit stream received from the padding removal block 24200.

The BB frame processor block 24400 can decode information transmitted through a BB frame header and restore MPEG-TSs, IP streams (v4 or v6) or generic streams using the decoded information.

The above-described blocks may be omitted or replaced by blocks having similar or identical functions according to design.

FIG. 18 illustrates an output processor according to another embodiment of the present invention. The output processor 24000 shown in FIG. 18 receives multiple data pipes output from the demapping & decoding module. Decoding multiple data pipes can include a process of merging common data commonly applicable to a plurality of data pipes and data pipes related thereto and decoding the same or a process of simultaneously decoding a plurality of services or service components (including a scalable video service) by the apparatus for receiving broadcast signals.

The output processor 24000 shown in FIG. 18 can include a BB descrambler block, a padding removal block, a CRC-8 decoder block and a BB frame processor block as the output processor illustrated in FIG. 17. The basic roles of these blocks correspond to those of the blocks described with reference to FIG. 17 although operations thereof may differ from those of the blocks illustrated in FIG. 17.

A de-jitter buffer block 24500 included in the output processor shown in FIG. 18 can compensate for a delay, inserted by the apparatus for transmitting broadcast signals for synchronization of multiple data pipes, according to a restored TTO (time to output) parameter.

A null packet insertion block 24600 can restore a null packet removed from a stream with reference to a restored DNP (deleted null packet) and output common data.

A TS clock regeneration block 24700 can restore time synchronization of output packets based on ISCR (input stream time reference) information.

A TS recombining block 24800 can recombine the common data and data pipes related thereto, output from the null packet insertion block 24600, to restore the original MPEG-TSs, IP streams (v4 or v6) or generic streams. The TTO, DNT and ISCR information can be obtained through the BB frame header.

An in-band signaling decoding block 24900 can decode and output in-band physical layer signaling information transmitted through a padding bit field in each FEC frame of a data pipe.

The output processor shown in FIG. 18 can BB-descramble the PLS-pre information and PLS-post information respectively input through a PLS-pre path and a PLS-post path and decode the descrambled data to restore the original PLS data. The restored PLS data is delivered to a system controller included in the apparatus for receiving broadcast signals. The system controller can provide parameters necessary for the synchronization & demodulation module, frame parsing module, demapping & decoding module and output processor module of the apparatus for receiving broadcast signals.

The above-described blocks may be omitted or replaced by blocks having similar r identical functions according to design.

Figure 19:
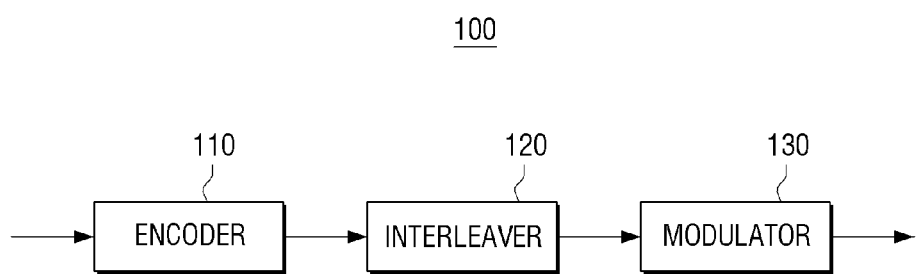
FIG. 19 is a block diagram to illustrate a configuration of a transmitting apparatus, according to an exemplary embodiment.

FIG. 19 is a block diagram to illustrate a configuration of a transmitting apparatus according to an exemplary embodiment. Referring to FIG. 19, the transmitting apparatus 100 includes an encoder 110, an interleaver 120, and a modulator 130 (or a constellation mapper).

The encoder 110 generates a low density parity check (LDPC) codeword by performing LDPC encoding based on a parity check matrix. The encoder 110 may include an LDPC encoder (not shown) to perform the LDPC encoding.

The encoder 110 LDPC-encodes information word (or information) bits to generate the LDPC codeword which is formed of information word bits and parity bits (that is, LDPC parity bits). Here, bits input to the encoder 110 may be used as the information word bits. Also, since an LDPC code is a systematic code, the information word bits may be included in the LDPC codeword as they are.

The LDPC codeword is formed of the information word bits and the parity bits. For example, the LDPC codeword is formed of $N_{ldpc}$ number of bits, and includes $K_{ldpc}$ number of information word bits and $N_{parity}=N_{ldpc}-K_{ldpc}$ number of parity bits.

In this case, the encoder 110 may generate the LDPC codeword by performing the LDPC encoding based on the parity check matrix. That is, since the LDPC encoding is a process for generating an LDPC codeword to satisfy $H \cdot C^T = 0$, the encoder 110 may use the parity check matrix when performing the LDPC encoding. Herein, H is a parity check matrix and C is an LDPC codeword.

For the LDPC encoding, the transmitting apparatus 100 may include a memory and may pre-store parity check matrices of various formats.

For example, the transmitting apparatus 100 may pre-store parity check matrices which are defined in Digital Video Broadcasting-Cable version 2 (DVB-C2), Digital Video Broadcasting-Satellite-Second Generation (DVB-S2), Digital Video Broadcasting-Second Generation Terrestrial (DVB-T2), etc., or may pre-store parity check matrices which are defined in the North America digital broadcasting standard system Advanced Television System Committee (ATSC) 3.0 standards, which are currently being established. However, this is merely an example and the transmitting apparatus 100 may pre-store parity check matrices of other formats in addition to these parity check matrices.

Hereinafter, a parity check matrix according to various exemplary embodiments will be explained with reference to the drawings. In the parity check matrix, elements other than elements having 1 have 0.

Figure 20:
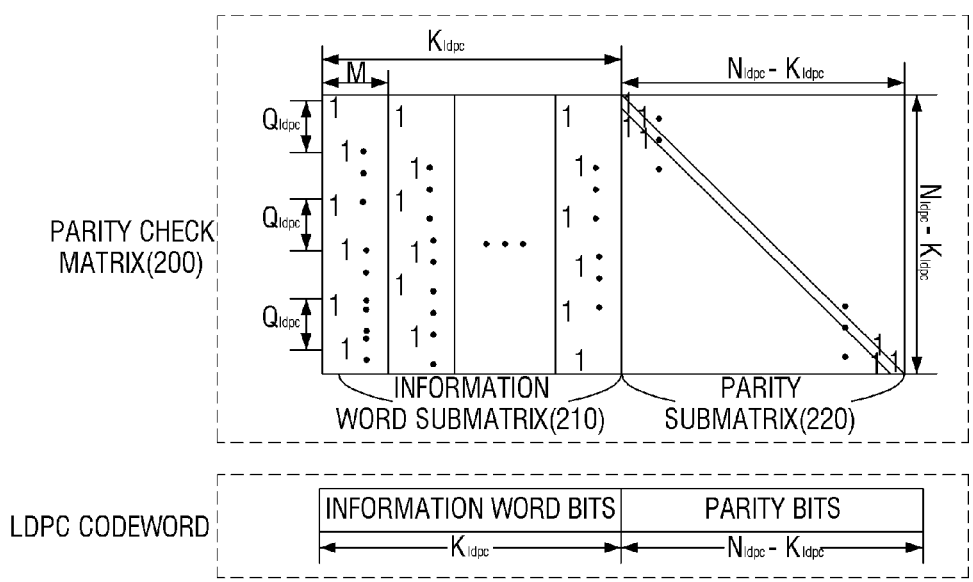
FIGS. 20 to 22 are views to illustrate a configuration of a parity check matrix, according to exemplary embodiments.

For example, the parity check matrix according to an exemplary embodiment may have a configuration of FIG. 20.

Referring to FIG. 20, a parity check matrix 200 is formed of an information word submatrix (or an information submatrix) 210 corresponding to information word bits, and a parity submatrix 220 corresponding to parity bits.

The information word submatrix 210 includes $K_{ldpc}$ number of columns and the parity submatrix 220 includes $N_{parity}=N_{ldpc}-K_{ldpc}$ number of columns. The number of rows of the parity check matrix 200 is identical to the number of columns of the parity submatrix 220, $N_{parity}=N_{ldpc}-K_{ldpc}$.

In addition, in the parity check matrix 200, $N_{ldpc}$ is a length of an LDPC codeword, $K_{ldpc}$ is a length of information word bits, and $N_{parity}=N_{ldpc}-K_{ldpc}$ is a length of parity bits. The length of the LDPC codeword, the information word bits, and the parity bits mean the number of bits included in each of the LDPC codeword, the information word bits, and the parity bits.

Hereinafter, the configuration of the information word submatrix 210 and the parity submatrix 220 will be explained.

The information word submatrix 210 includes $K_{ldpc}$ number of columns (that is, $0^{th}$ column to $(K_{ldpc}-1)^{th}$ column), and follows the following rules:

First, M number of columns from among $K_{ldpc}$ number of columns of the information word submatrix 210 belong to the same group, and $K_{ldpc}$ number of columns is divided into $K_{ldpc}/M$ number of column groups. In each column group, a column is cyclic-shifted from an immediately previous column by $Q_{ldpc}$. That is, $Q_{ldpc}$ may be a cyclic shift parameter value regarding columns in a column group of the information word submatrix 210 of the parity check matrix 200.

Herein, M is an interval at which a pattern of a column group, which includes a plurality of columns, is repeated in the information word submatrix 210 (e.g., M=360), and $Q_{ldpc}$ is a size by which one column is cyclic-shifted from an immediately previous column in a same column group in the information word submatrix 210. Also, M is a common divisor of $N_{ldpc}$ and $K_{ldpc}$ and is determined to satisfy $Q_{ldpc}=(N_{ldpc}-K_{ldpc})/M$. Here, M and $Q_{ldpc}$ are integers and $K_{ldpc}/M$ is also an integer. M and $Q_{ldpc}$ may have various values according to a length of the LDPC codeword and a code rate or coding rate (CR).

For example, when M=360 and the length of the LDPC codeword, $N_{ldpc}$, is 64800, $Q_{ldpc}$ may be defined as in Table 1 presented below, and, when M=360 and the length $N_{ldpc}$ of the LDPC codeword is 16200, $Q_{ldpc}$ may be defined as in Table 2 presented below.

TABLE 1

| Code Rate | $N_{ldpc}$ | M | $Q_{ldpc}$ |
| --- | --- | --- | --- |
| 5/15 | 64800 | 360 | 120 |
| 6/15 | 64800 | 360 | 108 |
| 7/15 | 64800 | 360 | 96 |
| 8/15 | 64800 | 360 | 84 |
| 9/15 | 64800 | 360 | 72 |
| 10/15 | 64800 | 360 | 60 |
| 11/15 | 64800 | 360 | 48 |
| 12/15 | 64800 | 360 | 36 |
| 13/15 | 64800 | 360 | 24 |

TABLE 2

| Code Rate | $N_{ldpc}$ | M | $Q_{ldpc}$ |
| --- | --- | --- | --- |
| 5/15 | 16200 | 360 | 30 |
| 6/15 | 16200 | 360 | 27 |
| 7/15 | 16200 | 360 | 24 |
| 8/15 | 16200 | 360 | 21 |
| 9/15 | 16200 | 360 | 18 |
| 10/15 | 16200 | 360 | 15 |
| 11/15 | 16200 | 360 | 12 |
| 12/15 | 16200 | 360 | 9 |
| 13/15 | 16200 | 360 | 6 |

Second, when the degree of the $0^{th}$ column of the $i^{th}$ column group (1=0, 1, . . . , $K_{ldpc}/M-1$) is $D_i$ (herein, the degree is the number of value 1 existing in each column and all columns belonging to the same column group have the same degree), and a position (or an index) of each row where 1 exists in the $0^{th}$ column of the $i^{th}$ column group is $R_{i,0}^{(0)}$, $R_{i,0}^{(1)}, \ldots, R_{i,0}^{(D_i-1)}$, an index $R_{i,j}^{(k)}$ of a row where $k^{th}$ 1 is located in the $j^{th}$ column in the $i^{th}$ column group is determined by following Equation 1:

$$R_{i,j}^{(k)} = R_{i,(j-1)}^{(k)} + Q_{ldpc} \mod(N_{ldpc} - K_{ldpc}) \quad (1),$$

where k=0, 1, 2, ... $D_i$−1; i=0, 1, ..., $K_{ldpc}$/M−1; and j=1, 2, ..., M−1.

Equation 1 can be expressed as following Equation 2:

$$R_{i,j}^{(k)} = \{R_{i,0}^{(k)} + (j \mod M) \times Q_{ldpc}\} \mod(N_{ldpc} - K_{ldpc}) \quad (2),$$

where k=0, 1, 2, ... $D_i$−1; i=0, 1, ..., $K_{ldpc}$/M−1; and j=1, 2, ..., M−1. Since j=1, 2, ..., M−1, (j mod M) of Equation 2 may be regarded as j.

In the above equations, $R_{i,j}^{(k)}$ is an index of a row where $k^{th}$ 1 is located in the $j^{th}$ column in the $i^{th}$ column group, $N_{ldpc}$ is a length of an LDPC codeword, $K_{ldpc}$ is a length of information word bits, $D_i$ is a degree of columns belonging to the $i^{th}$ column group, M is the number of columns belonging to a single column group, and $Q_{ldpc}$ is a size by which each column in the column group is cyclic-shifted.

As a result, referring to these equations, when only $R_{i,0}^{(k)}$ is known, the index $R_{i,j}^{(k)}$ of the row where the $k^{th}$ 1 is located in the $j^{th}$ column in the $i^{th}$ column group can be known. Therefore, when the index value of the row where the $k^{th}$ 1 is located in the $0^{th}$ column of each column group is stored, a position of column and row where 1 is located in the parity check matrix 200 having the configuration of FIG. 20 (that is, in the information word submatrix 210 of the parity check matrix 200) can be known.

According to the above-described rules, all of the columns belonging to the $i^{th}$ column group have the same degree $D_i$. Accordingly, the LDPC codeword which stores information on the parity check matrix according to the above-described rules may be briefly expressed as follows.

For example, when $N_{ldpc}$ is 30, $K_{ldpc}$ is 15, and $Q_{ldpc}$ is 3, position information of the row where 1 is located in the $0^{th}$ column of the three column groups may be expressed by a sequence of Equations 3 and may be referred to as "weight-1 position sequence".

$$R_{1,0}^{(1)} = 1, R_{1,0}^{(2)} = 2, R_{1,0}^{(3)} = 8 R_{1,0}^{(4)} = 10,$$

$$R_{2,0}^{(1)} = 0, R_{2,0}^{(2)} = 9, R_{2,0}^{(3)} = 13,$$

$$R_{3,0}^{(1)} = 0, R_{3,0}^{(2)} = 14. \quad (3),$$

where $R_{i,j}^{(k)}$ is an index of a row where $k^{th}$ 1 is located in the $j^{th}$ column in the $i^{th}$ column group.

The weight-1 position sequence like Equation 3 which expresses an index of a row where 1 is located in the $0^{th}$ column of each column group may be briefly expressed as in Table 3 presented below:

TABLE 3

| |
|---|
| 1 2 8 10 |
| 0 9 13 |
| 0 14 |

Table 3 shows positions of elements having value 1 in the parity check matrix, and the $i^{th}$ weight-1 position sequence is expressed by indexes of rows where 1 is located in the $0^{th}$ column belonging to the $i^{th}$ column group.

The information word submatrix 210 of the parity check matrix according to an exemplary embodiment may be defined as in Tables 4 to 12 presented below, based on the above descriptions.

Tables 4 to 12 show indexes of rows where 1 is located in the $0^{th}$ column of the $i^{th}$ column group of the information word submatrix 210. That is, the information word submatrix 210 is formed of a plurality of column groups each including M number of columns, and positions of 1 in the $0^{th}$ column of each of the plurality of column groups may be defined by Tables 4 to 12.

Herein, the indexes of the rows where 1 is located in the $0^{th}$ column of the $i^{th}$ column group mean "addresses of parity bit accumulators". The "addresses of parity bit accumulators" have the same meaning as defined in the DVB-C2/S2/T2 standards or the ATSC 3.0 standards which are currently being established, and thus, a detailed explanation thereof is omitted.

For example, when the length $N_{ldpc}$ of the LDPC codeword is 16200, the code rate is 5/15, and M is 360, the indexes of the rows where 1 is located in the $0^{th}$ column of the $i^{th}$ column group of the information word submatrix 210 are as shown in Table 4 presented below:

TABLE 4

| i | Indexes of row where 1 is located in the 0th column of the ith column group |
|---|---|
| 0 | 245 449 491 980 1064 1194 1277 1671 2026 3186 4399 4900 5283 5413 5558 6570 7492 7768 7837 7984 8306 8483 8685 9357 9642 10045 10179 10261 10338 10412 |
| 1 | 1318 1584 1682 1860 1954 2000 2062 3387 3441 3879 3931 4240 4302 4446 4603 5117 5588 5675 5793 5955 6097 6221 6449 6616 7218 7394 9535 9896 10009 10763 |
| 2 | 105 472 785 911 1168 1450 2550 2851 3277 3624 4128 4460 4572 4669 4783 5102 5133 5199 5905 6647 7028 7086 7703 8121 8217 9149 9304 9476 9736 9884 |
| 3 | 1217 5338 5737 8334 |
| 4 | 855 994 2979 9443 |
| 5 | 7506 7811 9212 9982 |
| 6 | 848 3313 3380 3990 |
| 7 | 2095 4113 4620 9946 |
| 8 | 1488 2396 6130 7483 |
| 9 | 1002 2241 7067 10418 |
| 10 | 2008 3199 7215 7502 |
| 11 | 1161 7705 8194 8534 |
| 12 | 2316 4803 8649 9359 |
| 13 | 125 1880 3177 |
| 14 | 1141 8033 9072 |

In another example, when the length $N_{ldpc}$ of the LDPC codeword is 16200, the code rate is 7/15, and M is 360, the indexes of the rows where 1 is located in the $0^{th}$ column of the $i^{th}$ column group of the information word submatrix 210 are as shown in Table 5 or Table 6 presented below:

TABLE 5

| i | Indexes of row where 1 is located in the 0th column of the ith column group |
|---|---|
| 0 | 553 742 901 1327 1544 2179 2519 3131 3280 3603 3789 3792 4253 5340 5934 5962 6004 6698 7793 8001 8058 8126 8276 8559 |
| 1 | 503 590 598 1185 1266 1336 1806 2473 3021 3356 3490 3680 3936 4501 4659 5891 6132 6340 6602 7447 8007 8045 8059 8249 |
| 2 | 795 831 947 1330 1502 2041 2328 2513 2814 2829 4048 4802 6044 6109 6461 6777 6800 7099 7126 8095 8428 8519 8556 8610 |
| 3 | 601 787 899 1757 2259 2518 2783 2816 2823 2949 3396 4330 4494 4684 4700 4837 4881 4975 5130 5464 6554 6912 7094 8297 |
| 4 | 4229 5628 7917 7992 |
| 5 | 1506 3374 4174 5547 |
| 6 | 4275 5650 8208 8533 |
| 7 | 1504 1747 3433 6345 |
| 8 | 3659 6955 7575 7852 |
| 9 | 607 3002 4913 6453 |
| 10 | 3533 6860 7895 8048 |
| 11 | 4094 6366 8314 |
| 12 | 2206 4513 5411 |
| 13 | 32 3882 5149 |
| 14 | 389 3121 4626 |
| 15 | 1308 4419 6520 |

TABLE 5-continued

Indexes of row where 1 is located in the 0th column of the ith column group

| i | |
|---|---|
| 16 | 2092 2373 6849 |
| 17 | 1815 3679 7152 |
| 18 | 3582 3979 6948 |
| 19 | 1049 2135 3754 |
| 20 | 2276 4442 6591 |

TABLE 6

Indexes of row where 1 is located in the 0th column of the ith column group

| i | |
|---|---|
| 0 | 432 655 893 942 1285 1427 1738 2199 2441 2565 2932 3201 4144 4419 4678 4963 5423 5922 6433 6564 6656 7478 7514 7892 |
| 1 | 220 453 690 826 1116 1425 1488 1901 3119 3182 3568 3800 3953 4071 4782 5038 5555 6836 6871 7131 7609 7850 8317 8443 |
| 2 | 300 454 497 930 1757 2145 2314 2372 2467 2819 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7066 8412 8500 8599 |
| 4 | 1373 4668 5324 7777 |
| 5 | 189 3930 5766 6877 |
| 6 | 3 2961 4207 5747 |
| 7 | 1108 4768 6743 7106 |
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4212 5925 |
| 17 | 1719 7657 8554 |
| 18 | 53 1895 6685 |
| 19 | 584 5420 6856 |
| 20 | 2958 5834 8103 |

In another example, when the length $N_{ldpc}$ of the LDPC codeword is 16200, the code rate is 9/15, and M is 360, the indexes of rows where 1 exists in the $0^{th}$ column of the $i^{th}$ column group of the information word submatrix 210 are defined as shown in Table 7 or Table 8 below.

TABLE 7

Indexes of row where 1 is located in the 0th column of the ith column group

| i | |
|---|---|
| 0 | 212 255 540 967 1033 1517 1538 3124 3408 3800 4373 4864 4905 5163 5177 6186 |
| 1 | 275 660 1351 2211 2876 3063 3433 4088 4273 4544 4618 4632 5548 6101 6111 6136 |
| 2 | 279 335 494 865 1662 1681 3414 3775 4252 4595 5272 5471 5796 5907 5986 6008 |
| 3 | 345 352 3094 3188 4297 4338 4490 4865 5303 6477 |
| 4 | 222 681 1218 3169 3850 4878 4954 5666 6001 6237 |
| 5 | 172 512 1536 1559 2179 2227 3334 4049 6464 |
| 6 | 716 934 1694 2890 3276 3608 4332 4468 5945 |
| 7 | 1133 1593 1825 2571 3017 4251 5221 5639 5845 |
| 8 | 1076 1222 6465 |
| 9 | 159 5064 6078 |
| 10 | 374 4073 5357 |
| 11 | 2833 5526 5845 |
| 12 | 1594 3639 5419 |
| 13 | 1028 1392 4239 |
| 14 | 115 622 2175 |
| 15 | 300 1748 6245 |
| 16 | 2724 3276 5349 |
| 17 | 1433 6117 6448 |
| 18 | 485 663 4955 |
| 19 | 711 1132 4315 |
| 20 | 177 3266 4339 |

TABLE 7-continued

Indexes of row where 1 is located in the 0th column of the ith column group

| i | |
|---|---|
| 21 | 1171 4841 4982 |
| 22 | 33 1584 3692 |
| 23 | 2820 3485 4249 |
| 24 | 1716 2428 3125 |
| 25 | 250 2275 6338 |
| 26 | 108 1719 4961 |

TABLE 8

Indexes of row where 1 is located in the 0th column of the ith column group

| i | |
|---|---|
| 0 | 350 462 1291 1383 1821 2235 2493 3328 3353 3772 3872 3923 4259 4426 4542 4972 5347 6217 6246 6332 6386 |
| 1 | 177 869 1214 1253 1398 1482 1737 2014 2161 2331 3108 3297 3438 4388 4430 4456 4522 4783 5273 6037 6395 |
| 2 | 347 501 658 966 1622 1659 1934 2117 2527 3168 3231 3379 3427 3739 4218 4497 4894 5000 5167 5728 5975 |
| 3 | 319 398 599 1143 1796 3198 3521 3886 4139 4453 4556 4636 4688 4753 4986 5199 5224 5496 5698 5724 6123 |
| 4 | 162 257 304 524 945 1695 1855 2527 2780 2902 2958 3439 3484 4224 4769 4928 5156 5303 5971 6358 6477 |
| 5 | 807 1695 2941 4276 |
| 6 | 2652 2857 4660 6358 |
| 7 | 329 2100 2412 3632 |
| 8 | 1151 1231 3872 4869 |
| 9 | 1561 3565 5138 5303 |
| 10 | 407 794 1455 |
| 11 | 3438 5683 5749 |
| 12 | 1504 1985 3563 |
| 13 | 440 5021 6321 |
| 14 | 194 3645 5923 |
| 15 | 1217 1462 6422 |
| 16 | 1212 4715 5973 |
| 17 | 4098 5100 5642 |
| 18 | 5512 5857 6226 |
| 19 | 2583 5506 5933 |
| 20 | 784 1801 4890 |
| 21 | 4734 4779 4875 |
| 22 | 938 5081 5377 |
| 23 | 127 4125 4704 |
| 24 | 1244 2178 3352 |
| 25 | 3659 6350 6465 |
| 26 | 1686 3464 4336 |

In another example, when the length $N_{ldpc}$ of the LDPC codeword is 16200, the code rate is 11/15, and M is 360, the indexes of rows where 1 exists in the $0^{th}$ column of the $i^{th}$ column group of the information word submatrix 210 are defined as shown in Table 9 or Table 10 below.

TABLE 9

Indexes of row where 1 is located in the 0th column of the ith column group

| i | |
|---|---|
| 0 | 49 719 784 794 968 2382 2685 2873 2974 2995 3540 4179 |
| 1 | 272 281 374 1279 2034 2067 2112 3429 3613 3815 3838 4216 |
| 2 | 206 714 820 1800 1925 2147 2168 2769 2806 3253 3415 4311 |
| 3 | 62 159 166 605 1496 1711 2652 3016 3347 3517 3654 4113 |
| 4 | 363 733 1118 2062 2613 2736 3143 3427 3664 4100 4157 4314 |
| 5 | 57 142 436 983 1364 2105 2113 3074 3639 3835 4164 4242 |
| 6 | 870 921 950 1212 1861 2128 2707 2993 3730 3968 3983 4227 |
| 7 | 185 2684 3263 |
| 8 | 2035 2123 2913 |
| 9 | 883 2221 3521 |
| 10 | 1344 1773 4132 |
| 11 | 438 3178 3650 |
| 12 | 543 756 1639 |
| 13 | 1057 2337 2898 |
| 14 | 171 3298 3929 |
| 15 | 1626 2960 3503 |

TABLE 9-continued

Indexes of row where 1 is located in the 0th column of the ith column group

| i | |
|---|---|
| 16 | 484 3050 3323 |
| 17 | 2283 2336 4189 |
| 18 | 2732 4132 4318 |
| 19 | 225 2335 3497 |
| 20 | 600 2246 2658 |
| 21 | 1240 2790 3020 |
| 22 | 301 1097 3539 |
| 23 | 1222 1267 2594 |
| 24 | 1364 2004 3603 |
| 25 | 1142 1185 2147 |
| 26 | 564 1505 2086 |
| 27 | 697 991 2908 |
| 28 | 1467 2073 3462 |
| 29 | 2574 2818 3637 |
| 30 | 748 2577 2772 |
| 31 | 1151 1419 4129 |
| 32 | 164 1238 3401 |

TABLE 10

Indexes of row where 1 is located in the 0th column of the ith column group

| i | |
|---|---|
| 0 | 108 297 703 742 1345 1443 1495 1628 1812 2341 2559 2669 2810 2877 3442 3690 3755 3904 4264 |
| 1 | 180 211 477 788 824 1090 1272 1578 1685 1948 2050 2195 2233 2546 2757 2946 3147 3299 3544 |
| 2 | 627 741 1135 1157 1226 1333 1378 1427 1454 1696 1757 1772 2099 2208 2592 3354 3580 4066 4242 |
| 3 | 9 795 959 989 1006 1032 1135 1209 1382 1484 1703 1855 1985 2043 2629 2845 3136 3450 3742 |
| 4 | 230 413 801 829 1108 1170 1291 1759 1793 1827 1976 2000 2423 2466 2917 3010 3600 3782 4143 |
| 5 | 56 142 236 381 1050 1141 1372 1627 1985 2247 2340 3023 3434 3519 3957 4013 4142 4164 4279 |
| 6 | 298 1211 2548 3643 |
| 7 | 73 1070 1614 1748 |
| 8 | 1439 2141 3614 |
| 9 | 284 1564 2629 |
| 10 | 607 660 855 |
| 11 | 1195 2037 2753 |
| 12 | 49 1198 2562 |
| 13 | 296 1145 3540 |
| 14 | 1516 2315 2382 |
| 15 | 154 722 4016 |
| 16 | 759 2375 3825 |
| 17 | 162 194 1749 |
| 18 | 2335 2422 2632 |
| 19 | 6 1172 2583 |
| 20 | 726 1325 1428 |
| 21 | 985 2708 2769 |
| 22 | 255 2801 3181 |
| 23 | 2979 3720 4090 |
| 24 | 208 1428 4094 |
| 25 | 199 3743 3757 |
| 26 | 1229 2059 4282 |
| 27 | 458 1100 1387 |
| 28 | 1199 2481 3284 |
| 29 | 1161 1467 4060 |
| 30 | 959 3014 4144 |
| 31 | 2666 3960 4125 |
| 32 | 2809 3834 4318 |

In another example, when the length $N_{ldpc}$ of the LDPC codeword is 16200, the code rate is 13/15, and M is 360, the indexes of rows where 1 exists in the $0^{th}$ column of the $i^{th}$ column group of the information word submatrix 210 are defined as shown in Table 11 or 12 below.

TABLE 11

Indexes of row where 1 is located in the 0th column of the ith column group

| i | |
|---|---|
| 0 | 71 334 645 779 786 1124 1131 1267 1379 1554 1766 1798 1939 |
| 1 | 6 183 364 506 512 922 972 981 1039 1121 1537 1840 2111 |
| 2 | 6 71 153 204 253 268 781 799 873 1118 1194 1661 2036 |
| 3 | 6 247 353 581 921 940 1108 1146 1208 1265 1511 1527 1671 |
| 4 | 6 37 466 548 747 1142 1203 1271 1512 1516 1837 1904 2125 |
| 5 | 6 171 863 953 1025 1244 1378 1396 1723 1783 1816 1914 2121 |
| 6 | 1268 1360 1647 1769 |
| 7 | 6 458 1231 1414 |
| 8 | 183 535 1244 1277 |
| 9 | 107 300 498 1456 |
| 10 | 6 2007 2059 2120 |
| 11 | 1480 1523 1670 1927 |
| 12 | 139 573 711 1790 |
| 13 | 6 1541 1889 2023 |
| 14 | 6 374 957 1174 |
| 15 | 287 423 872 1285 |
| 16 | 6 1809 1918 |
| 17 | 65 818 1396 |
| 18 | 590 756 2107 |
| 19 | 192 814 1843 |
| 20 | 775 1163 1256 |
| 21 | 42 735 1415 |
| 22 | 334 1008 2055 |
| 23 | 109 596 1785 |
| 24 | 406 534 1852 |
| 25 | 684 719 1543 |
| 26 | 401 465 1040 |
| 27 | 112 392 621 |
| 28 | 82 897 1950 |
| 29 | 887 1962 2125 |
| 30 | 793 1088 2159 |
| 31 | 723 919 1138 |
| 32 | 610 839 1302 |
| 33 | 218 1080 1816 |
| 34 | 627 1646 1749 |
| 35 | 496 1165 1741 |
| 36 | 916 1055 1662 |
| 37 | 182 722 945 |
| 38 | 5 595 1674 |

TABLE 12

Indexes of row where 1 is located in the 0th column of the ith column group

| i | |
|---|---|
| 0 | 37 144 161 199 220 496 510 589 731 808 834 965 1249 1264 1311 1377 1460 1520 1598 1707 1958 2055 2099 2154 |
| 1 | 20 27 165 462 546 583 742 796 1095 1110 1129 1145 1169 1190 1254 1363 1383 1463 1718 1835 1870 1879 2108 2128 |
| 2 | 288 362 483 505 638 691 745 861 1006 1033 1124 1175 1247 1275 1337 1353 1378 1506 1588 1632 1720 1868 1980 2135 |
| 3 | 405 464 478 511 566 574 641 766 785 802 836 996 1128 1239 1247 1449 1491 1537 1616 1643 1668 1950 1975 2149 |
| 4 | 86 192 245 357 363 374 700 713 852 903 992 1174 1245 1277 1342 1369 1381 1417 1463 1712 1900 1962 2053 2118 |
| 5 | 101 327 378 550 |
| 6 | 186 723 1318 1550 |
| 7 | 118 277 504 1835 |
| 8 | 199 407 1776 1965 |
| 9 | 387 1253 1328 1975 |
| 10 | 62 144 1163 2017 |
| 11 | 100 475 572 2136 |
| 12 | 431 865 1568 2055 |
| 13 | 283 640 981 1172 |
| 14 | 220 1038 1903 2147 |
| 15 | 483 1318 1358 2118 |
| 16 | 92 961 1709 1810 |
| 17 | 112 403 1485 2042 |
| 18 | 431 1110 1130 1365 |
| 19 | 587 1005 1206 1588 |
| 20 | 704 1113 1943 |
| 21 | 375 1487 2100 |
| 22 | 1507 1950 2110 |
| 23 | 962 1613 2038 |

TABLE 12-continued

| i | Indexes of row where 1 is located in the 0th column of the ith column group | | |
|---|---|---|---|
| 24 | 554 | 1295 | 1501 |
| 25 | 488 | 784 | 1446 |
| 26 | 871 | 1935 | 1964 |
| 27 | 54 | 1475 | 1504 |
| 28 | 1579 | 1617 | 2074 |
| 29 | 1856 | 1967 | 2131 |
| 30 | 330 | 1582 | 2107 |
| 31 | 40 | 1056 | 1809 |
| 32 | 1310 | 1353 | 1410 |
| 33 | 232 | 554 | 1939 |
| 34 | 168 | 641 | 1099 |
| 35 | 333 | 437 | 1556 |
| 36 | 153 | 622 | 745 |
| 37 | 719 | 931 | 1188 |
| 38 | 237 | 638 | 1607 |

In the above-described examples, the length of the LDPC codeword is 16200 and the code rate is 5/15, 7/15, 9/15, 11/15 and 13/15. However, this is merely an example, and the position of 1 in the information word submatrix 210 may be defined variously when the length of the LDPC codeword is 64800 or the code rate has different values.

According to an exemplary embodiment, even when an order of indexes in a sequence in the $0^{th}$ column of each column group of the parity check matrix 200 as shown in the above-described Tables 4 to 12 is changed, the changed parity check matrix is a parity check matrix used for the same code. Therefore, a case in which the order of indexes in the sequence in the $0^{th}$ column of each column group in Tables 4 to 12 is changed is covered by the inventive concept.

According to an exemplary embodiment, even when the arrangement order of sequences corresponding the i+1 number of column groups is changed in Tables 4 to 12, cycle characteristics on a graph of a code and algebraic characteristics such as degree distribution are not changed. Therefore, a case in which the arrangement order of the sequences shown in Tables 4 to 12 is changed is also covered by the inventive concept.

In addition, even when a multiple of $Q_{ldpc}$ is equally added to all indexes in a certain column group (i.e., a sequence) in Tables 4 to 12, the cycle characteristics on the graph of the code or the algebraic characteristics such as degree distribution are not changed. Therefore, a result of equally adding a multiple of $Q_{ldpc}$ to all indexes shown in Tables 4 to 12 is also covered by the inventive concept. However, it should be noted that, when the resulting value obtained by adding the multiple of $Q_{ldpc}$ to all indexes in a given sequence is greater than or equal to $(N_{ldpc}-K_{ldpc})$, a value obtained by applying a modulo operation to $(N_{ldpc}-K_{ldpc})$ should be applied instead.

Once positions of the rows where 1 exists in the $0^{th}$ column of the $i^{th}$ column group of the information word submatrix 210 are defined as shown in Tables 4 to 12, positions of rows where 1 exists in other columns of each column group may be defined since the positions of the rows where 1 exists in the $0^{th}$ column are cyclic-shifted by $Q_{ldpc}$ in the next column.

For example, in the case of Table 4, in the $0^{th}$ column of the $0^{th}$ column group of the information word submatrix 210, 1 exists in the $245^{th}$ row, $449^{nd}$ row, $4911^{st}$ row, . . . .

In this case, since $Q_{ldpc}=(N_{ldpc}-K_{ldpc})/M=(16200-5400)/360=30$, the indexes of the rows where 1 is located in the $1^{st}$ column of the $0^{th}$ column group may be 275 (=245+30), 479 (=449+30), 521 (=491+30), . . . , and the indexes of the rows where 1 is located in the $2^{nd}$ column of the $0^{th}$ column group may be 305 (=275+30), 509 (=479+30), 551 (=521+30), . . . .

In the above-described method, the indexes of the rows where 1 is located in all rows of each column group may be defined.

The parity submatrix 220 of the parity check matrix 200 shown in FIG. 20 may be defined as follows:

The parity submatrix 220 includes $N_{ldpc}-K_{ldpc}$ number of columns (that is, $K_{ldpc}{}^{th}$ column to $(N_{ldpc}-1)^{th}$ column), and has a dual diagonal or staircase configuration. Accordingly, the degree of columns except the last column (that is, $(N_{ldpc}-1)^{th}$ column) from among the columns included in the parity submatrix 220 is 2, and the degree of the last column is 1.

As a result, the information word submatrix 210 of the parity check matrix 200 may be defined by Tables 4 to 12, and the parity submatrix 220 of the parity check matrix 200 may have a dual diagonal configuration.

When the columns and rows of the parity check matrix 200 shown in FIG. 20 are permutated based on Equation 4 and Equation 5 below, the parity check matrix shown in FIG. 20 may be changed to a parity check matrix 300 shown in FIG. 21.

$$Q_{ldpc} \cdot i+j \Rightarrow M \cdot j+i (0 \le i<M, 0 \le j<Q_{ldpc}) \quad (4)$$

$$K_{ldpc}+Q_{ldpc} \cdot k+l \Rightarrow K_{ldpc}+M \cdot l+k (0 \le k<M, 0 \le l<Q_{ldpc}) \quad (5)$$

The method for permutation based on Equation 4 and Equation 5 will be explained below. Since row permutation and column permutation apply the same principle, the row permutation will be explained as an example.

In the case of the row permutation, regarding the $X^{th}$ row, i and j satisfying $X=Q_{ldpc} \times i+j$ are calculated and the $X^{th}$ row is permutated by assigning the calculated i and j to $M \times j+i$. For example of $Q_{ldpc}$ and M being 2 and 10, respectively, regarding the $7^{th}$ row, i and j satisfying $7=2 \times i+j$ are 3 and 1, respectively. Therefore, the $7^{th}$ row is permutated to the $13^{th}$ row ($10 \times 1+3=13$).

Figure 21:
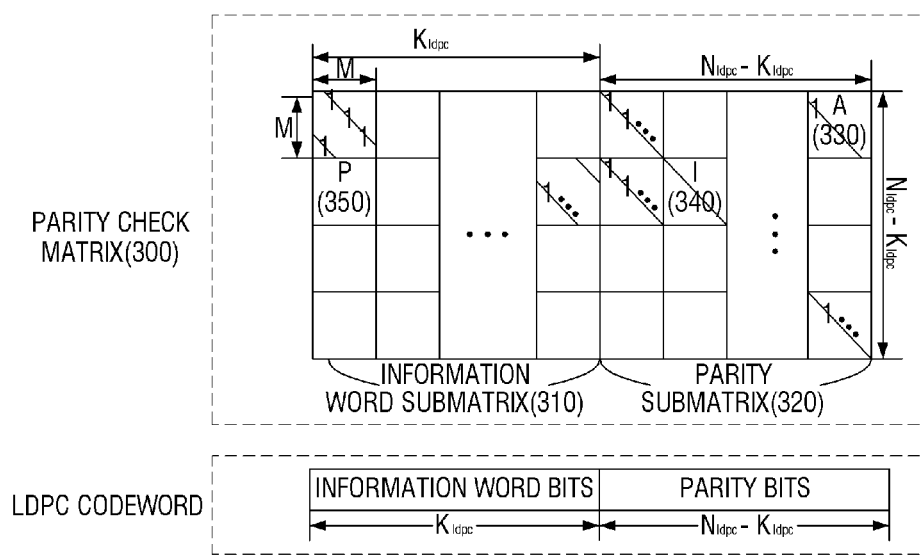

When the row permutation and the column permutation are performed in the above-described method, the parity check matrix of FIG. 20 may be converted into the parity check matrix of FIG. 21.

Referring to FIG. 21, the parity check matrix 300 is divided into a plurality of partial blocks, and a quasi-cyclic matrix of M×M corresponds to each partial block.

Accordingly, the parity check matrix 300 having the configuration of FIG. 21 is formed of matrix units of M×M. That is, the submatrices of M×M are arranged as a plurality of partial blocks which constitute the parity check matrix 300.

Since the parity check matrix 300 is formed of the quasi-cyclic matrices of M×M, M number of columns may be referred to as a column block and M number of rows may be referred to as a row block. Accordingly, the parity check matrix 300 having the configuration of FIG. 21 is formed of $N_{qc\_column}=N_{ldpc}/M$ number of column blocks and $N_{qc\_row}=N_{parity}/M$ number of row blocks.

Hereinafter, the submatrix of M×M will be explained.

First, the $(N_{qc\_column}-1)^{th}$ column block of the $0^{th}$ row block has a form shown in Equation 6 presented below:

$$A = \begin{bmatrix} 0 & 0 & \cdots & 0 & 0 \\ 1 & 0 & \cdots & 0 & 0 \\ 0 & 1 & \cdots & 0 & 0 \\ \vdots & \vdots & \vdots & \vdots & \vdots \\ 0 & 0 & \cdots & 1 & 0 \end{bmatrix} \quad (6)$$

As described above, A 330 is an M×M matrix, values of the $0^{th}$ row and the $(M-1)^{th}$ column are all "0", and, regarding $0 \leq i \leq (M-2)$, the $(i+1)^{th}$ row of the $i^{th}$ column is "1" and the other values are "0".

Second, regarding $0 \leq i \leq (N_{ldpc}-K_{ldpc})/M-1$ in the parity submatrix 320, the $i^{th}$ row block of the $(K_{ldpc}/M+i)^{th}$ column block is configured by a unit matrix $I_{M \times M}$ 340. In addition, regarding $0 \leq i \leq (N_{ldpc}-K_{ldpc})/M-2$, the $(i+1)^{th}$ row block of the $(K_{ldpc}/M+i)^{th}$ column block is configured by a unit matrix $I_{M \times M}$ 340.

Third, a block 350 constituting the information word submatrix 310 may have a cyclic-shifted format of a cyclic matrix P, $P^{a_{ij}}$, or an added format of the cyclic-shifted matrix $P^{a_{ij}}$ of the cyclic matrix P (or an overlapping format).

For example, a format in which the cyclic matrix P is cyclic-shifted to the right by 1 may be expressed by Equation 7 presented below:

$$P = \begin{bmatrix} 0 & 1 & 0 & & 0 \\ 0 & 0 & 1 & \ldots & 0 \\ \vdots & \vdots & \vdots & & \vdots \\ 0 & 0 & 0 & \ldots & 1 \\ 1 & 0 & 0 & & 0 \end{bmatrix} \quad (7)$$

The cyclic matrix P is a square matrix having an M×M size and is a matrix in which a weight of each of M number of rows is 1 and a weight of each of M number of columns is 1. When $a_{ij}$ is 0, the cyclic matrix P, that is, $P^0$ indicates a unit matrix $I_{M \times M}$, and when $a_{ij}$ is $\infty$, $P^\infty$ is a zero matrix.

A submatrix existing where the $i^{th}$ row block and the $j^{th}$ column block intersect in the parity check matrix 300 of FIG. 21 may be $P^{a_{ij}}$. Accordingly, i and j indicate the number of row blocks and the number of column blocks in the partial blocks corresponding to the information word. Accordingly, in the parity check matrix 300, the total number of columns is $N_{ldpc}=M \times N_{qc\_column}$, and the total number of rows is $N_{parity}=M \times N_{qc\_row}$. That is, the parity check matrix 300 is formed of $N_{qc\_column}$ number of column blocks and $N_{qc\_row}$ number of row blocks.

Hereinafter, a method for performing LDPC encoding based on the parity check matrix 200 as shown in FIG. 20 will be explained. An LDPC encoding process when the parity check matrix 200 is defined as shown in Table 4 will be explained as an example for the convenience of explanation.

First, when information word bits having a length of $K_{ldpc}$ are $[i_0, i_1, i_2, \ldots, i_{K_{ldpc}-1}]$, and parity bits having a length of $N_{ldpc}-K_{ldpc}$ are $[p_0, p_1, p_2, \ldots p_{N_{ldpc}-K_{ldpc}-1}]$, the LDPC encoding is performed by the following process.

Step 1) Parity bits are initialized as '0'. That is, $p_0=p_1=p_2=\ldots=p_{N_{ldpc}-K_{ldpc}-1}=0$.

Step 2) The $0^{th}$ information word bit $i_0$ is accumulated in parity bits having the indexes defined in the first row (that is, the row of i=0) of Table 4 as addresses of the parity bits. This may be expressed by Equation 8 presented below:

$$\begin{aligned} P_{245} &= P_{245} \oplus i_0 & P_{6570} &= P_{6570} \oplus i_0 \\ P_{449} &= P_{449} \oplus i_0 & P_{7492} &= P_{7492} \oplus i_0 \\ P_{491} &= P_{491} \oplus i_0 & P_{7768} &= P_{7768} \oplus i_0 \\ P_{980} &= P_{980} \oplus i_0 & P_{7837} &= P_{7837} \oplus i_0 \end{aligned} \quad (8)$$

-continued $$\begin{aligned} P_{1064} &= P_{1064} \oplus i_0 & P_{7984} &= P_{7984} \oplus i_0 \\ P_{1194} &= P_{1194} \oplus i_0 & P_{8306} &= P_{8306} \oplus i_0 \\ P_{1277} &= P_{1277} \oplus i_0 & P_{8483} &= P_{8483} \oplus i_0 \\ P_{1671} &= P_{1671} \oplus i_0 & P_{8685} &= P_{8685} \oplus i_0 \\ P_{2026} &= P_{2026} \oplus i_0 & P_{9357} &= P_{9357} \oplus i_0 \\ P_{3186} &= P_{3186} \oplus i_0 & P_{9642} &= P_{9642} \oplus i_0 \\ P_{4399} &= P_{4399} \oplus i_0 & P_{10045} &= P_{10045} \oplus i_0 \\ P_{4900} &= P_{4900} \oplus i_0 & P_{10179} &= P_{10179} \oplus i_0 \\ P_{5283} &= P_{5283} \oplus i_0 & P_{10261} &= P_{10261} \oplus i_0 \\ P_{5413} &= P_{5413} \oplus i_0 & P_{10338} &= P_{10338} \oplus i_0 \\ P_{5558} &= P_{5558} \oplus i_0 & P_{10412} &= P_{10412} \oplus i_0 \end{aligned}$$

Here, $i_0$ is a $0^{th}$ information word bit, $p_i$ is an $i^{th}$ parity bit, and $\oplus$ is a binary operation. According to the binary operation, $1 \oplus 1$ equals 0, $1 \oplus 0$ equals 1, $0 \oplus 1$ equals 1, $0 \oplus 0$ equals 0.

Step 3) The other 359 information word bits $i_m$ (m=1, 2, . . . , 359) are accumulated in parity bits having addresses calculated based on Equation 9 below. These information word bits may belong to the same column group as that of $i_0$.

$$(x+(m \bmod 360) \times Q_{ldpc}) \bmod (N_{ldpc}-K_{ldpc}) \quad (9)$$

Here, x is an address of a parity bit accumulator corresponding to the information word bit $i_0$, and $Q_{ldpc}$ is a size by which each column is cyclic-shifted in the information word submatrix, and may be 30 in the case of Table 4. In addition, since m=1, 2, . . . , 359, (m mod 360) in Equation 9 may be regarded as m.

As a result, the information word bits $i_m$ (m=1,2, . . . , 359) are accumulated in parity bits having the addresses calculated based on Equation 9. For example, an operation as shown in Equation 10 presented below may be performed for the information word bit $i_1$:

$$\begin{aligned} P_{275} &= P_{275} \oplus i_1 & P_{6600} &= P_{6600} \oplus i. \\ P_{479} &= P_{479} \oplus i_1 & P_{7522} &= P_{7522} \oplus i. \\ P_{521} &= P_{521} \oplus i_1 & P_{7798} &= P_{7798} \oplus i. \\ P_{1010} &= P_{1010} \oplus i_1 & P_{7867} &= P_{7867} \oplus i. \\ P_{1094} &= P_{1094} \oplus i_1 & P_{8014} &= P_{8014} \oplus i. \\ P_{1224} &= P_{1224} \oplus i_1 & P_{8336} &= P_{8336} \oplus i. \\ P_{1307} &= P_{1307} \oplus i_1 & P_{8513} &= P_{8513} \oplus i. \\ P_{1701} &= P_{1701} \oplus i_1 & P_{8715} &= P_{8715} \oplus i. \\ P_{2056} &= P_{2056} \oplus i_1 & P_{9387} &= P_{9387} \oplus i. \\ P_{3216} &= P_{3216} \oplus i_1 & P_{9672} &= P_{9672} \oplus i. \\ P_{4429} &= P_{4429} \oplus i_1 & P_{10075} &= P_{10075} \oplus i_1 \\ P_{4930} &= P_{4930} \oplus i_1 & P_{10209} &= P_{10209} \oplus i_1 \\ P_{5313} &= P_{5313} \oplus i_1 & P_{10291} &= P_{10291} \oplus i_1 \\ P_{5443} &= P_{5443} \oplus i_1 & P_{10368} &= P_{10368} \oplus i_1 \\ P_{5588} &= P_{5588} \oplus i_1 & P_{10442} &= P_{10442} \oplus i_1 \end{aligned} \quad (10)$$

Herein, $i_1$ is a $1^{st}$ information word bit, $p_i$ is an $i^{th}$ parity bit, and $\oplus$ is a binary operation. According to the binary operation, $1\oplus 1$ equals 0, $1\oplus 0$ equals 1, $0\oplus 1$ equals 1, $0\oplus 0$ equals 0.

Step 4) The $360^{th}$ information word bits $i_{360}$ is accumulated in parity bits having indexes defined in the $2^{nd}$ row (that is, the row of i=1) of Table 4 as addresses of the parity bits.

Step 5) The other 359 information word bits belonging to the same group as that of the information word bit $i_{360}$ are accumulated in parity bits. In this case, an address of a parity bit may be determined based on Equation 9. However, in this case, x is an address of the parity bit accumulator corresponding to the information word bit $i_{360}$.

Step 6) Steps 4 and 5 described above are repeated for all of the column groups of Table 4.

Step 7) As a result, a parity bit $p_i$ is calculated based on Equation 11 presented below. In this case, i is initialized as 1.

$$p_i = p_i \oplus p_{i-1} i=1,2,\ldots,N_{ldpc}-K_{ldpc}-1 \quad (11)$$

In Equation 11, $p_i$ is an $i^{th}$ parity bit, $N_{ldpc}$ is a length of an LDPC codeword, $K_{ldpc}$ is a length of an information word of the LDPC codeword, and $\oplus$ is a binary operation.

The encoder 110 may calculate parity bits according to the above-described method.

Figure 22:
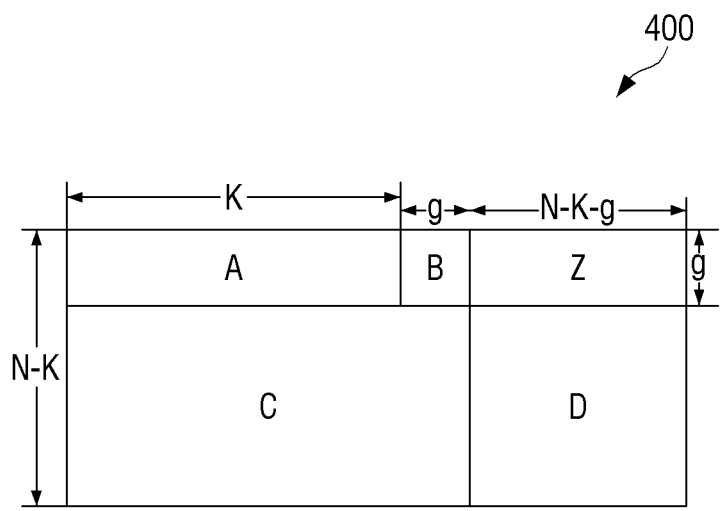

A parity check matrix may have a configuration as shown in FIG. 22, according to another exemplary embodiment.

Referring to FIG. 22, a parity check matrix 400 may be formed of five (5) matrices A, B, C, Z and D. Hereinafter, a configuration of each of these five matrices will be explained to explain the configuration of the parity check matrix 400.

First, $M_1$, $M_2$, $Q_1$ and $Q_2$, which are parameter values related to the parity check matrix 400 as shown in FIG. 22, may be defined as shown in Table 13 presented below according to a length and a code rate of an LDPC codeword.

TABLE 13

| | | Sizes | | | |
|---|---|---|---|---|---|
| Rate | Length | $M_1$ | $M_2$ | $Q_1$ | $Q_2$ |
| 1/15 | 16200 | 2520 | 12600 | 7 | 35 |
| | 64800 | 1080 | 59400 | 3 | 165 |
| 2/15 | 16200 | 3240 | 10800 | 9 | 30 |
| | 64800 | 1800 | 54360 | 5 | 151 |
| 3/15 | 16200 | 1080 | 11880 | 3 | 33 |
| | 64800 | 1800 | 50040 | 5 | 139 |
| 4/15 | 16200 | 1080 | 10800 | 3 | 30 |
| | 64800 | 1800 | 45720 | 5 | 127 |
| 5/15 | 16200 | 720 | 10080 | 2 | 28 |
| | 64800 | 1440 | 41760 | 4 | 116 |
| 6/16 | 16200 | 1080 | 8640 | 3 | 24 |
| | 64800 | 1080 | 37800 | 3 | 105 |

The matrix A is formed of K number of columns and g number of rows, and the matrix C is formed of K+g number of columns and N-K-g number of rows. Here, K is a length of information word bits, and N is a length of the LDPC codeword.

Indexes of rows where 1 is located in the $0^{th}$ column of the $i^{th}$ column group in the matrix A and the matrix C may be defined based on Table 14 according to the length and the code rate of the LDPC codeword. In this case, an interval at which a pattern of a column is repeated in each of the matrix A and the matrix C, that is, the number of columns belonging to a same group, may be 360.

For example, when the length N of the LDPC codeword is 16200 and the code rate is 5/15, the indexes of rows where 1 is located in the $0^{th}$ column of the $i^{th}$ column group in the matrix A and the matrix C are defined as shown in Table 14 presented below:

TABLE 14

| i | Indexes of rows where 1 is located in the 0th column of the ith column group |
|---|---|
| 0 | 69 244 706 5145 5994 6066 6763 6815 8509 |
| 1 | 257 541 618 3933 6188 7048 7484 8424 9104 |
| 2 | 69 500 536 1494 1669 7075 7553 8202 10305 |
| 3 | 11 189 340 2103 3199 6775 7471 7918 10530 |
| 4 | 333 400 434 1806 3264 5693 8534 9274 10344 |
| 5 | 111 129 260 3562 3675 3680 3809 5169 7308 8280 |
| 6 | 100 303 342 3133 3952 4226 4713 5053 5717 9931 |
| 7 | 83 87 374 828 2460 4943 6311 8657 9272 9571 |
| 8 | 114 166 325 2680 4698 7703 7886 8791 9978 10684 |
| 9 | 281 542 549 1671 3178 3955 7153 7432 9052 10219 |
| 10 | 202 271 608 3860 4173 4203 5169 6871 8113 9757 |
| 11 | 16 359 419 3333 4198 4737 6170 7987 9573 10095 |
| 12 | 235 244 584 4640 5007 5563 6029 6316 7678 9968 |
| 13 | 123 449 646 2460 3845 4161 6610 7245 7686 8651 |
| 14 | 136 231 468 835 2622 3292 5158 5294 6584 9926 |
| 15 | 3085 4683 8191 9027 9922 9928 10550 |
| 16 | 2462 3185 3976 4091 8089 8772 9342 |

In the above-described example, the length of the LDPC codeword is 16200 and the code rate 5/15. However, this is merely an example and the indexes of rows where 1 is located in the $0^{th}$ column of the $i^{th}$ column group in the matrix A and the matrix C may be defined differently when the length of the LDPC codeword is 64800 or the code rate has different values.

Hereinafter, positions of rows where 1 exists in the matrix A and the matrix C will be explained with reference to Table 14 by way of an example.

Since the length N of the LDPC codeword is 16200 and the code rate is 5/15 in Table 14, $M_1=720$, $M_2=10080$, $Q_1=2$, and $Q_2=28$ in the parity check matrix 400 defined by Table 14 with reference to Table 13.

Herein, $Q_1$ is a size by which columns of a same column group are cyclic-shifted in the matrix A, and $Q_2$ is a size by which columns of a same column group are cyclic-shifted in the matrix C.

In addition, $Q_1=M_1/L$, $Q_2=M_2/L$, $M_1=g$, and $M_2=N-K-g$, and L is an interval at which a pattern of a column is repeated in the matrix A and the matrix C, and for example, may be 360.

The index of a row where 1 is located in the matrix A and the matrix C may be determined based on the $M_1$ value.

For example, since $M_1=720$ in the case of Table 14, the positions of the rows where 1 exists in the $0^{th}$ column of the $i^{th}$ column group in the matrix A may be determined based on values smaller than 720 from among the index values of Table 14, and the positions of the rows where 1 exists in the $0^{th}$ column of the $i^{th}$ column group in the matrix C may be determined based on values greater than or equal to 720 from among the index values of Table 14.

In Table 14, the sequence corresponding to the $0^{th}$ column group is "69, 244, 706, 5145, 5994, 6066, 6763, 6815, and 8509". Accordingly, in the case of the $0^{th}$ column of the $0^{th}$ column group of the matrix A, 1 may be located in the $69^{th}$ row, $244^{th}$ row, and $706^{th}$ row, and, in the case of the $0^{th}$ column of the $0^{th}$ column group of the matrix C, 1 may be located in the $5145^{th}$ row, $5994^{th}$ row, $6066^{th}$ row, $6763^{rd}$ row, $6815^{th}$ row, and $8509^{th}$ row.

Once positions of 1 in the $0^{th}$ column of each column group of the matrix A are defined, positions of rows where 1 exists in another column of the column group may be defined by cyclic-shifting from an immediately previous column by $Q_1$. Once positions of 1 in the $0^{th}$ column of each column group of the matrix C are defined, position of rows where 1 exists in another column of the column group may be defined by cyclic-shifting from the previous column by $Q_2$.

In the above-described example, in the case of the $0^{th}$ column of the $0^{th}$ column group of the matrix A, 1 exists in the $69^{th}$ row, $244^{th}$ row, and $706^{th}$ row. In this case, since $Q_1=2$, the indexes of rows where 1 exists in the $1^{st}$ column of the $0^{th}$ column group are 71 (=69+2), 246 (=244+2), and 708 (=706+2), and the index of rows where 1 exists in the $2^{nd}$ column of the $0^{th}$ column group are 73 (=71+2), 248 (=246+2), and 710 (=708+2).

In the case of the $0^{th}$ column of the $0^{th}$ column group of the matrix C, 1 exists in the $5145^{th}$ row, $5994^{th}$ row, $6066^{th}$ row, $6763^{rd}$ row, $6815^{th}$ row, and $8509^{th}$ row. In this case, since $Q_2=28$, the index of rows where 1 exists in the $1^{st}$ column of the $0^{th}$ column group are 5173 (=5145+28), 6022 (=5994+28), 6094 (6066+28), 6791 (=6763+28), 6843 (=6815+28), and 8537 (=8509+28) and the indexes of rows where 1 exists in the $2^{nd}$ column of the $0^{th}$ column group are 5201 (=5173+28), 6050 (=6022+28), 6122 (=6094+28), 6819 (=6791+28), 6871 (=6843+28), and 8565 (=8537+28).

In this method, the positions of rows where 1 exists in all column groups of the matrix A and the matrix C are defined.

The matrix B may have a dual diagonal configuration, the matrix D may have a diagonal configuration (that is, the matrix D is an identity matrix), and the matrix Z may be a zero matrix.

As a result, the parity check matrix 400 shown in FIG. 22 may be defined by the matrices A, B, C, D, and Z having the above-described configurations.

Hereinafter, a method for performing LDPC encoding based on the parity check matrix 400 shown in FIG. 22 will be explained. An LDPC encoding process when the parity check matrix 400 is defined as shown in Table 14 will be explained as an example for the convenience of explanation.

For example, when an information word block $S=(s_0, s_1, \ldots, s_{K-1})$ is LDPC-encoded, an LDPC codeword $\Lambda=(\lambda_0, \lambda_1, \ldots, \lambda_{N-1})=(s_0, s_1, \ldots, s_{K-1}, p_0, p_1, \ldots, p_{M_1+M_2-1})$ including a parity bit $P=(p_0, p_1, \ldots, p_{M_1+M_2-1})$ may be generated.

$M_1$ and $M_2$ indicate the size of the matrix B having the dual diagonal configuration and the size of the matrix D having the diagonal configuration, respectively, and $M_1=g$, $M_2=N-K-g$.

A process of calculating a parity bit is as follows. In the following explanation, the parity check matrix 400 is defined as shown in Table 14 as an example for the convenience of explanation.

Step 1) $\lambda$ and p are initialized as $\lambda_i=s_i$ (i=0, 1, ..., K—1), $p_j=0$ (j=0, 1, ..., $M_1+M_2-1$).

Step 2) The $0^{th}$ information word bit $\lambda_0$ is accumulated in parity bits having the indexes defined in the first row (that is, the row of i=0) of Table 14 as addresses of the parity bits. This may be expressed by Equation 12 presented below:

$$P_{69} = P_{69} \oplus \lambda_0 \quad P_{6066} = P_{6066} \oplus \lambda_0 \quad (12)$$
$$P_{244} = P_{244} \oplus \lambda_0 \quad P_{6763} = P_{6763} \oplus \lambda_0$$
$$P_{706} = P_{706} \oplus \lambda_0 \quad P_{6815} = P_{6815} \oplus \lambda_0$$

-continued
$$P_{5145} = P_{5145} \oplus \lambda_0 \quad P_{8509} = P_{8509} \oplus \lambda_0$$
$$P_{5994} = P_{5994} \oplus \lambda_0$$

Step 3) Regarding the next L−1 number of information word bits (m=1, 2, ..., L−1), $\lambda_m$ is accumulated in parity bits address calculated based on Equation 13 presented below:

$$(\chi+m\times Q_1) \bmod M_1 \text{ (if } \chi<M_1)$$
$$M_1+\{(\chi-M_1+m\times Q_2) \bmod M_2\} \text{(if } \chi\geq M_1) \quad (13)$$

Here, x is an address of a parity bit accumulator corresponding to the $0^{th}$ information word bit $\lambda_0$.

In addition, $Q_1=M_1/L$ and $Q_2=M_2/L$. In addition, since the length N of the LDPC codeword is 16200 and the code rate is 5/15 in Table 14, $M_1=720$, $M_2=10080$, $Q_1=2$, $Q_2=28$, and L=360 with reference to Table 13.

Accordingly, an operation as shown in Equation 14 presented below may be performed for the $1^{st}$ information word bit $\lambda_1$;

$$P_{71} = P_{71} \oplus \lambda_1 \quad P_{6094} = P_{6094} \oplus \lambda_1 \quad (14)$$
$$P_{246} = P_{246} \oplus \lambda_1 \quad P_{6791} = P_{6791} \oplus \lambda_1$$
$$P_{708} = P_{708} \oplus \lambda_1 \quad P_{6843} = P_{6843} \oplus \lambda_1$$
$$P_{5173} = P_{5173} \oplus \lambda_1 \quad P_{8537} = P_{8537} \oplus \lambda_1$$
$$P_{6022} = P_{6022} \oplus \lambda_1$$

Step 4) Since the same addresses of parity bits as in the second row (that is the row of i=1) of Table 14 are given with respect to the $L^{th}$ information word bit $\lambda_L$, in a similar method to the above-described method, addresses of parity bits regarding the next L−1 number of information word bits $\lambda_m$ (m=L+1, L+2, ..., 2L−1) are calculated based on Equation 13. In this case, x is an address of a parity bit accumulator corresponding to the information word bit $\lambda_L$, and may be obtained based on the second row of Table 14.

Step 5) The above-described processes are repeated for L number of new information word bits of each bit group by considering new rows of Table 14 as addresses of the parity bit accumulator.

Step 6) After the above-described processes are repeated for the codeword bits $\lambda_0$ to $\lambda_{K-1}$, values regarding Equation 15 presented below are calculated in sequence from i=1:

$$P_i=P_i\oplus P_{i-1}(i=1,2,\ldots,M_1-1) \quad (15)$$

Step 7) Parity bits $\lambda_K$ to $\lambda_{K+M_1-1}$ corresponding to the matrix B having the dual diagonal configuration are calculated based on Equation 16 presented below:

$$\lambda_{K+L\times t+s}=p_{Q_1\times s+t}(0\leq s<L, 0\leq t>Q_1) \quad (16)$$

Step 8) Addresses of a parity bit accumulator regarding L number of new codeword bits $\lambda_K$ to $\lambda_{K+M_1-1}$ of each group are calculated based on Table 14 and Equation 13.

Step 9) After the codeword bits $\lambda_K$ to $\lambda_{K+M_1-1}$ are calculated, parity bits $\lambda_{K+M_1}$ to $\lambda_{K+M_1+M_2-1}$ corresponding to the matrix C having the diagonal configuration are calculated based on Equation 17 presented below:

$$\lambda_{K+M_1+L\times t+s}=p_{M_1+Q_2\times s+t}(0\leq s<L, 0t\leq Q_2) \quad (17)$$

The encoder 110 may calculate parity bits according to the above-described method.

Referring back to FIG. 19, the encoder 110 may perform LDPC encoding by using various code rates such as 3/15, 4/15, 5/15, 6/15, 7/15, 8/15, 9/15, 10/15, 11/15, 12/15, 13/15, etc. In addition, the encoder 110 may generate an LDPC codeword having various lengths such as 16200, 64800, etc., based on a length of information word bits and the code rate.

In this case, the encoder 110 may perform the LDPC encoding by using a parity check matrix, and the parity check matrix is configured as shown in FIGS. 20 to 22.

In addition, the encoder 110 may perform Bose, Chaudhuri, Hocquenghem (BCH) encoding as well as LDPC encoding. To achieve this, the encoder 110 may further include a BCH encoder (not shown) to perform BCH encoding.

In this case, the encoder 110 may perform encoding in an order of BCH encoding and LDPC encoding. The encoder 110 may add BCH parity bits to input bits by performing BCH encoding and LDPC-encodes the information word bits including the input bits and the BCH parity bits, thereby generating an LDPC codeword.

The interleaver 120 interleaves the LDPC codeword. That is, the interleaver 120 receives the LDPC codeword from the encoder 110, and interleaves the LDPC codeword based on various interleaving rules.

In particular, the interleaver 120 may interleave the LDPC codeword such that a bit included in a predetermined bit group from among a plurality of bit groups constituting the LDPC codeword (that is, a plurality of groups or a plurality of blocks) is mapped onto a predetermined bit of a modulation symbol. Accordingly, the modulator 130 may map a bit included in a predetermined group from among the plurality of groups of the LDPC codeword onto a predetermined bit of a modulation symbol.

Figure 23:
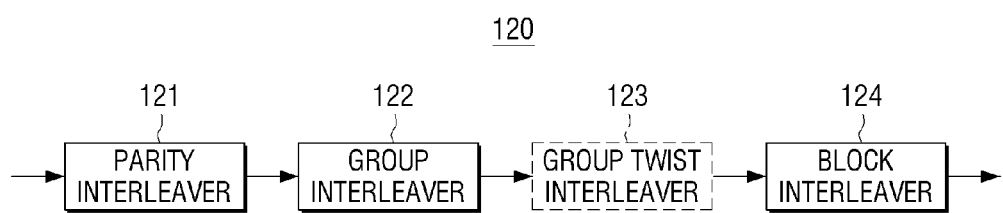
FIG. 23 is a block diagram to illustrate a configuration of an interleaver, according to an exemplary embodiment.

To achieve this, as shown in FIG. 23, the interleaver 120 may include a parity interleaver 121, a group interleaver (or a group-wise interleaver 122), a group twist interleaver 123 and a block interleaver 124.

The parity interleaver 121 interleaves the parity bits constituting the LDPC codeword.

When the LDPC codeword is generated based on the parity check matrix 200 having the configuration of FIG. 20, the parity interleaver 121 may interleave only the parity bits of the LDPC codeword by using Equations 18 presented below:

$$u_i = c_i \text{ for } 0 \le i < K_{ldpc}, \text{ and}$$

$$u_{K_{ldpc}+M \cdot t+s} = c_{K_{ldpc}+Q_{ldpc} \cdot s+t} \text{ for } 0 \le s < M, 0 \le t < Q_{ldpc} \quad (18),$$

where M is an interval at which a pattern of a column group is repeated in the information word submatrix 210, that is, the number of columns included in a column group (for example, M=360), and $Q_{ldpc}$ is a size by which each column is cyclic-shifted in the information word submatrix 210. That is, the parity interleaver 121 performs parity interleaving with respect to the LDPC codeword $c = (c_0, c_1, \ldots, c_{N_{ldpc}-1})$, and outputs $U = (u_0, u_1, \ldots, u_{N_{ldpc}-1})$.

The LDPC codeword of which parities are interleaved in the above-described method may be configured such that a predetermined number of continuous bits of the LDPC codeword have similar decoding characteristics (cycle characteristics or cycle distribution, a degree of a column, etc.).

For example, the LDPC codeword may have same characteristics on the basis of M number of continuous bits. Here, M is an interval at which a pattern of a column group is repeated in the information word submatrix 210 and, for example, may be 360.

A product of the LDPC codeword bits and the parity check matrix should be "0". This means that a sum of products of the $i^{th}$ LDPC codeword bit, $c_i$ (i=0, 1, ..., $N_{ldpc}-1$) and the $i^{th}$ column of the parity check matrix should be a "0" vector. Accordingly, the $i^{th}$ LDPC codeword bit may be regarded as corresponding to the $i^{th}$ column of the parity check matrix.

In the case of the parity check matrix 200 of FIG. 20, M number of columns in the information word submatrix 210 belong to a same group and the information word submatrix 210 has same characteristics on the basis of a column group (for example, columns belonging to a same column group have a same column degree distribution and same cycle characteristics or a same cycle distribution).

In this case, since M number of continuous bits in the information word bits correspond to the same column group of the information word submatrix 210, the information word bits may be formed of M number of continuous bits having a same codeword characteristics. When the parity bits of the LDPC codeword are interleaved by the parity interleaver 121, the parity bits of the LDPC codeword may be formed of M number of continuous bits having same codeword characteristics.

However, regarding the LDPC codeword encoded based on the parity check matrix 300 of FIG. 21 and the parity check matrix 400 of FIG. 22, parity interleaving may not be performed. In this case, the parity interleaver 121 may be omitted.

The group interleaver 122 may divide the parity-interleaved LDPC codeword into a plurality of bit groups (or blocks) and rearrange the order of the plurality of bit groups in bit group wise (or bit group unit). That is, the group interleaver 122 may interleave the plurality of bit groups in bit group wise.

When the parity interleaver 121 is omitted depending on cases, the group interleaver 122 may divide the LDPC codeword into a plurality of bit groups and rearrange an order of the bit groups in bit group wise.

The group interleaver 122 divides the parity-interleaved LDPC codeword into a plurality of bit groups by using Equation 19 or Equation 20 presented below.

$$X_j = \left\{ u_k \mid j = \left\lfloor \frac{k}{360} \right\rfloor, 0 \le k < N_{ldpc} \right\} \text{ for } 0 \le j < N_{group} \quad (19)$$

$$X_j = \{u_k \mid 360 \times j \le k < 360 \times (j+1), 0 \le k < N_{ldpc}\} \text{ for } \quad (20)$$
$$0 \le j < N_{group}$$

where $N_{group}$ is the total number of bit groups, $X_j$ is the $j^{th}$ bit group, and $u_k$ is the $k^{th}$ LDPC codeword bit input to the group interleaver 122. In addition, is the largest integer which is smaller than or equal to k/360.

$$\left\lfloor \frac{k}{360} \right\rfloor$$

Since 360 in these equations indicates an example of the interval M at which the pattern of a column group is repeated in the information word submatrix, 360 in these equations can be changed to M.

Figure 24:
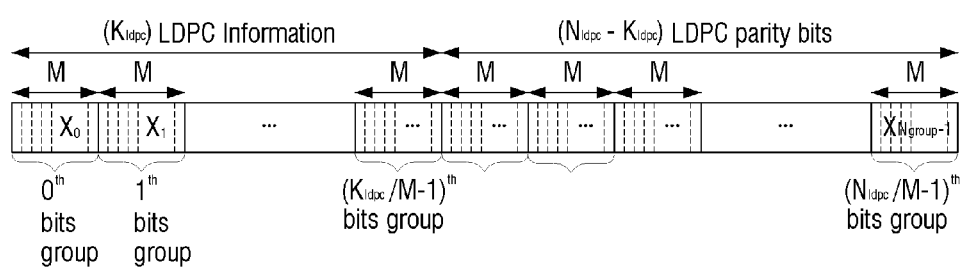
FIGS. 24 to 26 are views to illustrate an interleaving method, according to exemplary embodiments.

The LDPC codeword which is divided into the plurality of bit groups may be as shown in FIG. 24.

Referring to FIG. 24, the LDPC codeword is divided into the plurality of bit groups and each bit group is formed of M number of continuous bits. When M is 360, each of the plurality of bit groups may be formed of 360 bits. Accordingly, the bit groups may be formed of bits corresponding to column groups of a parity check matrix.

Since the LDPC codeword is divided by M number of continuous bits, $K_{ldpc}$ number of information word bits are divided into ($K_{ldpc}$/M) number of bit groups and $N_{ldpc}-K_{ldpc}$ number of parity bits are divided into ($N_{ldpc}-K_{ldpc}$)/M number of bit groups. Accordingly, the LDPC codeword may be divided into ($N_{ldpc}$/M) number of bit groups in total.

For example, when M=360 and the length $N_{ldpc}$ of the LDPC codeword is 16200, the number of groups $N_{groups}$ constituting the LDPC codeword is 45(=16200/360), and, when M=360 and the length $N_{ldpc}$ of the LDPC codeword is 64800, the number of bit groups $N_{group}$ constituting the LDPC codeword is 180(=64800/360).

As described above, the group interleaver 122 divides the LDPC codeword such that M number of continuous bits are included in a same group since the LDPC codeword has the same codeword characteristics on the basis of M number of continuous bits. Accordingly, when the LDPC codeword is grouped by M number of continuous bits, the bits having the same codeword characteristics belong to the same group.

In the above-described example, the number of bits constituting each bit group is M. However, this is merely an example and the number of bits constituting each bit group is variable.

For example, the number of bits constituting each bit group may be an aliquot part of M. That is, the number of bits constituting each bit group may be an aliquot part of the number of columns constituting a column group of the information word submatrix of the parity check matrix. In this case, each bit group may be formed of aliquot part of M number of bits. For example, when the number of columns constituting a column group of the information word submatrix is 360, that is, M=360, the group interleaver 122 may divide the LDPC codeword into a plurality of bit groups such that the number of bits constituting each bit group is one of the aliquot parts of 360.

In the following explanation, the number of bits constituting a bit group is M as an example, for the convenience of explanation.

Thereafter, the group interleaver 122 interleaves the LDPC codeword in bit group wise. The group interleaver 122 may group the LDPC codeword into the plurality of bit groups and rearrange the plurality of bit groups in bit group wise. That is, the group interleaver 122 changes positions of the plurality of bit groups constituting the LDPC codeword and rearranges the order of the plurality of bit groups constituting the LDPC codeword in bit group wise.

Here, the group interleaver 122 may rearrange the order of the plurality of bit groups in bit group wise such that bit groups respectively including bits mapped onto a same modulation symbol from among the plurality of bit groups are spaced apart from one another at a predetermined interval.

In this case, the group interleaver 122 may rearrange the order of the plurality of bit groups (or blocks) in bit group wise by considering at least one of the number of rows and columns of the block interleaver 124, the number of bit groups of the LDPC codeword, and the number of bits included in each bit group so that bit groups respectively including bits mapped onto a same modulation symbol are spaced apart from one another at a predetermined interval.

To achieve this, the group interleaver 122 may rearrange the order of the plurality of bit groups in bit group wise by using Equation 21 presented below:

$$Y_j = X_{\pi(0)})(0 \leq j < N_{group})  \quad (21),$$

where $X_j$ is the $j^{th}$ bit group before group interleaving, and $Y_j$ is the $j^{th}$ bit group (or block) after group interleaving. In addition, π(j) is a parameter indicating an interleaving order and is determined based on at least one of a length of an LDPC codeword, a modulation method, and a code rate. That is, π(j) denotes a permutation order for group wise interleaving.

Accordingly, $X_{\pi(0)}$ is a π(j)$^{th}$ bit group (or block) before group interleaving, and Equation 21 means that the π(j)$^{th}$ bit group before the group interleaving becomes the $j^{th}$ bit group after the group interleaving.

According to an exemplary embodiment, an example of π(j) may be defined as in Tables 15 to 27 presented below.

In this case, π(j) is defined according to a length of an LPDC codeword and a code rate, and a parity check matrix is also defined according to a length of an LDPC codeword and a code rate. Accordingly, when LDPC encoding is performed based on a specific parity check matrix according to a length of an LDPC codeword and a code rate, the LDPC codeword may be interleaved in bit group wise based on π(j) satisfying the same length of the LDPC codeword and code rate.

For example, when the encoder 110 performs LDPC encoding at a code rate of 5/15 to generate an LDPC codeword of a length of 16200, the group interleaver 122 may perform interleaving by using π(j) which is defined according to the length of the LDPC codeword of 16200 and the code rate of 5/15 in Tables 15 to 27 presented below.

For example, when the length of the LDPC codeword is 16200, the code rate is 5/15, and the modulation method (or modulation format) is 256-Quadrature Amplitude Modulation (QAM), π(j) may be defined as in Table 15 presented below. In particular, Table 15 may be applied when LDPC encoding is performed based on the parity check matrix defined by Table 14.

TABLE 15

Order of bits group to be block interleaved
$\pi(j)$ (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 4 | 23 | 3 | 6 | 18 | 5 | 0 | 2 | 7 | 26 | 21 | 27 | 39 | 42 | 38 | 31 | 1 | 34 | 20 | 37 | 40 | 24 | 43 |
| | 25 | 33 | 9 | 22 | 36 | 30 | 35 | 11 | 10 | 17 | 32 | 13 | 12 | 41 | 15 | 14 | 19 | 16 | 8 | 44 | 29 | 28 | |

In the case of Table 15, Equation 21 may be expressed as $Y_0 = X_{\pi(0)} = X_4$, $Y_1 = X_{\pi(1)} = X_{23}$, $Y_2 = X_{\pi(2)} = X_3$, ..., $Y_{43} = X_{\pi(43)} = X_{29}$, $Y_{44} = X_{\pi(44)} = X_{28}$. Accordingly, the group interleaver 122 may rearrange the order of the plurality of bit groups in bit group wise by changing the 4$^{th}$ bit group (or block) to the 0$^{th}$ bit group, the 23$^{rd}$ bit group to the 1$^{st}$ bit group, the 3$^{rd}$ bit group to the 2$^{nd}$ bit group, ..., the 29$^{th}$ bit group to the 43$^{rd}$ bit group, and the 28$^{th}$ bit group to the 44$^{th}$ bit group. Herein, the changing the Ath bit group to the Bth bit group means rearranging the order of bit groups so that the Ath bit group is to be the Bth bit group.

In another example, when the length of the LDPC codeword is 16200, the code rate is 7/15, and the modulation method is 256-QAM, $\pi(j)$ may be defined as in Table 16 presented below. In particular, Table 16 may be applied when LDPC encoding is performed based on the parity check matrix defined by Table 5.

In the case of Table 17, Equation 21 may be expressed as $Y_0 = X_{\pi(0)} = X_5$, $Y_1 = X_{\pi(1)} = X_7$, $Y_2 = X_{\pi(2)} = X_9$, ..., $Y_{43} = X_{\pi(43)} = X_{38}$, $Y_{44} = X_{\pi(44)} = X_{44}$. Accordingly, the group interleaver 122 may rearrange the order of the plurality of bit groups in bit group wise by changing the 5$^{th}$ bit group to the 0$^{th}$ bit group, the 7$^{th}$ bit group to the 1$^{st}$ bit group, the 9$^{th}$ bit group to the 2$^{nd}$ bit group, ..., the 38$^{th}$ bit group to the 43$^{rd}$ bit group, and the 44$^{th}$ bit group to the 44$^{th}$ bit group.

In another example, when the length of the LDPC codeword is 16200, the code rate is 11/15, and the modulation method is 256-QAM, $\pi(j)$ may be defined as in Table 18 presented below. In particular, Table 18 may be applied when LDPC encoding is performed based on the parity check matrix defined by Table 9.

TABLE 16

Order of bits group to be block interleaved
$\pi(j)$ (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 13 | 16 | 4 | 12 | 44 | 15 | 8 | 14 | 0 | 3 | 30 | 20 | 35 | 21 | 10 | 6 | 19 | 17 | 26 | 39 | 7 | 24 | 9 |
| | 27 | 5 | 37 | 23 | 32 | 40 | 31 | 38 | 42 | 34 | 25 | 36 | 2 | 22 | 43 | 33 | 28 | 1 | 18 | 11 | 41 | 29 | |

In the case of Table 16, Equation 21 may be expressed as $Y_0 = X_{\pi(0)} = X_{13}$, $Y_1 = X_{\pi(1)} = X_{16}$, $Y_2 = X_{\pi(2)} = X_4$, ..., $Y_{43} = X_{\pi(43)} = X_{41}$, $Y_{44} = X_{\pi(44)} = X_{29}$. Accordingly, the group interleaver 122 may rearrange the order of the plurality of bit groups in bit group wise by changing the 13$^{th}$ bit group to the 0$^{th}$ bit group, the 16$^{th}$ bit group to the 1$^{st}$ bit group, the 4$^{th}$ bit group to the 2$^{nd}$ bit group, ..., the 41$^{st}$ bit group to the 43$^{rd}$ bit group, and the 29$^{th}$ bit group to the 44$^{th}$ bit group.

In another example, when the length of the LDPC codeword is 16200, the code rate is 9/15, and the modulation method is 256-QAM, $\pi(j)$ may be defined as in Table 17 presented below. In particular, Table 17 may be applied when LDPC encoding is performed based on the parity check matrix defined by Table 7.

TABLE 17

Order of bits group to be block interleaved
$\pi(j)$ (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 5 | 7 | 9 | 22 | 10 | 12 | 3 | 43 | 6 | 4 | 24 | 13 | 14 | 11 | 15 | 18 | 19 | 17 | 16 | 41 | 25 | 26 | 20 |
| | 23 | 21 | 33 | 31 | 28 | 39 | 36 | 30 | 37 | 27 | 32 | 34 | 35 | 29 | 2 | 42 | 0 | 1 | 8 | 40 | 38 | 44 | |

TABLE 18

| | Order of bits group to be block interleaved $\pi(j)$ $(0 \leq j < 45)$ | | | | | | | | | | | | | | | | | | | | | | |
|---|---|---|---|---|---|---|---|---|---|---|---|---|---|---|---|---|---|---|---|---|---|---|---|
| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 25 | 13 | 4 | 5 | 31 | 20 | 2 | 8 | 10 | 22 | 17 | 24 | 19 | 23 | 28 | 18 | 29 | 27 | 26 | 9 | 16 | 21 | 7 |
| | 11 | 14 | 44 | 34 | 33 | 12 | 35 | 43 | 6 | 42 | 41 | 3 | 1 | 38 | 40 | 39 | 37 | 0 | 30 | 32 | 15 | 36 | |

In the case of Table 18, Equation 21 may be expressed as $Y_0=X_{\pi(0)}=X_{25}$, $Y_1=X_{\pi(1)}=X_{13}$, $Y_2=X_{\pi(2)}=X_4$, ..., $Y_{43}=X_{\pi(43)}=X_{15}$, $Y_{44}=X_{\pi(44)}=X_{36}$. Accordingly, the group interleaver 122 may rearrange the order of the plurality of bit groups in bit group wise by changing the 25$^{th}$ bit group to the 0$^{th}$ bit group, the 13$^{st}$ bit group to the 1$^{st}$ bit group, the 4$^{th}$ bit group to the 2$^{nd}$ bit group, ..., the 15$^{th}$ bit group to the 43$^{rd}$ bit group, and the 36$^{th}$ bit group to the 44$^{th}$ bit group.

In another example, when the length of the LDPC codeword is 16200, the code rate is 13/15, and the modulation method is 256-QAM, $\pi(j)$ may be defined as in Table 19 presented below. In particular, Table 19 may be applied when LDPC encoding is performed based on the parity check matrix defined by Table 11.

TABLE 19

| | Order of bits group to be block interleaved $\pi(j)$ $(0 \leq j < 45)$ | | | | | | | | | | | | | | | | | | | | | | |
|---|---|---|---|---|---|---|---|---|---|---|---|---|---|---|---|---|---|---|---|---|---|---|---|
| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 9 | 13 | 10 | 7 | 11 | 6 | 1 | 14 | 12 | 8 | 21 | 15 | 4 | 36 | 25 | 30 | 24 | 28 | 29 | 20 | 27 | 5 | 18 |
| | 17 | 22 | 33 | 0 | 16 | 23 | 31 | 42 | 3 | 40 | 39 | 41 | 43 | 37 | 44 | 26 | 2 | 19 | 38 | 32 | 35 | 34 | |

In the case of Table 19, Equation 21 may be expressed as $Y_0=X_{\pi(0)}=X_9$, $Y_1=X_{\pi(1)}=X_{13}$, $Y_2=X_{\pi(2)}=X_{10}$, ..., $Y_{43}=X_{\pi(43)}=X_{35}$, $Y_{44}=X_{\pi(44)}=X_{34}$. Accordingly, the group interleaver 122 may rearrange the order of the plurality of bit groups in bit group wise by changing the 9$^{th}$ bit group to the 0$^{th}$ bit group, the 13$^{th}$ bit group to the 1$^{st}$ bit group, the 10$^{th}$ bit group to the 2$^{nd}$ bit group, ..., the 35$^{th}$ bit group to the 43$^{rd}$ bit group, and the 34$^{th}$ bit group to the 44$^{th}$ bit group.

In another example, when the length of the LDPC codeword is 16200, the code rate is 5/15, and the modulation method is 256-QAM, $\pi(j)$ may be defined as in Table 20 presented below. In particular, Table 20 may be applied when LDPC encoding is performed based on the parity check matrix defined by Table 4.

In the case of Table 20, Equation 21 may be expressed as $Y_0=X_{\pi(0)}=X_8$, $Y_1=X_{\pi(1)}=X_9$, $Y_2=X_{\pi(2)}=X_0$, ..., $Y_{43}=X_{\pi(43)}=X_{31}$, $Y_{44}=X_{\pi(44)}=X_{40}$. Accordingly, the group interleaver 122 may rearrange the order of the plurality of bit groups in bit group wise by changing the 8$^{th}$ bit group to the 0$^{th}$ bit group, the 9$^{th}$ bit group to the 1$^{st}$ bit group, the 0$^{th}$ bit group to the 2$^{nd}$ bit group, ..., the 30 bit group to the 43$^{rd}$ bit group, and the 40$^{th}$ bit group to the 44$^{th}$ bit group.

In another example, when the length of the LDPC codeword is 16200, the code rate is 7/15, and the modulation method is 256-QAM, $\pi(j)$ may be defined as in Table 21 presented below. In particular, Table 21 may be applied when LDPC encoding is performed based on the parity check matrix defined by Table 6.

TABLE 20

| | Order of bits group to be block interleaved $\pi(j)$ $(0 \leq j < 45)$ | | | | | | | | | | | | | | | | | | | | | | |
|---|---|---|---|---|---|---|---|---|---|---|---|---|---|---|---|---|---|---|---|---|---|---|---|
| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 8 | 9 | 0 | 7 | 4 | 10 | 12 | 14 | 1 | 13 | 16 | 11 | 3 | 6 | 42 | 28 | 35 | 21 | 32 | 20 | 29 | 39 | 22 |
| | 37 | 17 | 18 | 25 | 34 | 24 | 43 | 30 | 27 | 33 | 23 | 15 | 44 | 19 | 36 | 41 | 2 | 5 | 26 | 38 | 31 | 40 | |

TABLE 21

Order of bits group to be block interleaved
$\pi(j)$ (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
|  | 23 | 24 | 25 | 26 | 27 | 28 | 29 | 30 | 31 | 32 | 33 | 34 | 35 | 36 | 37 | 38 | 39 | 40 | 41 | 42 | 43 | 44 |  |
| $\pi(j)$-th block of Group-wise interleaver input | 9 | 8 | 4 | 0 | 14 | 1 | 28 | 18 | 17 | 20 | 11 | 13 | 5 | 15 | 10 | 16 | 33 | 41 | 38 | 21 | 7 | 32 | 6 |
|  | 24 | 36 | 31 | 37 | 43 | 22 | 26 | 27 | 35 | 44 | 25 | 34 | 29 | 23 | 30 | 3 | 39 | 2 | 12 | 19 | 42 | 40 |  |

In the case of Table 21, Equation 21 may be expressed as $Y_0=X_{\pi(0)}=X_9$, $Y_1=X_{\pi(1)}=X_8$, $Y_2=X_{\pi(2)}=X_4$, ..., $Y_{43}=X_{\pi(43)}=X_{42}$, $Y_{44}=X_{\pi(44)}=X_{40}$. Accordingly, the group interleaver 122 may rearrange the order of the plurality of bit groups in bit group wise by changing the $9^{th}$ bit group to the $0^{th}$ bit group, the $8^{th}$ bit group to the $1^{st}$ bit group, the $4^{th}$ bit group to the $2^{nd}$ bit group, ..., the $42^{nd}$ bit group to the $43^{rd}$ bit group, and the $40^{th}$ bit group to the $44^{th}$ bit group.

In another example, when the length of the LDPC codeword is 16200, the code rate is 9/15, and the modulation method is 256-QAM, $\pi(j)$ may be defined as in Table 22 presented below. In particular, Table 22 may be applied when LDPC encoding is performed based on the parity check matrix defined by Table 8.

TABLE 22

Order of bits group to be block interleaved
$\pi(j)$ (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
|  | 23 | 24 | 25 | 26 | 27 | 28 | 29 | 30 | 31 | 32 | 33 | 34 | 35 | 36 | 37 | 38 | 39 | 40 | 41 | 42 | 43 | 44 |  |
| $\pi(j)$-th block of Group-wise interleaver input | 14 | 4 | 9 | 8 | 0 | 18 | 28 | 20 | 1 | 17 | 13 | 5 | 11 | 15 | 10 | 21 | 41 | 16 | 38 | 33 | 24 | 7 | 6 |
|  | 32 | 36 | 37 | 31 | 22 | 26 | 43 | 44 | 34 | 27 | 35 | 25 | 30 | 23 | 3 | 29 | 39 | 2 | 12 | 19 | 42 | 40 |  |

In the case of Table 22, Equation 21 may be expressed as $Y_0=X_{\pi(0)}=X_{14}$, $Y_1=X_{\pi(1)}=X_4$, $Y_2=X_{\pi(2)}=X_9$, ..., $Y_{43}=X_{\pi(43)}=X_{42}$, $Y_{44}=X_{\pi(44)}=X_{40}$. Accordingly, the group interleaver 122 may rearrange the order of the plurality of bit groups in bit group wise by changing the $14^{th}$ bit group to the $0^{th}$ bit group, the $4^{th}$ bit group to the $1^{st}$ bit group, the $9^{th}$ bit group to the $2^{nd}$ bit group, ..., the $42^{nd}$ bit group to the 43rd bit group, and the $40^{th}$ bit group to the $44^{th}$ bit group.

In another example, when the length of the LDPC codeword is 16200, the code rate is 11/15, and the modulation method is 256-QAM, $\pi(j)$ may be defined as in Table 23 presented below. In particular, Table 23 may be applied when LDPC encoding is performed based on the parity check matrix defined by Table 10.

In the case of Table 23, Equation 21 may be expressed as $Y_0=X_{\pi(0)}=X_{13}$, $Y_1=X_{\pi(1)}=X_{28}$, $Y_2=X_{\pi(2)}=X_{30}$, ..., $Y_{43}=X_{\pi(43)}=X_{31}$, $Y_{44}=X_{\pi(44)}=X_{21}$ Accordingly, the group interleaver 122 may rearrange the order of the plurality of bit groups in bit group wise by changing the $10^{th}$ bit group to the $0^{th}$ bit group, the $28^{th}$ bit group to the $1^{st}$ bit group, the 30th bit group to the $2^{nd}$ bit group, ..., the $31^{st}$ bit group to the $43^{rd}$ bit group, and the $21^{st}$ bit group to the $44^{th}$ bit group.

In another example, when the length of the LDPC codeword is 16200, the code rate is 13/15, and the modulation method is 256-QAM, $\pi(j)$ may be defined as in Table 24 presented below. In particular, Table 24 may be applied when LDPC encoding is performed 'based on the parity check matrix defined by Table 12.

TABLE 23

Order of bits group to be block interleaved
$\pi(j)$ (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
|  | 23 | 24 | 25 | 26 | 27 | 28 | 29 | 30 | 31 | 32 | 33 | 34 | 35 | 36 | 37 | 38 | 39 | 40 | 41 | 42 | 43 | 44 |  |
| $\pi(j)$-th block of Group-wise interleaver input | 10 | 28 | 30 | 8 | 9 | 14 | 16 | 15 | 0 | 13 | 27 | 18 | 22 | 17 | 20 | 5 | 29 | 25 | 41 | 26 | 3 | 2 | 34 |
|  | 6 | 4 | 38 | 40 | 35 | 7 | 24 | 43 | 19 | 33 | 23 | 39 | 11 | 36 | 42 | 44 | 37 | 1 | 12 | 32 | 31 | 21 |  |

TABLE 24

Order of bits group to be block interleaved
$\pi(j)$ ($0 \le j < 45$)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 21 | 19 | 7 | 8 | 6 | 11 | 15 | 9 | 14 | 12 | 18 | 13 | 23 | 16 | 17 | 34 | 20 | 32 | 27 | 1 | 2 | 0 | 10 |
| | 3 | 4 | 35 | 25 | 31 | 30 | 28 | 40 | 39 | 44 | 42 | 41 | 22 | 26 | 29 | 43 | 24 | 5 | 36 | 37 | 38 | 33 | |

In the case of Table 24, Equation 21 may be expressed as $Y_0=X_{\pi(0)}=X_{21}$, $Y_1=X_{\pi(1)}=X_{19}$, $Y_2=X_{\pi(2)}=X_7$, ..., $Y_{43}=X_{\pi(43)}=X_{38}$, $Y_{44}=X_{\pi(44)}=X_{33}$. Accordingly, the group interleaver 122 may rearrange the order of the plurality of bit groups in bit group wise by changing the 21$^{st}$ bit group to the 0$^{th}$ bit group, the 19$^{th}$ bit group to the 1$^{st}$ bit group, the 7$^{th}$ bit group to the 2$^{nd}$ bit group, ..., the 38$^{th}$ bit group to the 43$^{rd}$ bit group, and the 33$^{rd}$ bit group to the 44$^{th}$ bit group.

In another example, when the length of the LDPC codeword is 16200, the code rate is 11/15, and the modulation method is 256-QAM, $\pi(j)$ may be defined as in Table 25 presented below. In particular, Table 25 may be applied when LDPC encoding is performed based on the parity check matrix defined by Table 9.

TABLE 25

Order of bits group to be block interleaved
$\pi(j)$ ($0 \le j < 45$)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 20 | 16 | 5 | 0 | 31 | 1 | 2 | 26 | 10 | 23 | 13 | 24 | 34 | 22 | 28 | 30 | 29 | 25 | 8 | 9 | 27 | 21 | 12 |
| | 18 | 14 | 7 | 17 | 41 | 33 | 35 | 44 | 39 | 42 | 3 | 15 | 4 | 38 | 40 | 6 | 37 | 32 | 11 | 19 | 43 | 36 | |

In the case of Table 25, Equation 21 may be expressed as $Y_0=X_{\pi(0)}=X_{20}$, $Y_1=X_{\pi(1)}=X_{16}$, $Y_2=X_{\pi(2)}=X_5$, ..., $Y_{43}=X_{\pi(43)}=X_{43}$, $Y_{44}=X_{\pi(44)}=X_{36}$. Accordingly, the group interleaver 122 may rearrange the order of the plurality of bit groups in bit group wise by changing the 20$^{th}$ bit group to the 0$^{th}$ bit group, the 16$^{th}$ bit group to the 1$^{st}$ bit group, the 5$^{th}$ bit group to the 2$^{nd}$ bit group, ..., the 43$^{rd}$ bit group to the 43$^{rd}$ bit group, and the 36$^{th}$ bit group to the 44$^{th}$ bit group.

In another example, when the length of the LDPC codeword is 16200, the code rate is 9/15, and the modulation method is 256-QAM, $\pi(j)$ may be defined as in Table 26 presented below. In particular, Table 26 may be applied when LDPC encoding is performed based on the parity check matrix defined by Table 8.

In the case of Table 26, Equation 21 may be expressed as $Y_0=X_{\pi(0)}=X_8$, $Y_1=X_{\pi(1)}=X_4$, $Y_2=X_{\pi(2)}=X_0$, ..., $Y_{43}=X_{\pi(43)}=X_{41}$, $Y_{44}=X_{\pi(44)}=X_{39}$. Accordingly, the group interleaver 122 may rearrange the order of the plurality of bit groups in bit group wise by changing the 8$^{th}$ bit group to the 0$^{th}$ bit group, the 4$^{th}$ bit group to the 1$^{st}$ bit group, the 0$^{th}$ bit group to the 2$^{nd}$ bit group, ..., the 41$^{st}$ bit group to the 43$^{rd}$ bit group, and the 39th bit group to the 44$^{th}$ bit group.

In another example, when the length of the LDPC codeword is 16200, the code rate is 11/15, and the modulation method is 256-QAM, $\pi(j)$ may be defined as in Table 27 presented below. In particular, Table 27 may be applied when LDPC encoding is performed based on the parity check matrix defined by Table 10.

TABLE 26

Order of bits group to be block interleaved
$\pi(j)$ ($0 \le j < 45$)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| $\pi(j)$-th block of Group-wise interleaver input | 8 | 4 | 0 | 1 | 20 | 19 | 10 | 12 | 5 | 22 | 21 | 15 | 26 | 17 | 16 | 11 | 28 | 6 | 42 | 13 | 25 | 33 | 18 |
| | 9 | 14 | 31 | 43 | 44 | 23 | 36 | 34 | 27 | 2 | 38 | 37 | 35 | 40 | 30 | 29 | 3 | 24 | 32 | 7 | 41 | 39 | |

TABLE 27

Order of bits group to be block interleaved
π(j) (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| π(j)-th block of Group-wise interleaver input | 28 | 30 | 10 | 32 | 9 | 1 | 24 | 15 | 0 | 2 | 12 | 27 | 14 | 17 | 22 | 29 | 41 | 25 | 11 | 26 | 4 | 21 | 6 |
| | 13 | 3 | 35 | 18 | 16 | 7 | 40 | 23 | 19 | 39 | 33 | 43 | 42 | 5 | 44 | 36 | 37 | 8 | 20 | 38 | 31 | 34 | |

In the case of Table 27, Equation 21 may be expressed as $Y_0=X_{\pi(0)}=X_{28}$, $Y_1=X_{\pi(1)}=X_{30}$, $Y_2=X_{\pi(2)}=X_{10}$, ..., $Y_{43}=X_{\pi(43)}=X_{31}$, $Y_{44}=X_{\pi(44)}=X_{34}$. Accordingly, the group interleaver 122 may rearrange the order of the plurality of bit groups in bit group wise by changing the $28^{th}$ bit group to the $0^{th}$ bit group, the $30^{th}$ bit group to the $1^{st}$ bit group, the $10^{th}$ bit group to the $2^{nd}$ bit group, ..., the 30 bit group to the $43^{rd}$ bit group, and the $34^{th}$ bit group to the $44^{th}$ bit group.

In the above-described examples, the length of the LDPC codeword is 16200 and the code rate is 5/15, 7/15, 9/15, 11/15 and 13/15. However, they are merely examples and the interleaving pattern may be defined differently when the length of the LDPC codeword is 64800 or the code rate has different values.

As described above, the group interleaver 122 may rearrange the order of the plurality of bit groups in bit group wise by using Equation 21 and Tables 15 to 27.

The "j-th block of Group-wise Interleaver output" in Tables 15 to 27 indicates the $j^{th}$ bit group output from the group interleaver 122 after interleaving, i.e., group interleaving, and the "π(j)-th block of Group-wise Interleaver input" indicates the $\pi(j)^{th}$ bit group input to the group interleaver 122.

In addition, since the order of the bit groups constituting the LDPC codeword is rearranged by the group interleaver 122 in bit group wise, and then the bit groups are block-interleaved by the block interleaver 124, which will be described below, the "Order of bit groups to be block interleaved" is set forth in Tables 15 to 27 in relation to π(j).

Figure 25:
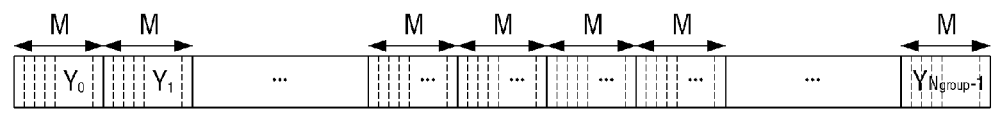

The LDPC codeword which is group-interleaved in the above-described method is illustrated in FIG. 25. Comparing the LDPC codeword of FIG. 25 and the LDPC codeword of FIG. 24 before group interleaving, it can be seen that the order of the plurality of bit groups constituting the LDPC codeword is rearranged.

That is, as shown in FIGS. 24 and 25, the groups of the LDPC codeword are arranged in order of bit group $X_0$, bit group $X_1$, ..., bit group $X_{Ngroup-1}$ before being group-interleaved, and are arranged in an order of bit group $Y_0$, bit group $Y_1$, ..., bit group $Y_{Ngroup-1}$ after being group-interleaved. In this case, the order of arranging the bit groups by the group interleaving may be determined based on Tables 15 to 27.

The group twist interleaver 123 interleaves bits in a same group. That is, the group twist interleaver 123 may rearrange an order of bits in a same bit group by changing the order of the bits in the same bit group.

In this case, the group twist interleaver 123 may rearrange the order of the bits in the same bit group by cyclic-shifting a predetermined number of bits from among the bits in the same bit group.

Figure 26:
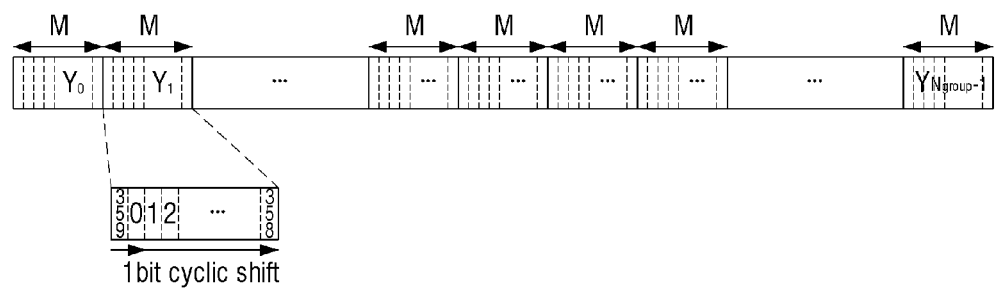

For example, as shown in FIG. 26, the group twist interleaver 123 may cyclic-shift bits included in a bit group $Y_1$ to the right by 1 bit. In this case, bits located in the $0^{th}$ position, the $1^{st}$ position, the $2^{nd}$ position, ..., the $358^{th}$ position, and the $359^{th}$ position in the bit group $Y_1$ as shown in FIG. 26 are cyclic-shifted to the right by 1 bit. As a result, the bit located in the $359^{th}$ position before being cyclic-shifted is located in the front of the bit group $Y_1$ and the bits located in the $0^{th}$ position, the $1^{st}$ position, the $2^{nd}$ position, ..., the $358^{th}$ position before being cyclic-shifted are shifted to the right serially by 1 bit and located.

In addition, the group twist interleaver 123 may rearrange the order of bits in each bit group by cyclic-shifting by a different number of bits in each bit group.

For example, the group twist interleaver 123 may cyclic-shift the bits included in the bit group $Y_1$ to the right by 1 bit, and may cyclic-shift the bits included in the bit group $Y_2$ to the right by 3 bits.

However, the above-described group twist interleaver 123 may be omitted according to circumstances.

In addition, the group twist interleaver 123 is placed after the group interleaver 122 in the above-described example. However, this is merely an example. That is, the group twist interleaver 123 changes only the order of bits in at least one bit group and does not change the order of the bit groups. Therefore, the group twist interleaver 123 may be placed before the group interleaver 122.

The block interleaver 124 interleaves the plurality of bit groups the order of which has been rearranged. The block interleaver 124 may interleave the plurality of bit groups the order of which has been rearranged by the group interleaver 122 in bit group wise (or in a bit group unit). The block interleaver 124 is formed of a plurality of columns each including a plurality of rows, and may interleave by dividing the plurality of rearranged bit groups based on a modulation order determined according to a modulation method.

In this case, the block interleaver 124 may interleave the plurality of bit groups the order of which has been rearranged by the group interleaver 122 in bit group wise. The block interleaver 124 may interleave by dividing the plurality of rearranged bit groups according to a modulation order by using a first part and a second part.

The block interleaver 124 interleaves by dividing each of the plurality of columns into a first part and a second part, writing the plurality of bit groups in the plurality of columns of the first part serially in bit group wise, dividing the bits of the remaining bit groups into groups (or sub bit groups) each including a predetermined number of bits based on the number of the plurality of columns, and writing the sub bit groups in the plurality of columns of the second part serially.

Here, the number of bit groups which are interleaved in bit group wise by the block interleaver 124 may be determined by at least one of the number of rows and columns constituting the block interleaver 124, the number of bit groups, and the number of bits included in each bit group. In other words, the block interleaver 124 may determine bit groups which are to be interleaved in bit group wise considering at least one of the number of rows and columns constituting the block interleaver 124, the number of bit groups, and the number of bits included in each bit group, interleave the bit groups in bit group wise using the first part of the columns, and divide bits of the bit groups not interleaved using the first part of the columns into sub bit groups and interleave the sub bit groups. For example, the block interleaver 124 may interleave at least part of the plurality of bit groups in bit group wise using the first part of the columns, and divide bits of the remaining bit groups into sub bit groups and interleave the sub bit groups using the second part of the columns.

Meanwhile, interleaving bit groups in bit group wise means that the bits included in a same bit group are written in a same column in the present block interleaving. In other words, the block interleaver 124, in case of bit groups which are interleaved in bit group wise, may not divide bits included in a same bit group and write these bits in a same column. However, in case of bit groups which are not interleaved in bit group wise, the block interleaver 124 may divide bits in a same bit group and write these bits in different columns.

Accordingly, the number of rows constituting the first part of the columns is an integer multiple of the number of bits included in one bit group (for example, 360), and the number of rows constituting the second part of the columns may be less than the number of bits included in one bit group.

In addition, in all bit groups interleaved using the first part of the columns, bits included in a same bit group are written in a same column in the first part for interleaving, and in at least one group interleaved using the second part, bits are divided and written in at least two columns of the second part for interleaving.

The specific interleaving method will be described later.

Meanwhile, the group twist interleaver 123 changes only an order of bits in a bit group and does not change an order of bit groups by interleaving. Accordingly, the order of bit groups to be interleaved by the block interleaver 124, that is, the order of bit groups input to the block interleaver 124 may be determined by the group interleaver 122. The order of bit groups to be interleaved by the block interleaver 124 may be determined by $\pi(j)$ defined in Tables 15 to 27.

As described above, the block interleaver 124 may interleave a plurality of bit groups the order of which has been rearranged in bit group wise by using a plurality of columns each including a plurality of rows.

In this case, the block interleaver 124 may interleave an LDPC codeword by dividing a plurality of columns into at least two parts as described above. For example, the block interleaver 124 may divide each of the plurality of columns into the first part and the second part, and interleave the plurality of bit groups constituting the LDPC codeword.

In this case, the block interleaver 124 may divide each of the plurality of columns into N number of parts (N is an integer greater than or equal to 2) according to whether the number of bit groups constituting the LDPC codeword is an integer multiple of the number of columns constituting the block interleaver 124, and may perform interleaving.

If the number of bit groups constituting the LDPC codeword is an integer multiple of the number of columns constituting the block interleaver 124, the block interleaver 124 may interleave the plurality of bit groups constituting the LDPC codeword in bit group wise without dividing each of the plurality of columns into parts.

The block interleaver 124 may interleave by writing the plurality of bit groups of the LDPC codeword on each of the columns in bit group wise in a column direction, and reading each row of the plurality of columns in which the plurality of bit groups are written in bit group wise in a row direction.

In this case, the block interleaver 124 may interleave by writing bits included in a predetermined number of bit groups, which corresponds to a quotient obtained by dividing the number of bit groups of the LDPC codeword by the number of columns of the block interleaver 124, on each of the plurality of columns serially in a column direction, and reading each row of the plurality of columns in which the bits are written in a row direction.

Hereinafter, a bit group located in the $j^{th}$ position after being interleaved by the group interleaver 122 will be referred to as bit group $Y_j$.

For example, it is assumed that the block interleaver 124 is formed of C number of columns each including $R_1$ number of rows. In addition, it is assumed that the LDPC codeword is formed of $N_{group}$ number of bit groups and the number of bit groups $N_{group}$ is a multiple of C.

In this case, when the quotient obtained by dividing $N_{group}$ number of bit groups constituting the LDPC codeword by C number of columns constituting the block interleaver 124 is A ($=N_{group}/C$) (A is an integer greater than 0), the block interleaver 124 may interleave by writing A ($=N_{group}/C$) number of bit groups in the C number of columns serially in a column direction and reading the bits written in the C number of columns in a row direction.

Figure 27:
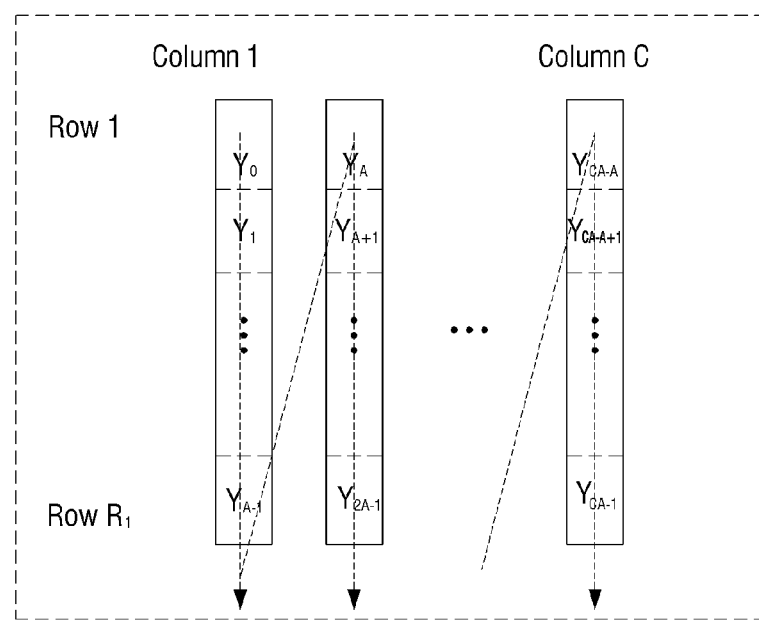
FIGS. 27 to 32 are views to illustrate an interleaving method of a block interleaver, according to exemplary embodiments.
Figure 27:
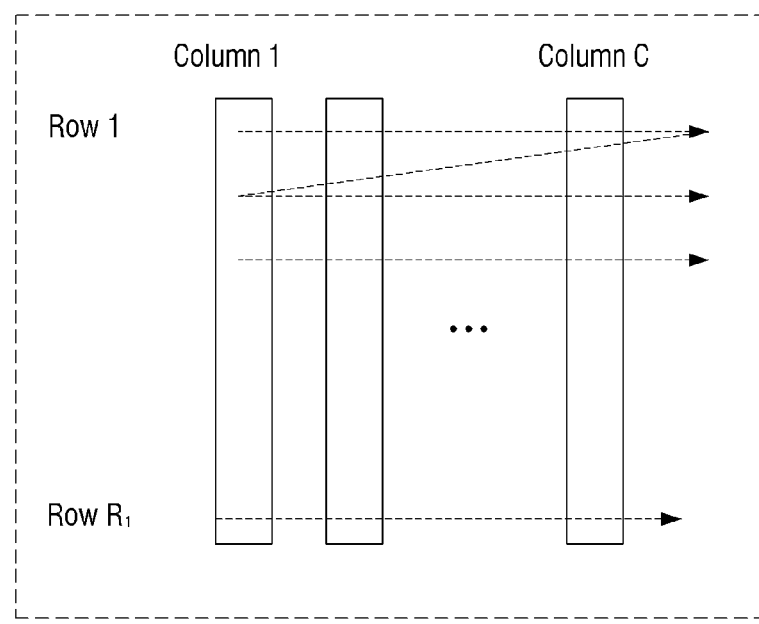

For example, as shown in FIG. 27, the block interleaver 124 writes bits included in bit group $Y_0$, bit group $Y_1, \ldots,$ bit group $Y_{A-1}$ the $1^{st}$ column from the $1^{st}$ row to the $R_1^{th}$ row, writes bits included in bit group $Y_A$, bit group $Y_{A+1}, \ldots,$ bit group $Y_{2A-1}$ in the 2nd column from the $1^{st}$ row to the $R_1^{th}$ row, $\ldots$, and writes bits included in bit group $Y_{CA-A}$, bit group $Y_{CA-A+1}, \ldots,$ bit group from $Y_{CA-1}$ in the last column from the $1^{st}$ row to the $R_1^{th}$ row. The block interleaver 124 may read the bits written in the plurality of columns in a row direction.

Accordingly, the block interleaver 124 interleaves all bit groups constituting the LDPC codeword in bit group wise.

However, when the number of bit groups of the LDPC codeword is not an integer multiple of the number of columns of the block interleaver 124, the block interleaver 124 may divide each column into two (2) parts and interleave a part of the plurality of bit groups of the LDPC codeword in bit group wise, and divide bits of the other or remaining bit groups into sub bit groups and interleave the sub bit groups. In this case, the bits included in the other bit groups, that is, the bits included in the number of groups which correspond to the remainder when the number of bit groups constituting the LDPC codeword is divided by the number of columns are not interleaved in bit group wise, but interleaved by being divided according to the number of columns.

The block interleaver 124 may interleave the LDPC codeword by dividing each of the plurality of columns into two parts.

In this case, the block interleaver 124 may divide the plurality of columns into the first part and the second part based on at least one of the number of columns of the block interleaver 124, the number of bit groups constituting the LDPC codeword, and the number of bits constituting each of the bit groups.

Here, each of the plurality of bit groups may be formed of 360 bits. In addition, the number of bit groups of the LDPC codeword is determined based on the length of the LDPC codeword and the number of bits included in the bit group. For example, when an LDPC codeword in the length of 16200 is divided such that each bit group has 360 bits, the LDPC codeword is divided into 45 bit groups. Alternatively, when an LDPC codeword in the length of 64800 is divided such that each bit group has 360 bits, the LDPC codeword may be divided into 180 bit groups. Further, the number of columns constituting the block interleaver 124 may be determined according to a modulation method. This will be explained below.

Accordingly, the number of rows constituting each of the first part and the second part may be determined based on the number of columns constituting the block interleaver 124, the number of bit groups constituting the LDPC codeword, and the number of bits constituting each of the plurality of bit groups.

In each of the plurality of columns, the first part may be formed of as many rows as the number of bits included in at least one bit group which can be written in a column in bit group wise from among the plurality of bit groups of the LDPC codeword, according to the number of columns constituting the block interleaver 124, the number of bit groups constituting the LDPC codeword, and the number of bits constituting each bit group.

In each of the plurality of columns, the second part may be formed of rows excluding as many rows as the number of bits included in each of at least some bit groups, which can be written in each of the plurality of columns in bit group wise, from among the plurality of bit groups constituting the LDPC codeword. The number rows of the second part may be the same value as a quotient when the number of bits included in all bit groups excluding bit groups corresponding to the first part is divided by the number of columns constituting the block interleaver 124. In other words, the number of rows of the second part may be the same value as a quotient when the number of bits included in the remaining bit groups which are not written in the first part from among bit groups constituting the LDPC codeword is divided by the number of columns.

That is, the block interleaver 124 may divide each of the plurality of columns into the first part including as many rows as the number of bits included in bit groups which can be written in each column in bit group wise, and the second part including the other rows.

Accordingly, the first part may be formed of as many rows as the number of bits included in each bit group, that is, as many rows as an integer multiple of M. However, since the number of codeword bits constituting each bit group may be an aliquot part of M as described above, the first part may be formed of as many rows as an integer multiple of the number of bits constituting each bit group.

In this case, the block interleaver 124 may interleave by writing and reading the LDPC codeword in the first part and the second part in the same method.

The block interleaver 124 may interleave by writing the LDPC codeword in the plurality of columns constituting each of the first part and the second part in a column direction, and reading the plurality of columns constituting the first part and the second part in which the LDPC codeword is written in a row direction.

That is, the block interleaver 124 may interleave by writing all bits included in at least some bit groups, which can be written in each of the plurality of columns in bit group wise, among the plurality of bit groups constituting the LDPC codeword, in each of the plurality of columns of the first part serially, dividing all bits included in the other bit groups and writing the divided bits in the plurality of columns of the second part in a column direction, and reading the bits written in each of the plurality of columns constituting each of the first part and the second part in a row direction.

In this case, the block interleaver 124 may interleave by dividing the other bit groups from among the plurality of bit groups constituting the LDPC codeword based on the number of columns constituting the block interleaver 124.

The block interleaver 124 may interleave by dividing the bits included in the other bit groups by the number of a plurality of columns, writing the divided bits in the plurality of columns constituting the second part in a column direction, and reading the plurality of columns constituting the second part, where the divided bits are written, in a row direction.

That is, the block interleaver 124 may divide the bits included in the other bit groups, from among the plurality of bit groups of the LDPC codeword, by the number of columns, and may write the divided bits in the second part of the plurality of columns serially in a column direction. Here, the bits included in the other bit groups are the same as the bits in the number of bit groups which correspond to the remainder generated when the number of bit groups constituting the LDPC codeword is divided by the number of columns.

For example, it is assumed that the block interleaver 124 is formed of C number of columns each including $R_1$ number of rows. In addition, it is assumed that the LDPC codeword is formed of $N_{group}$ number of bit groups, the number of bit groups $N_{group}$ is not a multiple of C, and $A \times C + 1 = N_{group}$ (A is an integer greater than 0). In other words, it is assumed that when the number of bit groups constituting the LDPC codeword is divided by the number of columns, the quotient is A and the remainder is 1.

Figure 28:
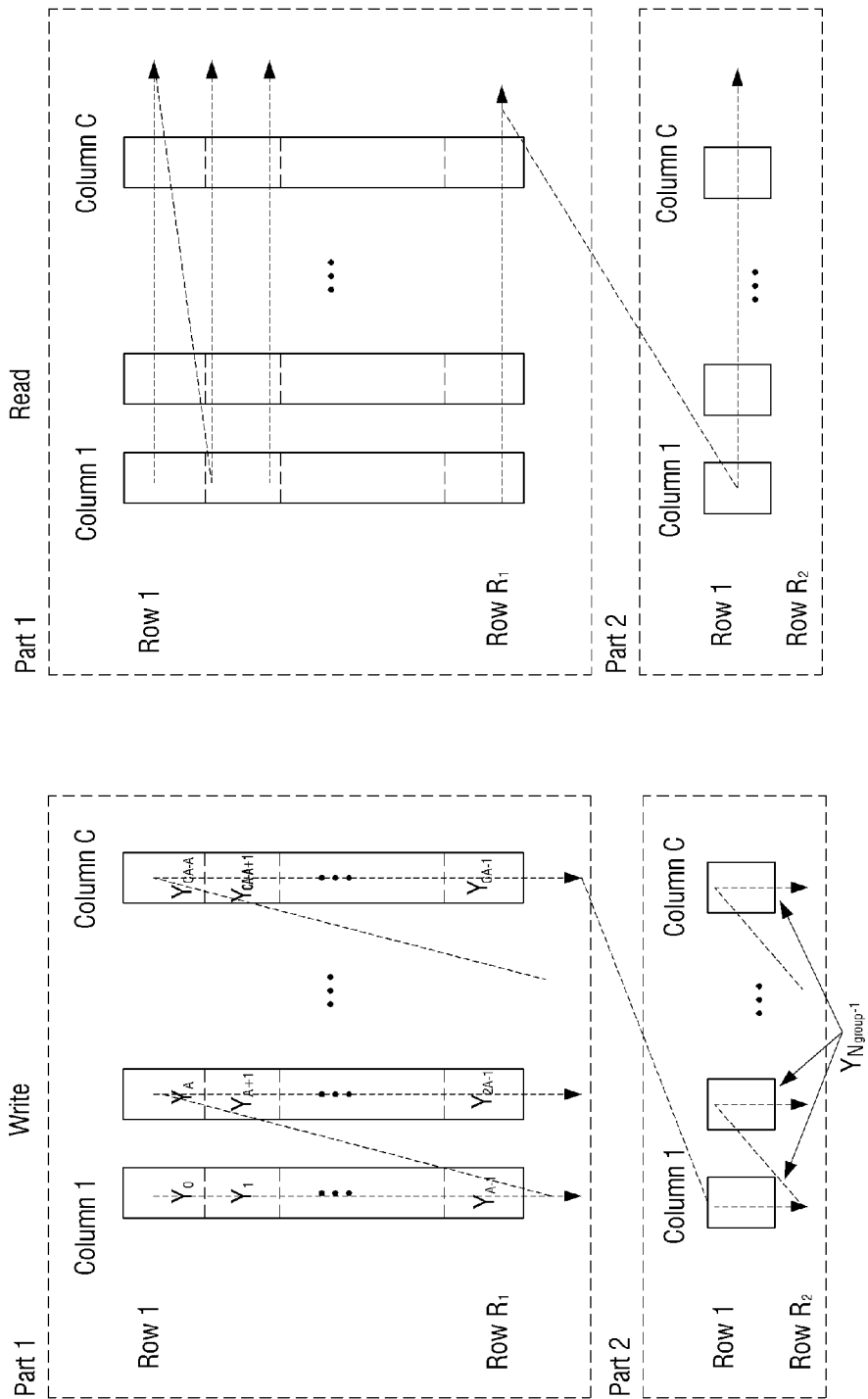
Figure 29:
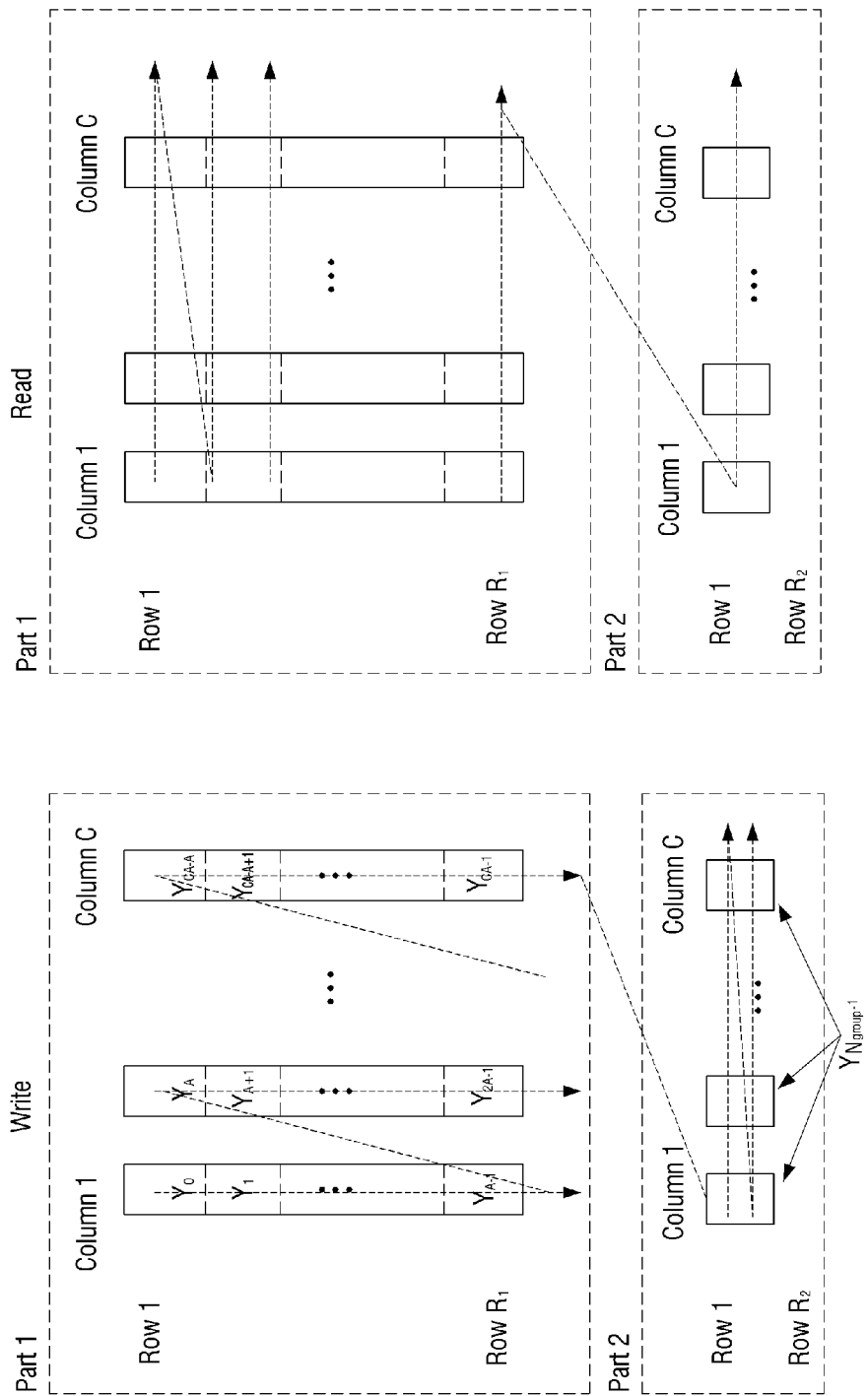

In this case, as shown in FIGS. 28 and 29, the block interleaver 124 may divide each column into a first part including $R_1$ number of rows and a second part including $R_2$ number of rows. In this case, $R_1$ may correspond to the number of bits included in bit groups which can be written in each column in bit group wise, and $R_2$ may be $R_1$ subtracted from the number of rows of each column.

That is, in the above-described example, the number of bit groups which can be written in each column in bit group wise is A, and the first part of each column may be formed of as many rows as the number of bits included in A number of bit groups, that is, may be formed of as many rows as $A \times M$ number.

In this case, the block interleaver 124 writes the bits included in the bit groups which can be written in each column in bit group wise, that is, A number of bit groups, in the first part of each column in the column direction.

That is, as shown in FIGS. 28 and 29, the block interleaver 124 writes bits included in each of bit group $Y_0$, bit group $Y_1$, ..., bit group $Y_{A-1}$ in the $1^{st}$ to $R_i^{th}$ rows of the first part of the $1^{st}$ column, writes bits included in each of bit group $Y_A$, bit group $Y_{A+1}$, ..., bit group $Y_{2A-1}$ in the $1^{st}$ to $R_1^{th}$ rows of the first part of the $2^{nd}$ column, ..., writes bits included in each of bit group $Y_{CA-A}$, bit group $Y_{CA-A+1}$, ..., bit group $Y_{CA-1}$ in the $1^{st}$ to $R_1^{th}$ rows of the first part of the last column C.

As described above, the block interleaver 124 writes the bits included in the bit groups which can be written in the first part of the plurality of columns in bit group wise.

In other words, in the above exemplary embodiment, the bits included in each of bit group $(Y_0)$, bit group $(Y_1)$, ..., bit group $(Y_{A-1})$ may not be divided and all of the bits may be written in the first column, the bits included in each of bit group $(Y_A)$, bit group $(Y_{A+1})$, ..., bit group $(Y_{2A-1})$ may not be divided and all of the bits may be written in the second column, ..., and the bits included in each of bit group $(Y_{CA-A})$, bit group $(Y_{CA-A+1})$, ..., group $(Y_{CA-1})$ may not be divided and all of the bits may be written in the last column. As such, all bit groups interleaved using the first part are written such that all bits included in a same bit group are written in a same column of the first part.

Thereafter, the block interleaver 124 divides bits included in bit groups other than the bit groups written in the first part of the plurality of columns from among the plurality of bit groups, and writes the divided bits in the second part of each column in the column direction. In this case, the block interleaver 124 divides the bits included in the other bit groups such that a same number of bits are written in the second part of each column in the column direction. Here, an order of writing bits in the first part and the second part may be reversed. That is, bits may be written in the second part ahead of the first part according to an exemplary embodiment.

In the above-described example, since $A \times C+1=N_{group}$, when the bit groups constituting the LDPC codeword are written in the first part serially, the last bit group $Y_{Ngroup-1}$ of the LDPC codeword is not written in the first part and remains. Accordingly, the block interleaver 124 divides the bits included in the bit group $Y_{Ngroup-1}$ into C number of sub bit groups as shown in FIG. 28, and writes the divided bits (that is, the bits corresponding to the quotient when the bits included in the last group ($Y_{Ngroup-1}$) are divided by C) in the second part of each column serially.

The bits divided based on the number of columns may be referred to as sub bit groups. In this case, each of the sub bit groups may be written in each column of the second part. That is, the bits included in the other bit groups may be divided and may form the sub bit groups.

That is, the block interleaver 124 writes the bits in the $1^{st}$ to $R_2^{th}$ rows of the second part of the $1^{st}$ column, writes the bits in the $1^{st}$ to $R_2^{th}$ rows of the second part of the $2^{nd}$ column, . . . , and writes the bits in the $1^{st}$ to $R_2^{th}$ rows of the second part of the column C. In this case, the block interleaver 124 may write the bits in the second part of each column in the column direction as shown in FIG. 28.

That is, in the second part, bits constituting a bit group may not be written in a same column and may be written in a plurality of columns. In other words, in the above example, the last bit group ($Y_{Ngroup-1}$) is formed of M number of bits and thus, the bits included in the last bit group ($Y_{Ngroup-1}$) may be divided by M/C and written in each column. That is, the bits included in the last bit group ($Y_{Ngroup-1}$) are divided by M/C, forming M/C number of sub bit groups, and each of the sub bit groups may be written in each column of the second part.

Accordingly, in at least one bit group which is interleaved by the second part, the bits included in the at least one bit group are divided and written in at least two columns constituting the second part.

In the above-described example, the block interleaver 124 writes the bits in the second part in the column direction. However, this is merely an example. That is, the block interleaver 124 may write the bits in the plurality of columns of the second part in the row direction. In this case, however, the block interleaver 124 may write the bits in the first part still in the same method as described above, that is, in the column direction.

Referring to FIG. 29, the block interleaver 124 writes bits from the $1^{st}$ row of the second part in the $1^{st}$ column to the $1^{st}$ row of the second part in the column C, writes bits from the $2^{nd}$ row of the second part in the $1^{st}$ column to the $2^{nd}$ row of the second part in the column C, . . . , etc., and writes bits from the $R_2^{th}$ row of the second part in the $1^{st}$ column to the $R_2^{th}$ row of the second part in the column C.

On the other hand, the block interleaver 124 reads the bits written in each row of each part serially in the row direction. That is, as shown in FIGS. 28 and 29, the block interleaver 124 reads the bits written in the first part of the plurality of columns serially in the row direction, and reads the bits written in the second part of the plurality of columns serially in the row direction.

Accordingly, the block interleaver 124 may interleave a part of the plurality of bit groups constituting the LDPC codeword in bit group wise, and divide bits included the remaining bit groups and interleaved the divided bits. That is, the block interleaver 124 may interleave by writing the LDPC codeword constituting a predetermined number of bit groups from among the plurality of bit groups in the plurality of columns of the first part in bit group wise, dividing bits included the other bit groups from among the plurality of bit groups and writing the divided bits in each of the columns of the second part, and reading the plurality of columns of the first and second parts in the row direction.

As described above, the block interleaver 124 may interleave the plurality of bit groups in the methods described above with reference to FIGS. 27 to 29.

In particular, in the case of FIG. 28, the bits included in the bit group which does not belong to the first part are written in the second part in the column direction and read in the row direction. In view of this, the order of the bits included in the bit group which does not belong to the first part is rearranged. Since the bits included in the bit group which does not belong to the first part are interleaved as described above, bit error rate (BER)/frame error rate (FER) performance can be improved in comparison with a case in which such bits are not interleaved.

However, the bit group which does not belong to the first part may not be interleaved, as shown in FIG. 29. That is, since the block interleaver 124 writes the bits included in the group which does not belong to the first part in the second part and read from the second part in the same row direction, the order of the bits included in the group which does not belong to the first part is not changed and output to the modulator 130 serially. In this case, the bits included in the group which does not belong to the first part may be output serially and mapped onto a modulation symbol.

In FIGS. 28 and 29, the last single bit group of the plurality of bit groups is written in the second part. However, this is merely an example. The number of bit groups written in the second part may vary according to the total number of bit groups of the LDPC codeword, the number of columns and rows, the number of transmission antennas, etc.

The block interleaver 124 may have a configuration as shown in Tables 28 and 29 presented below:

TABLE 28

| | $N_{ldpc}$ = 64800 | | | | | |
|---|---|---|---|---|---|---|
| | QPSK | 16 QAM | 64 QAM | 256 QAM | 1024 QAM | 4096 QAM |
| C | 2 | 4 | 6 | 8 | 10 | 12 |
| $R_1$ | 32400 | 16200 | 10800 | 7920 | 6480 | 5400 |
| $R_2$ | 0 | 0 | 0 | 180 | 0 | 0 |

TABLE 29

| | QPSK | 16 QAM | 64 QAM | 256 QAM | 1024 QAM | 4096 QAM |
|---|---|---|---|---|---|---|
| $N_{ldpc}$ = 16200 | | | | | | |
| C | 2 | 4 | 6 | 8 | 10 | 12 |
| $R_1$ | 7920 | 3960 | 2520 | 1800 | 1440 | 1080 |
| $R_2$ | 180 | 90 | 180 | 225 | 180 | 270 |

In the above tables, C (or NO is the number of columns of the block interleaver 124, $R_1$ is the number of rows constituting the first part in each column, and $R_2$ is the number of rows constituting the second part in each column.

Referring to Tables 28 and 29, the number of columns, C, has the same value as a modulation order according to a modulation method, and each of a plurality of columns is formed of as many rows as the number of bits constituting the LDPC codeword divided by the number of a plurality of columns.

For example, when a length $N_{ldpc}$ of an LDPC codeword is 16200 and a modulation method is 256-QAM, the block interleaver 124 is formed of 8 columns as the modulation order is 8 in the case of 256-QAM, and each column is formed of rows as many as $R_1+R_2=2025$ (=16200/8).

Meanwhile, referring to Tables 28 and 29, when the number of bit groups constituting an LDPC codeword is an integer multiple of the number of columns, the block interleaver 124 interleaves without dividing each column. Therefore, $R_1$ corresponds to the number of rows constituting each column, and $R_2$ is 0. In contrast, when the number of bit groups constituting an LDPC codeword is not an integer multiple of the number of columns, the block interleaver 124 interleaves the groups by dividing each column into the first part formed of $R_1$ number of rows, and the second part formed of $R_2$ number of rows.

When the number of columns of the block interleaver 124 is equal to the number of bits constituting a modulation symbol, bits included in a same bit group are mapped onto a single bit of each modulation symbol as shown in Tables 28 and 29.

For example, when $N_{ldpc}$=16200 and the modulation method is 256-QAM, the block interleaver 124 may be formed of eight (8) columns each including 16200 rows. In this case, bits included in each of a plurality of bit groups are written in the eight (8) columns and bits written in a same row in each column are output serially. In this case, since eight (8) bits constitute a single modulation symbol in the modulation method of 256-QAM, bits included in a same bit group, that is, bits output from a single column, may be mapped onto a single bit of each modulation symbol. For example, bits included in a bit group written in the $1^{st}$ column may be mapped onto the first bit of each modulation symbol.

Referring to Tables 28 and 29, the total number of rows of the block interleaver 124, that is, $R_1+R_2$, is $N_{ldpc}/C$.

In addition, the number of rows of the first part, $R_1$, is an integer multiple of the number of bits included in each group, M (e.g., M=360), and may be expressed as $\lfloor N_{group}/C \rfloor \times M$, and the number of rows of the second part, $R_2$, may be $N_{ldpc}/C-R_1$. Herein, $\lfloor N_{group}/C \rfloor$ is the largest integer which is smaller than or equal to $N_{group}/C$. Since $R_1$ is an integer multiple of the number of bits included in each group, M, bits may be written in $R_1$ in bit groups wise.

In addition, Tables 18 and 19 show that, when the number of bit groups constituting an LDPC codeword is not an integer multiple of the number of columns, the block interleaver 124 interleaves by dividing each column into two parts.

The length of the LDPC codeword divided by the number of columns is the total number of rows included in the each column. In this case, when the number of bit groups constituting the LDPC codeword is an integer multiple of the number of columns, each column is not divided into two parts for interleaving by the block interleaver 124. However, when the number of bit groups constituting the LDPC codeword is not an integer multiple of the number of columns, each column is divided into two parts for the interleaving by the block interleaver 124.

For example, it is assumed that the number of columns of the block interleaver 124 is identical to the number of bits constituting a modulation symbol, and an LDPC codeword is formed of 64800 bits as shown in Table 28. In this case, each bit group of the LDPC codeword is formed of 360 bits, and the LDPC codeword is formed of 64800/360 (=180) bit groups.

When the modulation method is 16-QAM, the block interleaver 124 may be formed of four (4) columns and each column may have 6480014 (=16200) rows.

In this case, since the number of bit groups constituting the LDPC codeword divided by the number of columns is 180/4 (=45), bits can be written in each column in bit group wise without dividing each column into two parts. That is, bits included in 45 bit groups which is the quotient when the number of bit groups constituting the LDPC codeword is divided by the number of columns, that is, 45×360 (=16200) bits can be written in each column.

However, when the modulation method is 256-QAM, the block interleaver 124 may be formed of eight (8) columns and each column may have 64800/8 (=8100) rows.

In this case, since the number of bit groups of the LDPC codeword divided by the number of columns is 180/8=22.5, the number of bit groups constituting the LDPC codeword is not an integer multiple of the number of columns. Accordingly, the block interleaver 124 divides each of the eight (8) columns into two parts to perform interleaving in bit group wise.

In this case, since the bits should be written in the first part of each column in bit group wise, the number of bit groups which can be written in the first part of each column in bit group wise is 22, which is the quotient when the number of bit groups constituting the LDPC codeword is divided by the number of columns, and accordingly, the first part of each column has 22×360 (=7920) rows. Accordingly, 7920 bits included in 22 bit groups may be written in the first part of each column.

The second part of each column has as many rows as a value obtained by subtracting the number of rows of the first part from the total number of rows of each column. Accordingly, the second part of each column is formed of 8100−7920 (=180) rows.

In this case, bits included in bit groups which have not been written in the first part are divided and written in the second part of the eight (8) columns.

Since 22×8 (=176) bit groups are written in the first part, the number of bit groups to be written in the second part is 180−176 (=4) (for example, bit group $Y_{176}$, bit group $Y_{177}$, bit group $Y_{178}$, and bit group $Y_{179}$ from among bit group $Y_0$, bit group $Y_1$, bit group $Y_2$, ..., bit group $Y_{178}$, and bit group $Y_{179}$ constituting the LDPC codeword).

Accordingly, the block interleaver 124 may write the four (4) bit groups which have not been written in the first part and remains from among the plurality of groups constituting the LDPC codeword in the second part of the eight (8) columns serially.

That is, the block interleaver 124 may write 180 bits of the 360 bits included in the bit group $Y_{176}$ in the $1^{st}$ row to the $180^{th}$ row of the second part of the $1^{st}$ column in the column direction, and write the other 180 bits in the $1^{st}$ row to the $180^{th}$ row of the second part of the $2^{nd}$ column in the column direction. In addition, the block interleaver 124 may write 180 bits of the 360 bits included in the bit group $Y_{177}$ in the $1^{st}$ row to the $180^{th}$ row of the second part of the $3^{rd}$ column in the column direction, and may write the other 180 bits in the $1^{st}$ row to the $180^{th}$ row of the second part of the $4^{th}$ column in the column direction. In addition, the block interleaver 124 may write 180 bits of the 360 bits included in the bit group $Y_{178}$ in the $1^{st}$ row to the $180^{th}$ row of the second part of the $5^{th}$ column in the column direction, and may write the other 180 bits in the $1^{st}$ row to the $180^{th}$ row of the second part of the $6^{th}$ column in the column direction. In addition, the block interleaver 124 may write 180 bits of the 360 bits included in the bit group $Y_{179}$ in the $1^{st}$ row to the $180^{th}$ row of the second part of the $7^{th}$ column in the column direction, and may write the other 180 bits in the $1^{st}$ row to the $180^{th}$ row of the second part of the $8^{th}$ column in the column direction.

Accordingly, bits included in a bit group which has not been written in the first part and remains are not written in a same column in the second part and may be divided and written in a plurality of columns.

Hereinafter, the block interleaver 124 of FIG. 23 according to an exemplary embodiment will be explained with reference to FIG. 30.

In a group-interleaved LDPC codeword ($v_0, v_1, \ldots, v_{N_{ldpc}-1}$), $Y_j$ is continuously arranged like $V=\{Y_0, Y_1, \ldots, Y_{N_{group}-1}\}$.

Figure 30:
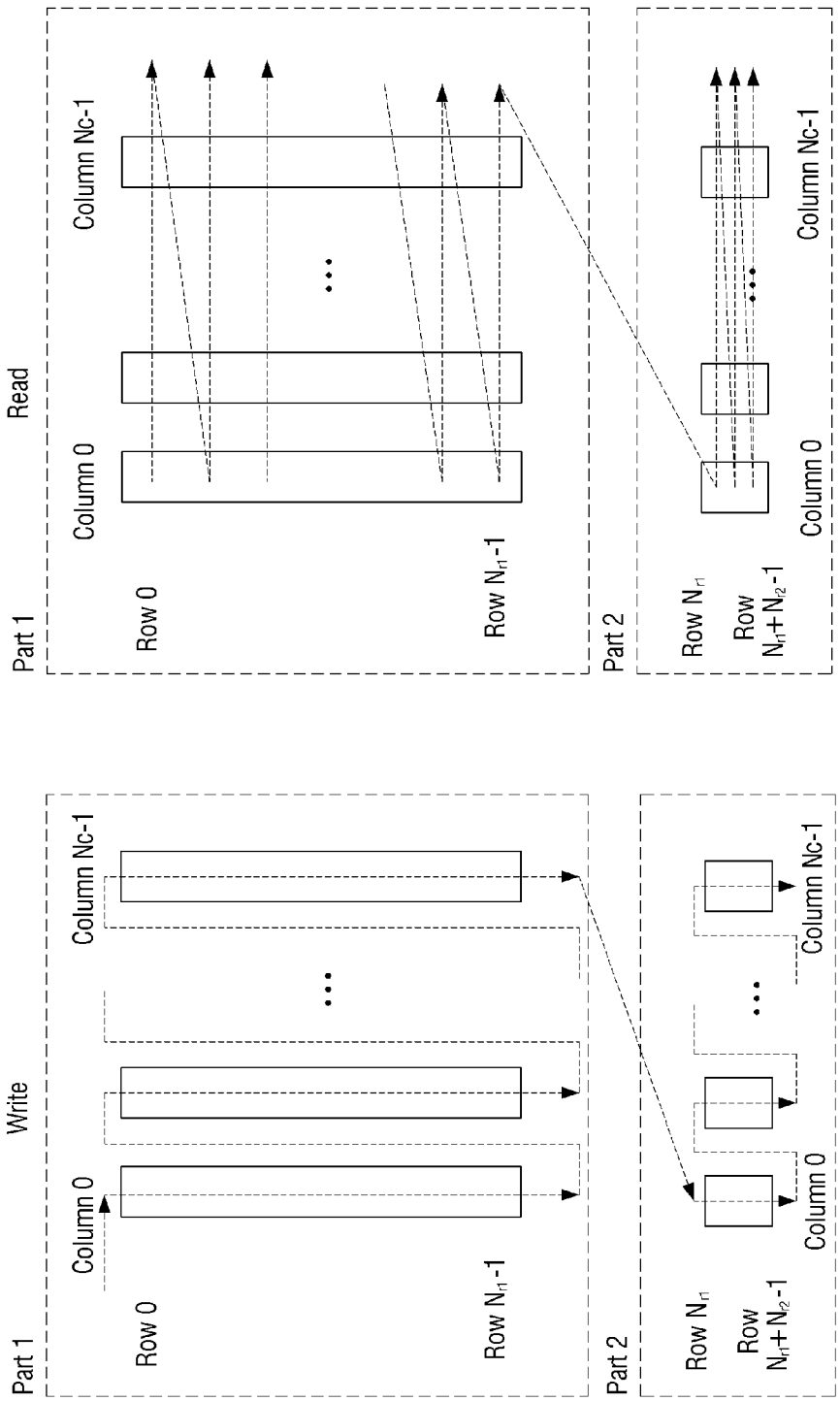

An LDPC codeword after group interleaving may be interleaved by the block interleaver 124 as shown in FIG. 30. In this case, the block interleaver 124 divides a plurality of columns into the first part (Part 1) and the second part (Part 2) based on the number of columns of the block interleaver 124 and the number of bits included in a bit group. In this case, in the first part, bits constituting a bit group may be written in a same column, and in the second part, bits constituting a bit group may be written in a plurality of columns (i.e. bits constituting a bit group may be written in at least two columns).

Input bits $v_i$ are written serially in from the first part to the second part in column wise, and then read out serially from the first part to the second part in row wise. That is, data bits $v_i$ are written serially into the block interleaver starting from the first part and to the second part in a column direction, and then read out serially from the first part to the second part in a row direction. Accordingly, a plurality of bits included in a same bit group in the first part may be mapped onto a single bit of each modulation symbol. In other words, the bits included in a same bit group in the first part may be mapped onto a plurality of bits respectively included in a plurality of modulation symbols, respectively.

In this case, the number of columns and the number of rows of the first part and the second part of the block interleaver 124 vary according to a modulation format and a length of the LDPC codeword as in Table 25 presented below. That is, the first part and the second part block interleaving configurations for each modulation format and code length are specified in Table 30 presented below. Here, the number of columns of the block interleaver 124 may be equal to the number of bits constituting a modulation symbol. In addition, a sum of the number of rows of the first part, $N_{r1}$ and the number of rows of the second part, $N_{r2}$, is equal to $N_{ldpc}/N_C$ (herein, $N_C$ is the number of columns). In addition, since $N_{r1}=\lfloor N_{group}/N_C \rfloor \times 360$) is a multiple of 360, a multiple of bit groups may be written in the first part.

TABLE 30

| Modulation | Rows in Part 1 $N_{r1}$ | | Rows in Part 2 $N_{r2}$ | | Columns $N_c$ |
|---|---|---|---|---|---|
| | $N_{ldpc}=$ 64800 | $N_{ldpc}=$ 16200 | $N_{ldpc}=$ 64800 | $N_{ldpc}=$ 16200 | |
| QPSK | 32400 | 7920 | 0 | 180 | 2 |
| 16-QAM | 16200 | 3960 | 0 | 90 | 4 |
| 64-QAM | 10800 | 2520 | 0 | 180 | 6 |
| 256-QAM | 7920 | 1800 | 180 | 225 | 8 |
| 1024-QAM | 6480 | 1440 | 0 | 180 | 10 |
| 4096-QAM | 5400 | 1080 | 0 | 270 | 12 |

Hereinafter, an operation of the block interleaver 124 will be explained.

As shown in FIG. 30, the input bit $v_i$ ($0 \le i < N_C \times N_{r1}$) is written in $r_i$ row of $c_i$ column of the first part of the block interleaver 124. Herein, $c_i$ and $r_i$ are $$c_i = \left\lfloor \frac{i}{N_{r1}} \right\rfloor \text{ and } r_i = (i \bmod N_{r1}),$$

respectively.

In addition, the input bit $v_i$ ($N_C \times N_{r1} \le i < N_{ldpc}$) is written in $r_i$ row of $c_i$ column of the second part of the block interleaver 124. Herein, $c_i$ and $r_i$ satisfy $$c_i = \left\lfloor \frac{(i - N_C \times N_{r1})}{N_{r2}} \right\rfloor \text{ and } r_i = N_{r1} + \{(i - N_C \times N_{r1}) \bmod N_{r2}\},$$

respectively.

An output bit $q_j$ ($0 \le j < N_{ldpc}$) is read from $c_j$ column of $r_j$ row. Herein, $r_j$ and $C_j$ satisfy $$r_j = \left\lfloor \frac{j}{N_c} \right\rfloor \text{ and } c_j = (j \bmod N_C),$$

respectively.

For example, when the length $N_{ldpc}$ of an LDPC codeword is 64800 and the modulation method is 256-QAM, the order of bits output from the block interleaver 124 may be ($q_0, q_1, q_2, \ldots, q_{63357}, q_{63358}, q_{63359}, q_{63360}, q_{63361}, \ldots, q_{64799}$)=($v_0, v_{7920}, v_{15840}, \ldots, v_{47519}, v_{55439}, v_{63359}, v_{63360}, v_{63540}, \ldots, v_{64799}$). Here, the indexes of the right side of the foregoing equation may be specifically expressed for the eight (8) columns as 0, 7920, 15840, 23760, 31680, 39600, 47520, 55440, 1, 7921, 15841, 23761, 31681, 39601, 47521, 55441, . . . , 7919, 15839, 23759, 31679, 39599, 47519, 55439, 63359, 63360, 63540, 63720, 63900, 64080, 64260, 64440, 64620, . . . , 63539, 63719, 63899, 64079, 64259, 64439, 64619, 64799.

Hereinafter, an interleaving operation of the block interleaver 124 will be explained.

The block interleaver 124 may interleave by writing a plurality of bit groups in a plurality of columns in bit group wise in a column direction, and reading each row of the plurality of columns in which the plurality of bit groups are written in bit group wise in a row direction. In this case, the number of columns constituting the block interleaver 124 may vary according to a modulation method, and the number of rows may be the length of the LDPC codeword divided by the number of columns. For example, when the modulation method is 256-QAM, the block interleaver 124 may be formed of eight (8) columns. In this case, when the length $N_{ldpc}$ of the LDPC codeword is 16200, the number of rows is 2025 (=16200/8).

Hereinafter, a method for interleaving the plurality of bit groups in bit group wise by the block interleaver 124 will be explained.

When the number of bit groups constituting an LDPC codeword is an integer multiple of the number of columns, the block interleaver 124 may interleave by writing as many number of bit groups as the number of bit groups constituting the LDPC codeword divided by the number of columns in each column serially in bit group wise.

For example, when the modulation method is 256-QAM and the length $N_{ldpc}$ of the LDPC codeword is 16200, the block interleaver 124 may be formed of eight (8) columns each including 2025 rows. In this case, since the LDPC codeword is divided into (16200/360=45) number of bit groups when the length $N_{ldpc}$ of the LDPC codeword is 16200, the number of bit groups (=45) of the LDPC codeword may not be an integer multiple of the number of columns (=8) when the modulation method is 256-QAM. That is, a remainder is generated when the number of bit groups of the LDPC codeword is divided by the number of columns.

As described above, when the number of the bit groups constituting the LDPC codeword is not an integer multiple of the number of columns constituting the block interleaver 124, the block interleaver 124 may divide each column into N number of parts (N is an integer greater than or equal to 2) and perform interleaving.

The block interleaver 124 may divide each column into a part which includes rows as many as the number of bits included in a bit group which can be written in each column in bit group wise (that is, the first part) and a part including remaining rows (that is, the second part), and perform interleaving using each of the divided parts.

Here, the part which includes rows as many as the number of bits included in a bit group that can be written in bit group wise, that is, the first part may be composed of rows as many as an integer multiple of M. That is, when the modulation method is 256-QAM, each column of the block interleaver 124 consists of 2025 rows, and thus each column of the block interleaver 124 may be composed of the first part including 1800 (=360×5) rows and the second part including 225 (=2025−1800) rows.

In this case, the block interleaver 124, after sequentially writing at least a part of bit groups, which can be written in bit group wise in the plurality of columns, from among the plurality of bit groups constituting the LDPC codeword, may divide and write remaining bit groups at an area other than an area where the at least a part of bit groups are written in the plurality of columns. That is, the block interleaver 124 may write bits included in at least a part of bit groups that can be written in the first part of the plurality of columns in bit group wise, and divide and write the bits included in the remaining bit group in the second part of the plurality of columns.

Figure 31:
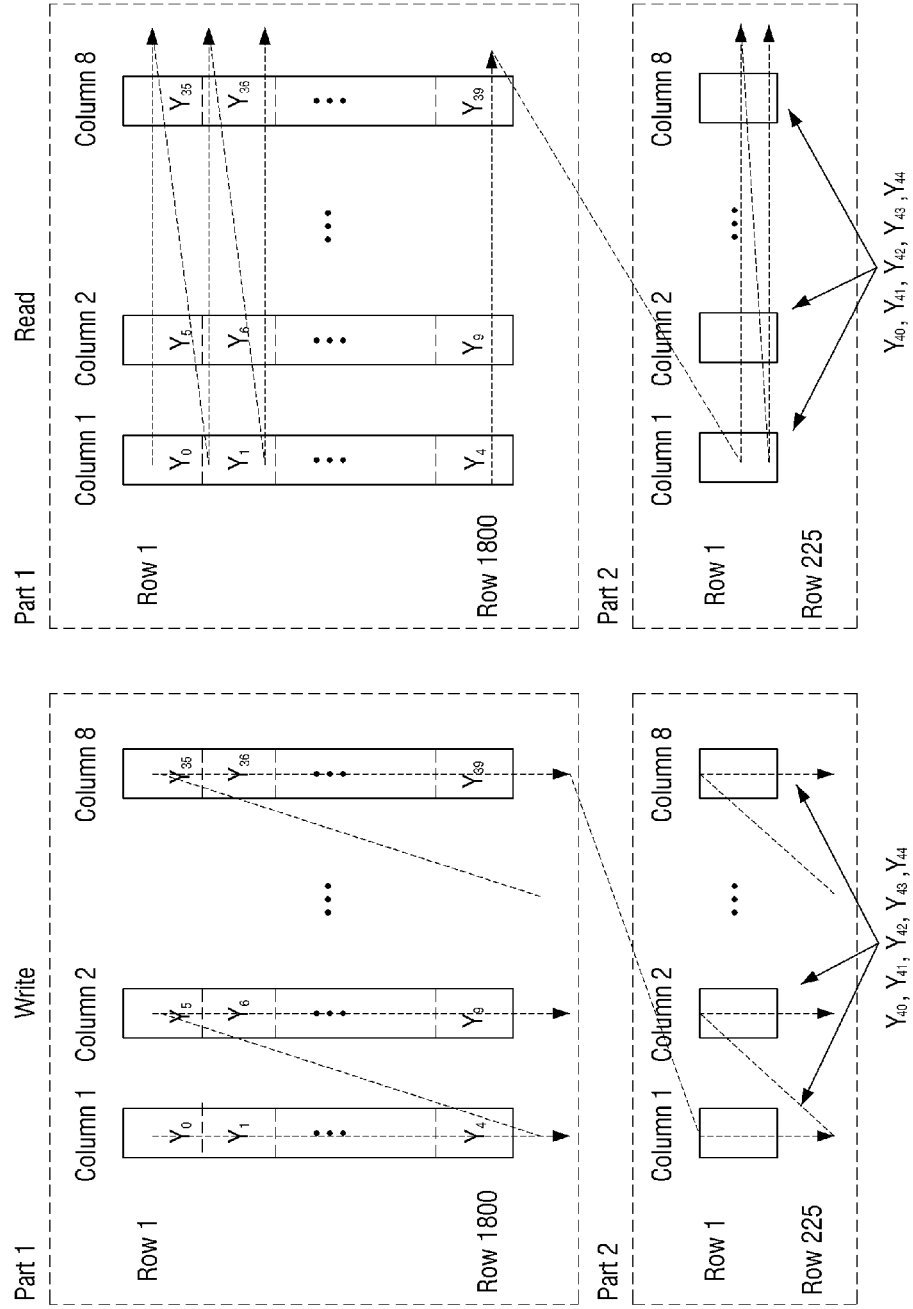
Figure 32:
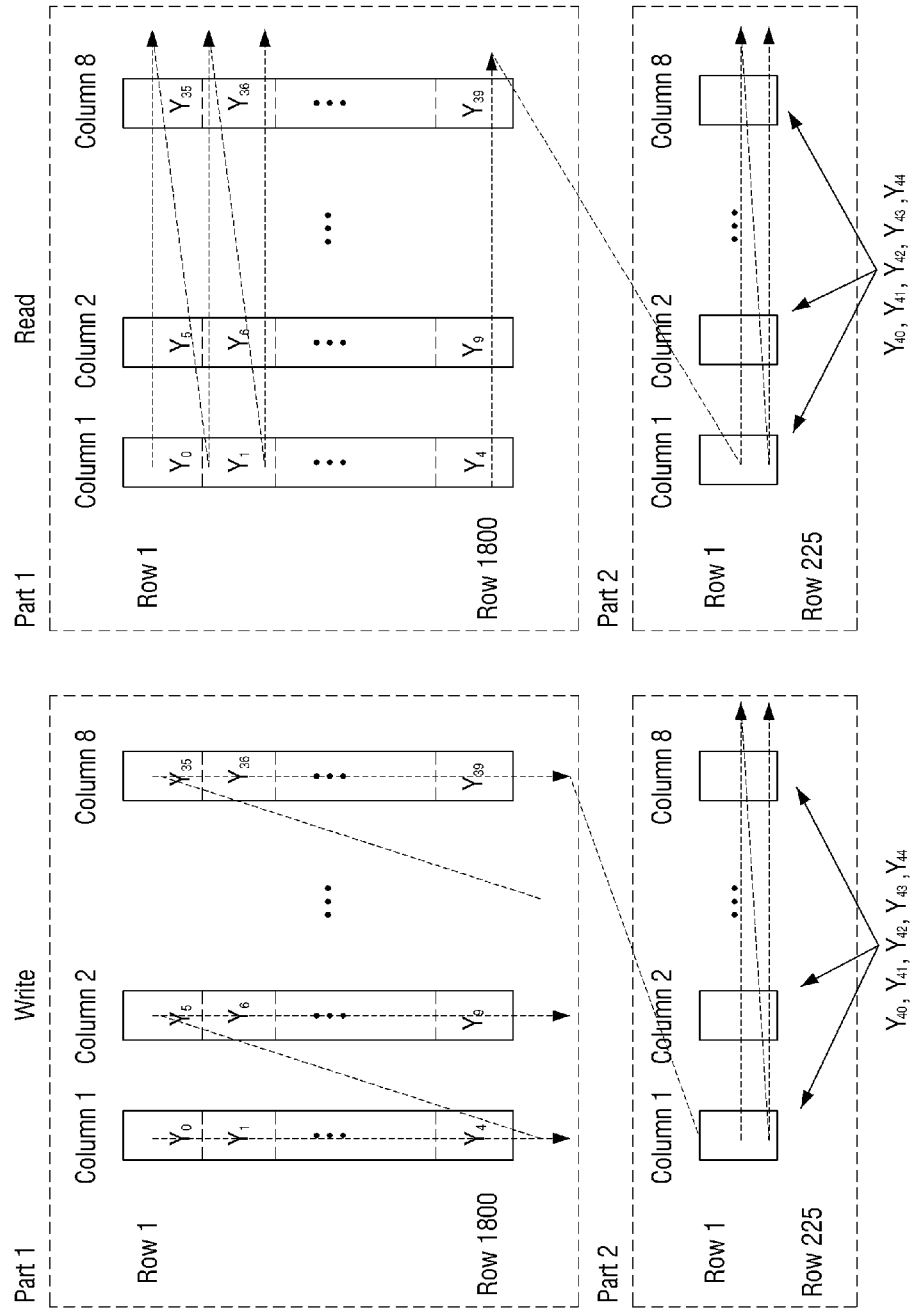

For example, when the modulation method is 256-QAM, as illustrated in FIGS. 31 and 32, the block interleaver 124 may include eight (8) columns and each column can be divided into the first part including 1800 rows and the second part including 225 rows.

In this case, the block interleaver 124 write bits included in a bit group that can be written in group wise in the first part of each column in a column direction.

That is, the block interleaver 124, as illustrated in FIGS. 31 and 32, may write bits included in bit group ($Y_0$), ($Y_1$) . . . ($Y_4$) from the $1^{st}$ row to the $1800^{th}$ row constituting the first part of the first column, write bits included in bit group ($Y_5$), ($Y_6$) . . . ($Y_9$) from the first row to the $1800^{th}$ row, . . . , and write bits included in each of bit group ($Y_{35}$), ($Y_{36}$) . . . ($Y_{39}$) from the $1^{st}$ row to the $1800^{th}$ row constituting the first part of the $8^{th}$ column.

As described above, the block interleaver 124 writes bits included in the bit groups, that can be written in group wise, in the first part of the eight (8) columns in bit group wise.

Thereafter, the block interleaver 124 may divide bits included in remaining bit groups other than the bit groups written in the first part of the eight (8) columns, from among a plurality of groups constituting the LDPC codeword, and write the divided bits in the second part of the eight (8) columns in a column direction. In this case, the block interleaver 124, in order for a same number of bits can be written in the second part of each column, may divide the bits included in the remaining bit groups by the number of columns, and write the divided bits in the second part of the eight (8) columns in a column direction.

For example, as illustrated in FIG. 31, the block interleaver 124 may sequentially write, from among a plurality of bit groups constituting the LDPC codeword, bit group ($Y_{40}$), bit group ($Y_{41}$), bit group ($Y_{42}$), bit group ($Y_{43}$), and bit group ($Y_{44}$) which are the remaining groups from the bit groups written in the first part in the second part of the eight (8) columns.

That is, the block interleaver 124, from among 360 bits included in bit group ($Y_{40}$), may write 225 bits from the $1^{st}$ row to the $225^{th}$ row of the second part of the first column in a column direction, and write remaining 135 bits from the $1^{st}$ row to the $135^{th}$ row of the second part of the second column in a column direction. In addition, the block interleaver 124, from among 360 bits included in bit group ($Y_{41}$), may write 90 bits from the $136^{th}$ row to the $225^{th}$ row of the second part of the second column in a column direction, write 225 bits from among remaining 270 bits from the $1^{st}$ row to the $225^{th}$ row of the second part of the third column in a column direction, and write 45 bits from the $1^{st}$ row to the $45^{th}$ row of the second part of the fourth column in a column direction. That is, the block interleaver 124, from among 360 bits included in bit group ($Y_{42}$), may write 180 bits from the $46^{th}$ row to the $225^{th}$ row of the second part of the $4^{th}$ column in a column direction, and write remaining 180 bits from the $1^{st}$ row to the $180^{th}$ row of the second part of the fifth column in a column direction. In addition, the block interleaver 124, from among 360 bits included in bit group ($Y_{43}$), may write 45 bits from the $181^{st}$ row to the $225^{th}$ row of the second part of the fifth column in a column direction, write 225 bits from among remaining 315 bits from the 1st row to the $225^{th}$ row of the second part of the sixth column in a column direction, and write 90 bits from the $1^{st}$ row to the $90^{th}$ row of the second part of the seventh column in a column direction.

In addition, the block interleaver 124, from among 360 bits included in bit group ($Y_{44}$), may write 135 bits from the $91^{st}$ row to the $225^{th}$ row of the second part of the seventh column in a column direction, and write remaining 225 bits from the $1^{st}$ row to the $225^{th}$ row of the second part of the eighth column in a column direction.

Accordingly, the bits included in the bit group which remains after the bits are written in the first part may not be written in a same column in the second part, but written over a plurality of columns.

Meanwhile, in the aforementioned example, it is described that the block zinterleaver 124 write bits in the column direction, it is merely exemplary. That is, the block interleaver 124 may write bits in a plurality of columns of the second part in the row direction. In this case, however, the block interleaver 124 may write the bits in the first part still in the same manner as described above, that is, in the column direction.

Referring to FIG. 32, the block interleaver 124 may write bits from the $1^{st}$ row of the second part of the first column to the $1^{st}$ row of the second part of the eighth column, write bits from the $2^{nd}$ row of the second part of the first column to the $2^{nd}$ row of the second part of the sixth column, . . . , and write bits from the $180^{th}$ row of the second part of the first column to the $180^{th}$ row of the second part of the sixth column.

Accordingly, the bits included in bit group ($Y_{40}$) can be sequentially written from the $1^{st}$ row of the second part of the first column to the $45^{th}$ row of the second part of the eighth column, the bits included in bit group ($Y_{41}$) can be sequentially written from the $46^{th}$ row of the second part of the first column to the $90^{th}$ row of the second part of the eighth column, the bits included in bit group ($Y_{42}$) can be sequentially written from the $91^{st}$ row of the second part of the first column to the $135^{th}$ row of the second part of the eighth column, the bits included in bit group ($Y_{43}$) can be sequentially written from the $136^{th}$ row of the second part of the first column to the $180^{th}$ row of the second part of the eighth column, and bits included in the bit group ($Y_{44}$) can be sequentially written from the $181^{st}$ row of the second part of the first column to the $225^{th}$ row of the second part of the eighth column.

Meanwhile, the block interleaver 124 sequentially reads the bits written in each part in the row direction. That is, the block interleaver 124, as illustrated in FIGS. 31 and 32, may sequentially read the bits written in the first part of the eight columns in the row direction, and sequentially read the bits written in the second part of the eight columns in the row direction.

As described above, the block interleaver 124 may interleave the plurality of bit groups of the LDPC codeword in the method described above with reference to FIGS. 27 to 32.

The modulator 130 maps the interleaved LDPC codeword onto a modulation symbol. The modulator 130 may demultiplex the interleaved LDPC codeword, modulate the demultiplexed LDPC codeword, and map the modulated LDPC codeword onto a constellation.

In this case, the modulator 130 may generate a modulation symbol using bits included in each of a plurality of bit groups.

In other words, as described above, bits included in different bit groups may be written in different columns of the block interleaver 124, respectively, and the block interleaver 124 reads the bits written in the different column in the row direction. In this case, the modulator 130 generates a modulation symbol by mapping the bits read from the different columns onto respective bits of the modulation symbol. Accordingly, the bits constituting the modulation symbol belong to different bit groups.

For example, it is assumed that the modulation symbol consists of C number of bits. In this case, the bits which are read from each row of C number of columns of the block interleaver 124 may be mapped onto respective bits of the modulation symbol, and thus, these bits of the modulation symbol, i.e., C number of bits, belong to C number of different groups.

Hereinbelow, the above feature will be described.

First, the modulator 130 demultiplexes the interleaved LDPC codeword. To achieve this, the modulator 130 may include a demultiplexer (not shown) to demultiplex the interleaved LDPC codeword.

A demultiplexer (not shown) demultiplexes the interleaved LDPC codeword. The demultiplexer (not shown) performs serial-to-parallel conversion with respect to the interleaved LDPC codeword, and demultiplexes the interleaved LDPC codeword into a cell having a predetermined number of bits (or a data cell).

Figure 33:
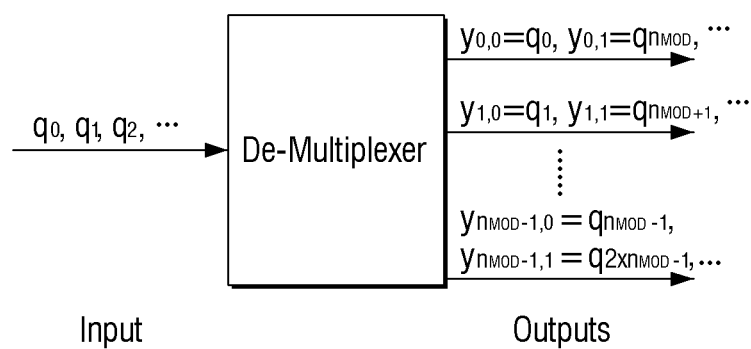
FIG. 33 is a view to illustrate an operation of a demultiplexer, according to an exemplary embodiment.

For example, as shown in FIG. 33, the demultiplexer (not shown) receives an LDPC codeword $Q=(q_0, q_1, q_2, \ldots)$ output from the interleaver 120, outputs the received LDPC codeword bits to a plurality of substreams serially, converts the input LDPC codeword bits into cells, and outputs the cells.

In this case, bits having a same index in each of the plurality of substreams may constitute a same cell. Accordingly, the cells may be configured like $(y_{0,0}, y_{1,0}, y_{\eta_{MOD}-1,0})=(q_0, q_1, q_{\eta_{MOD}-1})$, $(y_{0,1}, y_{1,1}, Y_{\eta_{MOD}-1,1})=(q_{\eta_{MOD}}, q_{\eta_{MOD}+1}, \ldots, q_{2\times\eta_{MOD}-1})$, . . . .

Here, the number of substreams, $N_{substreams}$, may be equal to the number of bits constituting a modulation symbol, $\eta_{MOD}$. Accordingly, the number of bits constituting each cell may be equal to the number of bits constituting a modulation symbol (that is, a modulation order).

For example, when the modulation method is 256-QAM, the number of bits constituting the modulation symbol, $\eta_{MOD}$, is eight (8), and thus, the number of substreams, $N_{substreams}$, is eight (8), and the cells may be configured like $(y_{0,0}, Y_{1,0}, Y_{2,0}, Y_{3,0}, Y_{4,0}, Y_{5,0}, Y_{6,0}, y_{7,0})=(q_0, q_1, q_2, q_3, q_4, q_5, q_6, q_7)$, $(y_{0,1}, y_{1,1}, y_{2,1}, y_{3,1}, y_{4,1}, y_{5,1}, y_{6,1}, y_{7,1})=(q_8, q_9, q_{10}, q_{11}, q_{12}, q_{13}, q_{14}, q_{15})$, $(y_{0,2}, Y_{1,2}, y_{2,2}, y_{3,2}, y_{4,2}, y_{5,2}, y_{6,2}, y_{7,2})=(q_{16}, q_{17}, q_{18}, q_{19}, q_{20}, q_{21}, q_{22}, q_{23})$, . . . .

The modulator 130 may map the demultiplexed LDPC codeword onto modulation symbols.

The modulator 130 may modulate bits (that is, cells) output from the demultiplexer (not shown) in various modulation methods such as 256-QAM, etc. For example, when the modulation method is QPSK, 16-QAM, 64-QAM, 256-QAM, 1024-QAM, and 4096-QAM, the number of bits constituting a modulation symbol, $\eta_{MOD}$ (that is, the modulation order), may be 2, 4, 6, 8, 10 and 12, respectively.

In this case, since each cell output from the demultiplexer (not shown) is formed of as many bits as the number of bits constituting a modulation symbol, the modulator 130 may generate a modulation symbol by mapping each cell output from the demultiplexer (not shown) onto a constellation point serially. Herein, a modulation symbol corresponds to a constellation point on the constellation.

However, the above-described demultiplexer (not shown) may be omitted according to circumstances. In this case, the modulator 130 may generate modulation symbols by grouping a predetermined number of bits from interleaved bits serially and mapping the predetermined number of bits onto a constellation point. In this case, the modulator 130 may generate a modulation symbol by mapping $\eta_{MOD}$ number of bits onto a constellation point serially according to a modulation method.

The modulator 130 may modulate by mapping cells output from the demultiplexer (not shown) onto constellation points in a non-uniform constellation (NUC) method.

In the non-uniform constellation method, once a constellation point of the first quadrant is defined, constellation points in the other three quadrants may be determined as follows. For example, when a set of constellation points defined for the first quadrant is X, the set becomes −conj(X) in the case of the second quadrant, becomes conj(X) in the case of the third quadrant, and becomes −(X) in the case of the fourth quadrant.

That is, once the first quadrant is defined, the other quadrants may be expressed as follows:

1 Quarter (first quadrant)=X
2 Quarter (second quadrant)=−conj(X)
3 Quarter (third quadrant)=conj(X)
4 Quarter (fourth quadrant)=−X When the non-uniform M-QAM is used, M number of constellation points may be defined as $z=\{z_0, z_1, \ldots, z_{M-1}\}$. In this case, when the constellation points existing in the first quadrant are defined as $\{x_0, x_1, x_2, \ldots, x_{M/4-1}\}$, z may be defined as follows:

from $z_0$ to $z_{M/4-1}$=from $X_0$ to $x_{M/4}$
from $z_{M/4}$ to $z_{2\times M/4-1}$=−Conj(from $x_0$ to $x_{M/4}$)
from $z_{2\times M/4}$ to $z_{3\times M/4-1}$=Conj(from $x_0$ to $x_{M/4}$)
from $z_{3\times M/4}$ to $z_{4\times M/4-1}$=−(from $x_0$ to $x_{M/4}$)

Accordingly, the modulator 130 may map bits [$y_0, \ldots, y_{m-1}$] output from the demultiplexer (not shown) onto constellation points in the non-uniform constellation method by mapping the output bits onto $z_L$ having an index of $$L = \sum_{i=0}^{m-1} (y_1 \times 2^{m-1}).$$

An example of constellation which is defined by the above non-uniform constellation method may be expressed as Table 31 below, when the code rate is 5/15, 7/15, 9/15, 11/15 and 13/15.

TABLE 31

| Label (int.) | CR 5/15 Constellation | CR 7/15 Constellation | CR 9/15 Constellation | CR 13/15 Constellation |
|---|---|---|---|---|
| 0 | 0.1524 + 0.3087i | 0.1170 + 0.3003i | 0.0899 + 0.1337i | 1.2412 + 1.0688i |
| 1 | 0.1525 + 0.3087i | 0.1171 + 0.3003i | 0.0910 + 0.1377i | 1.2668 + 0.8034i |
| 2 | 0.1513 + 0.3043i | 0.1204 + 0.3233i | 0.0873 + 0.3862i | 0.9860 + 1.1758i |
| 3 | 0.1513 + 0.3043i | 0.1204 + 0.3233i | 0.0883 + 0.3873i | 1.0365 + 0.9065i |
| 4 | 0.1682 + 0.3004i | 0.1454 + 0.2877i | 0.1115 + 0.1442i | 1.2111 + 0.5135i |
| 5 | 0.1682 + 0.3005i | 0.1453 + 0.2877i | 0.1135 + 0.1472i | 1.4187 + 0.6066i |
| 6 | 0.1663 + 0.2964i | 0.1566 + 0.3074i | 0.2067 + 0.3591i | 1.0103 + 0.4879i |
| 7 | 0.1663 + 0.2964i | 0.1565 + 0.3074i | 0.1975 + 0.3621i | 1.0380 + 0.6906i |
| 8 | 0.1964 + 0.6584i | 0.1427 + 0.6856i | 0.1048 + 0.7533i | 0.6963 + 1.3442i |
| 9 | 0.1965 + 0.6583i | 0.1562 + 0.6826i | 0.1770 + 0.7412i | 0.7089 + 1.1122i |
| 10 | 0.1967 + 0.6652i | 0.1422 + 0.6584i | 0.1022 + 0.5904i | 0.1256 + 1.4745i |
| 11 | 0.1968 + 0.6652i | 0.1529 + 0.6560i | 0.1191 + 0.5890i | 0.8331 + 0.9455i |
| 12 | 0.3371 + 0.5987i | 0.3840 + 0.5856i | 0.4264 + 0.6230i | 0.6615 + 0.6012i |
| 13 | 0.3370 + 0.5987i | 0.3723 + 0.5931i | 0.3650 + 0.6689i | 0.6894 + 0.7594i |
| 14 | 0.3414 + 0.6039i | 0.3651 + 0.5660i | 0.3254 + 0.5153i | 0.8373 + 0.5633i |
| 15 | 0.3413 + 0.6039i | 0.3559 + 0.5718i | 0.2959 + 0.5302i | 0.8552 + 0.7410i |
| 16 | 0.3087 + 0.1524i | 0.3003 + 0.1170i | 0.3256 + 0.0768i | 1.2666 + 0.1027i |
| 17 | 0.3087 + 0.1525i | 0.3003 + 0.1171i | 0.3266 + 0.0870i | 1.4915 + 0.1198i |
| 18 | 0.3043 + 0.1513i | 0.3233 + 0.1204i | 0.4721 + 0.0994i | 1.0766 + 0.0945i |
| 19 | 0.3043 + 0.1513i | 0.3233 + 0.1204i | 0.4721 + 0.1206i | 0.9007 + 0.0848i |
| 20 | 0.3004 + 0.1682i | 0.2877 + 0.1454i | 0.2927 + 0.1267i | 1.2454 + 0.3064i |
| 21 | 0.3005 + 0.1682i | 0.2877 + 0.1453i | 0.2947 + 0.1296i | 1.4646 + 0.3600i |
| 22 | 0.2964 + 0.1663i | 0.3074 + 0.1566i | 0.3823 + 0.2592i | 1.0570 + 0.2995i |
| 23 | 0.2964 + 0.1663i | 0.3074 + 0.1565i | 0.3944 + 0.2521i | 0.9140 + 0.2530i |
| 24 | 0.6584 + 0.1964i | 0.6856 + 0.1427i | 0.7755 + 0.1118i | 0.5461 + 0.0679i |
| 25 | 0.6583 + 0.1965i | 0.6826 + 0.1562i | 0.7513 + 0.2154i | 0.5681 + 0.1947i |
| 26 | 0.6652 + 0.1967i | 0.6584 + 0.1422i | 0.6591 + 0.1033i | 0.6874 + 0.0537i |
| 27 | 0.6652 + 0.1968i | 0.6560 + 0.1529i | 0.6446 + 0.1737i | 0.7375 + 0.1492i |
| 28 | 0.5987 + 0.3371i | 0.5856 + 0.3840i | 0.5906 + 0.4930i | 0.6290 + 0.4553i |
| 29 | 0.5987 + 0.3370i | 0.5931 + 0.3723i | 0.6538 + 0.4155i | 0.6007 + 0.3177i |
| 30 | 0.6039 + 0.3414i | 0.5660 + 0.3651i | 0.4981 + 0.3921i | 0.7885 + 0.4231i |
| 31 | 0.6039 + 0.3413i | 0.5718 + 0.3559i | 0.5373 + 0.3586i | 0.7627 + 0.2849i |
| 32 | 0.3183 + 1.5992i | 0.1683 + 1.7041i | 0.1630 + 1.6621i | 0.0816 + 1.1632i |
| 33 | 0.3186 + 1.5991i | 0.4972 + 1.6386i | 0.4720 + 1.5898i | 0.0830 + 0.9813i |
| 34 | 0.2756 + 1.3848i | 0.1495 + 1.3560i | 0.1268 + 1.3488i | 0.2528 + 1.2315i |
| 35 | 0.2759 + 1.3847i | 0.3814 + 1.3099i | 0.3752 + 1.2961i | 0.2502 + 1.0100i |
| 36 | 0.9060 + 1.3557i | 1.0862 + 1.3238i | 1.0398 + 1.2991i | 0.0732 + 0.6827i |
| 37 | 0.9058 + 1.3559i | 0.8074 + 1.5101i | 0.7733 + 1.4772i | 0.0811 + 0.8293i |
| 38 | 0.7846 + 1.1739i | 0.8534 + 1.0644i | 0.8380 + 1.0552i | 0.2159 + 0.6673i |
| 39 | 0.7843 + 1.1741i | 0.6568 + 1.1958i | 0.6242 + 1.2081i | 0.2359 + 0.8283i |
| 40 | 0.2257 + 0.9956i | 0.1552 + 0.9481i | 0.1103 + 0.9397i | 0.4302 + 1.4458i |
| 41 | 0.2259 + 0.9956i | 0.2200 + 0.9352i | 0.2415 + 0.9155i | 0.5852 + 0.9680i |
| 42 | 0.2276 + 1.0326i | 0.1577 + 1.0449i | 0.1118 + 1.1163i | 0.4528 + 1.2074i |
| 43 | 0.2278 + 1.0326i | 0.2548 + 1.0255i | 0.3079 + 1.0866i | 0.4167 + 1.0099i |
| 44 | 0.5446 + 0.8635i | 0.5609 + 0.7800i | 0.5647 + 0.7638i | 0.5035 + 0.6307i |
| 45 | 0.5445 + 0.8636i | 0.5060 + 0.8167i | 0.4385 + 0.8433i | 0.5359 + 0.7954i |
| 46 | 0.5694 + 0.8910i | 0.6276 + 0.8501i | 0.6846 + 0.8841i | 0.3580 + 0.6532i |
| 47 | 0.5692 + 0.8911i | 0.5452 + 0.9052i | 0.5165 + 1.0034i | 0.3841 + 0.8207i |
| 48 | 1.5992 + 0.3183i | 1.7041 + 0.1683i | 1.6489 + 0.1630i | 0.0576 + 0.0745i |
| 49 | 1.5991 + 0.3186i | 1.6386 + 0.4972i | 1.5848 + 0.4983i | 0.0581 + 0.2241i |
| 50 | 1.3848 + 0.2756i | 1.3560 + 0.1495i | 1.3437 + 0.1389i | 0.1720 + 0.0742i |
| 51 | 1.3847 + 0.2759i | 1.3099 + 0.3814i | 1.2850 + 0.4025i | 0.1753 + 0.2222i |
| 52 | 1.3557 + 0.9060i | 1.3238 + 1.0862i | 1.2728 + 1.0661i | 0.0652 + 0.5269i |

TABLE 31-continued

| Label (int.) | CR 5/15 Constellation | CR 7/15 Constellation | CR 9/15 Constellation | CR 13/15 Constellation |
|---|---|---|---|---|
| 53 | 1.3559 + 0.9058i | 1.5101 + 0.8074i | 1.4509 + 0.7925i | 0.0611 + 0.3767i |
| 54 | 1.1739 + 0.7846i | 1.0644 + 0.8534i | 1.0249 + 0.8794i | 0.1972 + 0.5178i |
| 55 | 1.1741 + 0.7843i | 1.1958 + 0.6568i | 1.1758 + 0.6545i | 0.1836 + 0.3695i |
| 56 | 0.9956 + 0.2257i | 0.9481 + 0.1552i | 0.9629 + 0.1113i | 0.4145 + 0.0709i |
| 57 | 0.9956 + 0.2259i | 0.9352 + 0.2200i | 0.9226 + 0.2849i | 0.4266 + 0.2100i |
| 58 | 1.0326 + 0.2276i | 1.0449 + 0.1577i | 1.1062 + 0.1118i | 0.2912 + 0.0730i |
| 59 | 1.0326 + 0.2278i | 1.0255 + 0.2548i | 1.0674 + 0.3393i | 0.2982 + 0.2177i |
| 60 | 0.8635 + 0.5446i | 0.7800 + 0.5609i | 0.7234 + 0.6223i | 0.4766 + 0.4821i |
| 61 | 0.8636 + 0.5445i | 0.8167 + 0.5060i | 0.8211 + 0.4860i | 0.4497 + 0.3448i |
| 62 | 0.8910 + 0.5694i | 0.8501 + 0.6276i | 0.8457 + 0.7260i | 0.3334 + 0.5025i |
| 63 | 0.8911 + 0.5692i | 0.9052 + 0.5452i | 0.9640 + 0.5518i | 0.3125 + 0.3601i |
| 64 | −0.1524 + 0.3087i | −0.1170 + 0.3003i | −0.0899 + 0.1337i | −1.2412 + 1.0688i |
| 65 | −0.1525 + 0.3087i | −0.1171 + 0.3003i | −0.0910 + 0.1377i | −1.2668 + 0.8034i |
| 66 | −0.1513 + 0.3043i | −0.1204 + 0.3233i | −0.0873 + 0.3862i | −0.9860 + 1.1758i |
| 67 | −0.1513 + 0.3043i | −0.1204 + 0.3233i | −0.0883 + 0.3873i | −1.0365 + 0.9065i |
| 68 | −0.1682 + 0.3004i | −0.1454 + 0.2877i | −0.1115 + 0.1442i | −1.2111 + 0.5135i |
| 69 | −0.1682 + 0.3005i | −0.1453 + 0.2877i | −0.1135 + 0.1472i | −1.4187 + 0.6066i |
| 70 | −0.1663 + 0.2964i | −0.1566 + 0.3074i | −0.2067 + 0.3591i | −1.0103 + 0.4879i |
| 71 | −0.1663 + 0.2964i | −0.1565 + 0.3074i | −0.1975 + 0.3621i | −1.0380 + 0.6906i |
| 72 | −0.1964 + 0.6584i | −0.1427 + 0.6856i | −0.1048 + 0.7533i | −0.6963 + 1.3442i |
| 73 | −0.1965 + 0.6583i | −0.1562 + 0.6826i | −0.1770 + 0.7412i | −0.7089 + 1.1122i |
| 74 | −0.1967 + 0.6652i | −0.1422 + 0.6584i | −0.1022 + 0.5904i | −0.1256 + 1.4745i |
| 75 | −0.1968 + 0.6652i | −0.1529 + 0.6560i | −0.1191 + 0.5890i | −0.8331 + 0.9455i |
| 76 | −0.3371 + 0.5987i | −0.3840 + 0.5856i | −0.4264 + 0.6230i | −0.6615 + 0.6012i |
| 77 | −0.3370 + 0.5987i | −0.3723 + 0.5931i | −0.3650 + 0.6689i | −0.6894 + 0.7594i |
| 78 | −0.3414 + 0.6039i | −0.3651 + 0.5660i | −0.3254 + 0.5153i | −0.8373 + 0.5633i |
| 79 | −0.3413 + 0.6039i | −0.3559 + 0.5718i | −0.2959 + 0.5302i | −0.8552 + 0.7410i |
| 80 | −0.3087 + 0.1524i | −0.3003 + 0.1170i | −0.3256 + 0.0768i | −1.2666 + 0.1027i |
| 81 | −0.3087 + 0.1525i | −0.3003 + 0.1171i | −0.3266 + 0.0870i | −1.4915 + 0.1198i |
| 82 | −0.3043 + 0.1513i | −0.3233 + 0.1204i | −0.4721 + 0.0994i | −1.0766 + 0.0945i |
| 83 | −0.3043 + 0.1513i | −0.3233 + 0.1204i | −0.4721 + 0.1206i | −0.9007 + 0.0848i |
| 84 | −0.3004 + 0.1682i | −0.2877 + 0.1454i | −0.2927 + 0.1267i | −1.2454 + 0.3064i |
| 85 | −0.3005 + 0.1682i | −0.2877 + 0.1453i | −0.2947 + 0.1296i | −1.4646 + 0.3600i |
| 86 | −0.2964 + 0.1663i | −0.3074 + 0.1566i | −0.3823 + 0.2592i | −1.0570 + 0.2995i |
| 87 | −0.2964 + 0.1663i | −0.3074 + 0.1565i | −0.3944 + 0.2521i | −0.9140 + 0.2530i |
| 88 | −0.6584 + 0.1964i | −0.6856 + 0.1427i | −0.7755 + 0.1118i | −0.5461 + 0.0679i |
| 89 | −0.6583 + 0.1965i | −0.6826 + 0.1562i | −0.7513 + 0.2154i | −0.5681 + 0.1947i |
| 90 | −0.6652 + 0.1967i | −0.6584 + 0.1422i | −0.6591 + 0.1033i | −0.6874 + 0.0537i |
| 91 | −0.6652 + 0.1968i | −0.6560 + 0.1529i | −0.6446 + 0.1737i | −0.7375 + 0.1492i |
| 92 | −0.5987 + 0.3371i | −0.5856 + 0.3840i | −0.5906 + 0.4930i | −0.6290 + 0.4553i |
| 93 | −0.5987 + 0.3370i | −0.5931 + 0.3723i | −0.6538 + 0.4155i | −0.6007 + 0.3177i |
| 94 | −0.6039 + 0.3414i | −0.5660 + 0.3651i | −0.4981 + 0.3921i | −0.7885 + 0.4231i |
| 95 | −0.6039 + 0.3413i | −0.5718 + 0.3559i | −0.5373 + 0.3586i | −0.7627 + 0.2849i |
| 96 | −0.3183 + 1.5992i | −0.1683 + 1.7041i | −0.1630 + 1.6621i | −0.0816 + 1.1632i |
| 97 | −0.3186 + 1.5991i | −0.4972 + 1.6386i | −0.4720 + 1.5898i | −0.0830 + 0.9813i |
| 98 | −0.2756 + 1.3848i | −0.1495 + 1.3560i | −0.1268 + 1.3488i | −0.2528 + 1.2315i |
| 99 | −0.2759 + 1.3847i | −0.3814 + 1.3099i | −0.3752 + 1.2961i | −0.2502 + 1.0100i |
| 100 | −0.9060 + 1.3557i | −1.0862 + 1.3238i | −1.0398 + 1.2991i | −0.0732 + 0.6827i |
| 101 | −0.9058 + 1.3559i | −0.8074 + 1.5101i | −0.7733 + 1.4772i | −0.0811 + 0.8293i |
| 102 | −0.7846 + 1.1739i | −0.8534 + 1.0644i | −0.8380 + 1.0552i | −0.2159 + 0.6673i |
| 103 | −0.7843 + 1.1741i | −0.6568 + 1.1958i | −0.6242 + 1.2081i | −0.2359 + 0.8283i |
| 104 | −0.2257 + 0.9956i | −0.1552 + 0.9481i | −0.1103 + 0.9397i | −0.4302 + 1.4458i |
| 105 | −0.2259 + 0.9956i | −0.2200 + 0.9352i | −0.2415 + 0.9155i | −0.5852 + 0.9680i |
| 106 | −0.2276 + 1.0326i | −0.1577 + 1.0449i | −0.1118 + 1.1163i | −0.4528 + 1.2074i |
| 107 | −0.2278 + 1.0326i | −0.2548 + 1.0255i | −0.3079 + 1.0866i | −0.4167 + 1.0099i |
| 108 | −0.5446 + 0.8635i | −0.5609 + 0.7800i | −0.5647 + 0.7638i | −0.5035 + 0.6307i |
| 109 | −0.5445 + 0.8636i | −0.5060 + 0.8167i | −0.4385 + 0.8433i | −0.5359 + 0.7954i |
| 110 | −0.5694 + 0.8910i | −0.6276 + 0.8501i | −0.6846 + 0.8841i | −0.3580 + 0.6532i |
| 111 | −0.5692 + 0.8911i | −0.5452 + 0.9052i | −0.5165 + 1.0034i | −0.3841 + 0.8207i |
| 112 | −1.5992 + 0.3183i | −1.7041 + 0.1683i | −1.6489 + 0.1630i | −0.0576 + 0.0745i |
| 113 | −1.5991 + 0.3186i | −1.6386 + 0.4972i | −1.5848 + 0.4983i | −0.0581 + 0.2241i |
| 114 | −1.3848 + 0.2756i | −1.3560 + 0.1495i | −1.3437 + 0.1389i | −0.1720 + 0.0742i |
| 115 | −1.3847 + 0.2759i | −1.3099 + 0.3814i | −1.2850 + 0.4025i | −0.1753 + 0.2222i |
| 116 | −1.3557 + 0.9060i | −1.3238 + 1.0862i | −1.2728 + 1.0661i | −0.0652 + 0.5269i |
| 117 | −1.3559 + 0.9058i | −1.5101 + 0.8074i | −1.4509 + 0.7925i | −0.0611 + 0.3767i |
| 118 | −1.1739 + 0.7846i | −1.0644 + 0.8534i | −1.0249 + 0.8794i | −0.1972 + 0.5178i |
| 119 | −1.1741 + 0.7843i | −1.1958 + 0.6568i | −1.1758 + 0.6545i | −0.1836 + 0.3695i |
| 120 | −0.9956 + 0.2257i | −0.9481 + 0.1552i | −0.9629 + 0.1113i | −0.4145 + 0.0709i |
| 121 | −0.9956 + 0.2259i | −0.9352 + 0.2200i | −0.9226 + 0.2849i | −0.4266 + 0.2100i |
| 122 | −1.0326 + 0.2276i | −1.0449 + 0.1577i | −1.1062 + 0.1118i | −0.2912 + 0.0730i |
| 123 | −1.0326 + 0.2278i | −1.0255 + 0.2548i | −1.0674 + 0.3393i | −0.2982 + 0.2177i |
| 124 | −0.8635 + 0.5446i | −0.7800 + 0.5609i | −0.7234 + 0.6223i | −0.4766 + 0.4821i |
| 125 | −0.8636 + 0.5445i | −0.8167 + 0.5060i | −0.8211 + 0.4860i | −0.4497 + 0.3448i |
| 126 | −0.8910 + 0.5694i | −0.8501 + 0.6276i | −0.8457 + 0.7260i | −0.3334 + 0.5025i |
| 127 | −0.8911 + 0.5692i | −0.9052 + 0.5452i | −0.9640 + 0.5518i | −0.3125 + 0.3601i |
| 128 | 0.1524 − 0.3087i | 0.1170 − 0.3003i | 0.0899 − 0.1337i | 1.2412 − 1.0688i |
| 129 | 0.1525 − 0.3087i | 0.1171 − 0.3003i | 0.0910 − 0.1377i | 1.2668 − 0.8034i |

TABLE 31-continued

| Label (int.) | CR 5/15 Constellation | CR 7/15 Constellation | CR 9/15 Constellation | CR 13/15 Constellation |
|---|---|---|---|---|
| 130 | 0.1513 − 0.3043i | 0.1204 − 0.3233i | 0.0873 − 0.3862i | 0.9860 − 1.1758i |
| 131 | 0.1513 − 0.3043i | 0.1204 − 0.3233i | 0.0883 − 0.3873i | 1.0365 − 0.9065i |
| 132 | 0.1682 − 0.3004i | 0.1454 − 0.2877i | 0.1115 − 0.1442i | 1.2111 − 0.5135i |
| 133 | 0.1682 − 0.3005i | 0.1453 − 0.2877i | 0.1135 − 0.1472i | 1.4187 − 0.6066i |
| 134 | 0.1663 − 0.2964i | 0.1566 − 0.3074i | 0.2067 − 0.3591i | 1.0103 − 0.4879i |
| 135 | 0.1663 − 0.2964i | 0.1565 − 0.3074i | 0.1975 − 0.3621i | 1.0380 − 0.6906i |
| 136 | 0.1964 − 0.6584i | 0.1427 − 0.6856i | 0.1048 − 0.7533i | 0.6963 − 1.3442i |
| 137 | 0.1965 − 0.6583i | 0.1562 − 0.6826i | 0.1770 − 0.7412i | 0.7089 − 1.1122i |
| 138 | 0.1967 − 0.6652i | 0.1422 − 0.6584i | 0.1022 − 0.5904i | 0.1256 − 1.4745i |
| 139 | 0.1968 − 0.6652i | 0.1529 − 0.6560i | 0.1191 − 0.5890i | 0.8331 − 0.9455i |
| 140 | 0.3371 − 0.5987i | 0.3840 − 0.5856i | 0.4264 − 0.6230i | 0.6615 − 0.6012i |
| 141 | 0.3370 − 0.5987i | 0.3723 − 0.5931i | 0.3650 − 0.6689i | 0.6894 − 0.7594i |
| 142 | 0.3414 − 0.6039i | 0.3651 − 0.5660i | 0.3254 − 0.5153i | 0.8373 − 0.5633i |
| 143 | 0.3413 − 0.6039i | 0.3559 − 0.5718i | 0.2959 − 0.5302i | 0.8552 − 0.7410i |
| 144 | 0.3087 − 0.1524i | 0.3003 − 0.1170i | 0.3256 − 0.0768i | 1.2666 − 0.1027i |
| 145 | 0.3087 − 0.1525i | 0.3003 − 0.1171i | 0.3266 − 0.0870i | 1.4915 − 0.1198i |
| 146 | 0.3043 − 0.1513i | 0.3233 − 0.1204i | 0.4721 − 0.0994i | 1.0766 − 0.0945i |
| 147 | 0.3043 − 0.1513i | 0.3233 − 0.1204i | 0.4721 − 0.1206i | 0.9007 − 0.0848i |
| 148 | 0.3004 − 0.1682i | 0.2877 − 0.1454i | 0.2927 − 0.1267i | 1.2454 − 0.3064i |
| 149 | 0.3005 − 0.1682i | 0.2877 − 0.1453i | 0.2947 − 0.1296i | 1.4646 − 0.3600i |
| 150 | 0.2964 − 0.1663i | 0.3074 − 0.1566i | 0.3823 − 0.2592i | 1.0570 − 0.2995i |
| 151 | 0.2964 − 0.1663i | 0.3074 − 0.1565i | 0.3944 − 0.2521i | 0.9140 − 0.2530i |
| 152 | 0.6584 − 0.1964i | 0.6856 − 0.1427i | 0.7755 − 0.1118i | 0.5461 − 0.0679i |
| 153 | 0.6583 − 0.1965i | 0.6826 − 0.1562i | 0.7513 − 0.2154i | 0.5681 − 0.1947i |
| 154 | 0.6652 − 0.1967i | 0.6584 − 0.1422i | 0.6591 − 0.1033i | 0.6874 − 0.0537i |
| 155 | 0.6652 − 0.1968i | 0.6560 − 0.1529i | 0.6446 − 0.1737i | 0.7375 − 0.1492i |
| 156 | 0.5987 − 0.3371i | 0.5856 − 0.3840i | 0.5906 − 0.4930i | 0.6290 − 0.4553i |
| 157 | 0.5987 − 0.3370i | 0.5931 − 0.3723i | 0.6538 − 0.4155i | 0.6007 − 0.3177i |
| 158 | 0.6039 − 0.3414i | 0.5660 − 0.3651i | 0.4981 − 0.3921i | 0.7885 − 0.4231i |
| 159 | 0.6039 − 0.3413i | 0.5718 − 0.3559i | 0.5373 − 0.3586i | 0.7627 − 0.2849i |
| 160 | 0.3183 − 1.5992i | 0.1683 − 1.7041i | 0.1630 − 1.6621i | 0.0816 − 1.1632i |
| 161 | 0.3186 − 1.5991i | 0.4972 − 1.6386i | 0.4720 − 1.5898i | 0.0830 − 0.9813i |
| 162 | 0.2756 − 1.3848i | 0.1495 − 1.3560i | 0.1268 − 1.3488i | 0.2528 − 1.2315i |
| 163 | 0.2759 − 1.3847i | 0.3814 − 1.3099i | 0.3752 − 1.2961i | 0.2502 − 1.0100i |
| 164 | 0.9060 − 1.3557i | 1.0862 − 1.3238i | 1.0398 − 1.2991i | 0.0732 − 0.6827i |
| 165 | 0.9058 − 1.3559i | 0.8074 − 1.5101i | 0.7733 − 1.4772i | 0.0811 − 0.8293i |
| 166 | 0.7846 − 1.1739i | 0.8534 − 1.0644i | 0.8380 − 1.0552i | 0.2159 − 0.6673i |
| 167 | 0.7843 − 1.1741i | 0.6568 − 1.1958i | 0.6242 − 1.2081i | 0.2359 − 0.8283i |
| 168 | 0.2257 − 0.9956i | 0.1552 − 0.9481i | 0.1103 − 0.9397i | 0.4302 − 1.4458i |
| 169 | 0.2259 − 0.9956i | 0.2200 − 0.9352i | 0.2415 − 0.9155i | 0.5852 − 0.9680i |
| 170 | 0.2276 − 1.0326i | 0.1577 − 1.0449i | 0.1118 − 1.1163i | 0.4528 − 1.2074i |
| 171 | 0.2278 − 1.0326i | 0.2548 − 1.0255i | 0.3079 − 1.0866i | 0.4167 − 1.0099i |
| 172 | 0.5446 − 0.8635i | 0.5609 − 0.7800i | 0.5647 − 0.7638i | 0.5035 − 0.6307i |
| 173 | 0.5445 − 0.8636i | 0.5060 − 0.8167i | 0.4385 − 0.8433i | 0.5359 − 0.7954i |
| 174 | 0.5694 − 0.8910i | 0.6276 − 0.8501i | 0.6846 − 0.8841i | 0.3580 − 0.6532i |
| 175 | 0.5692 − 0.8911i | 0.5452 − 0.9052i | 0.5165 − 1.0034i | 0.3841 − 0.8207i |
| 176 | 1.5992 − 0.3183i | 1.7041 − 0.1683i | 1.6489 − 0.1630i | 0.0576 − 0.0745i |
| 177 | 1.5991 − 0.3186i | 1.6386 − 0.4972i | 1.5848 − 0.4983i | 0.0581 − 0.2241i |
| 178 | 1.3848 − 0.2756i | 1.3560 − 0.1495i | 1.3437 − 0.1389i | 0.1720 − 0.0742i |
| 179 | 1.3847 − 0.2759i | 1.3099 − 0.3814i | 1.2850 − 0.4025i | 0.1753 − 0.2222i |
| 180 | 1.3557 − 0.9060i | 1.3238 − 1.0862i | 1.2728 − 1.0661i | 0.0652 − 0.5269i |
| 181 | 1.3559 − 0.9058i | 1.5101 − 0.8074i | 1.4509 − 0.7925i | 0.0611 − 0.3767i |
| 182 | 1.1739 − 0.7846i | 1.0644 − 0.8534i | 1.0249 − 0.8794i | 0.1972 − 0.5178i |
| 183 | 1.1741 − 0.7843i | 1.1958 − 0.6568i | 1.1758 − 0.6545i | 0.1836 − 0.3695i |
| 184 | 0.9956 − 0.2257i | 0.9481 − 0.1552i | 0.9629 − 0.1113i | 0.4145 − 0.0709i |
| 185 | 0.9956 − 0.2259i | 0.9352 − 0.2200i | 0.9226 − 0.2849i | 0.4266 − 0.2100i |
| 186 | 1.0326 − 0.2276i | 1.0449 − 0.1577i | 1.1062 − 0.1118i | 0.2912 − 0.0730i |
| 187 | 1.0326 − 0.2278i | 1.0255 − 0.2548i | 1.0674 − 0.3393i | 0.2982 − 0.2177i |
| 188 | 0.8635 − 0.5446i | 0.7800 − 0.5609i | 0.7234 − 0.6223i | 0.4766 − 0.4821i |
| 189 | 0.8636 − 0.5445i | 0.8167 − 0.5060i | 0.8211 − 0.4860i | 0.4497 − 0.3448i |
| 190 | 0.8910 − 0.5694i | 0.8501 − 0.6276i | 0.8457 − 0.7260i | 0.3334 − 0.5025i |
| 191 | 0.8911 − 0.5692i | 0.9052 − 0.5452i | 0.9640 − 0.5518i | 0.3125 − 0.3601i |
| 192 | −0.1524 − 0.3087i | −0.1170 − 0.3003i | −0.0899 − 0.1337i | −1.2412 − 1.0688i |
| 193 | −0.1525 − 0.3087i | −0.1171 − 0.3003i | −0.0910 − 0.1377i | −1.2668 − 0.8034i |
| 194 | −0.1513 − 0.3043i | −0.1204 − 0.3233i | −0.0873 − 0.3862i | −0.9860 − 1.1758i |
| 195 | −0.1513 − 0.3043i | −0.1204 − 0.3233i | −0.0883 − 0.3873i | −1.0365 − 0.9065i |
| 196 | −0.1682 − 0.3004i | −0.1454 − 0.2877i | −0.1115 − 0.1442i | −1.2111 − 0.5135i |
| 197 | −0.1682 − 0.3005i | −0.1453 − 0.2877i | −0.1135 − 0.1472i | −1.4187 − 0.6066i |
| 198 | −0.1663 − 0.2964i | −0.1566 − 0.3074i | −0.2067 − 0.3591i | −1.0103 − 0.4879i |
| 199 | −0.1663 − 0.2964i | −0.1565 − 0.3074i | −0.1975 − 0.3621i | −1.0380 − 0.6906i |
| 200 | −0.1964 − 0.6584i | −0.1427 − 0.6856i | −0.1048 − 0.7533i | −0.6963 − 1.3442i |
| 201 | −0.1965 − 0.6583i | −0.1562 − 0.6826i | −0.1770 − 0.7412i | −0.7089 − 1.1122i |
| 202 | −0.1967 − 0.6652i | −0.1422 − 0.6584i | −0.1022 − 0.5904i | −0.1256 − 1.4745i |
| 203 | −0.1968 − 0.6652i | −0.1529 − 0.6560i | −0.1191 − 0.5890i | −0.8331 − 0.9455i |
| 204 | −0.3371 − 0.5987i | −0.3840 − 0.5856i | −0.4264 − 0.6230i | −0.6615 − 0.6012i |
| 205 | −0.3370 − 0.5987i | −0.3723 − 0.5931i | −0.3650 − 0.6689i | −0.6894 − 0.7594i |
| 206 | −0.3414 − 0.6039i | −0.3651 − 0.5660i | −0.3254 − 0.5153i | −0.8373 − 0.5633i |

TABLE 31-continued

| Label (int.) | CR 5/15 Constellation | CR 7/15 Constellation | CR 9/15 Constellation | CR 13/15 Constellation |
| --- | --- | --- | --- | --- |
| 207 | −0.3413 − 0.6039i | −0.3559 − 0.5718i | −0.2959 − 0.5302i | −0.8552 − 0.7410i |
| 208 | −0.3087 − 0.1524i | −0.3003 − 0.1170i | −0.3256 − 0.0768i | −1.2666 − 0.1027i |
| 209 | −0.3087 − 0.1525i | −0.3003 − 0.1171i | −0.3266 − 0.0870i | −1.4915 − 0.1198i |
| 210 | −0.3043 − 0.1513i | −0.3233 − 0.1204i | −0.4721 − 0.0994i | −1.0766 − 0.0945i |
| 211 | −0.3043 − 0.1513i | −0.3233 − 0.1204i | −0.4721 − 0.1206i | −0.9007 − 0.0848i |
| 212 | −0.3004 − 0.1682i | −0.2877 − 0.1454i | −0.2927 − 0.1267i | −1.2454 − 0.3064i |
| 213 | −0.3005 − 0.1682i | −0.2877 − 0.1453i | −0.2947 − 0.1296i | −1.4646 − 0.3600i |
| 214 | −0.2964 − 0.1663i | −0.3074 − 0.1566i | −0.3823 − 0.2592i | −1.0570 − 0.2995i |
| 215 | −0.2964 − 0.1663i | −0.3074 − 0.1565i | −0.3944 − 0.2521i | −0.9140 − 0.2530i |
| 216 | −0.6584 − 0.1964i | −0.6856 − 0.1427i | −0.7755 − 0.1118i | −0.5461 − 0.0679i |
| 217 | −0.6583 − 0.1965i | −0.6826 − 0.1562i | −0.7513 − 0.2154i | −0.5681 − 0.1947i |
| 218 | −0.6652 − 0.1967i | −0.6584 − 0.1422i | −0.6591 − 0.1033i | −0.6874 − 0.0537i |
| 219 | −0.6652 − 0.1968i | −0.6560 − 0.1529i | −0.6446 − 0.1737i | −0.7375 − 0.1492i |
| 220 | −0.5987 − 0.3371i | −0.5856 − 0.3840i | −0.5906 − 0.4930i | −0.6290 − 0.4553i |
| 221 | −0.5987 − 0.3370i | −0.5931 − 0.3723i | −0.6538 − 0.4155i | −0.6007 − 0.3177i |
| 222 | −0.6039 − 0.3414i | −0.5660 − 0.3651i | −0.4981 − 0.3921i | −0.7885 − 0.4231i |
| 223 | −0.6039 − 0.3413i | −0.5718 − 0.3559i | −0.5373 − 0.3586i | −0.7627 − 0.2849i |
| 224 | −0.3183 − 1.5992i | −0.1683 − 1.7041i | −0.1630 − 1.6621i | −0.0816 − 1.1632i |
| 225 | −0.3186 − 1.5991i | −0.4972 − 1.6386i | −0.4720 − 1.5898i | −0.0830 − 0.9813i |
| 226 | −0.2756 − 1.3848i | −0.1495 − 1.3560i | −0.1268 − 1.3488i | −0.2528 − 1.2315i |
| 227 | −0.2759 − 1.3847i | −0.3814 − 1.3099i | −0.3752 − 1.2961i | −0.2502 − 1.0100i |
| 228 | −0.9060 − 1.3557i | −1.0862 − 1.3238i | −1.0398 − 1.2991i | −0.0732 − 0.6827i |
| 229 | −0.9058 − 1.3559i | −0.8074 − 1.5101i | −0.7733 − 1.4772i | −0.0811 − 0.8293i |
| 230 | −0.7846 − 1.1739i | −0.8534 − 1.0644i | −0.8380 − 1.0552i | −0.2159 − 0.6673i |
| 231 | −0.7843 − 1.1741i | −0.6568 − 1.1958i | −0.6242 − 1.2081i | −0.2359 − 0.8283i |
| 232 | −0.2257 − 0.9956i | −0.1552 − 0.9481i | −0.1103 − 0.9397i | −0.4302 − 1.4458i |
| 233 | −0.2259 − 0.9956i | −0.2200 − 0.9352i | −0.2415 − 0.9155i | −0.5852 − 0.9680i |
| 234 | −0.2276 − 1.0326i | −0.1577 − 1.0449i | −0.1118 − 1.1163i | −0.4528 − 1.2074i |
| 235 | −0.2278 − 1.0326i | −0.2548 − 1.0255i | −0.3079 − 1.0866i | −0.4167 − 1.0099i |
| 236 | −0.5446 − 0.8635i | −0.5609 − 0.7800i | −0.5647 − 0.7638i | −0.5035 − 0.6307i |
| 237 | −0.5445 − 0.8636i | −0.5060 − 0.8167i | −0.4385 − 0.8433i | −0.5359 − 0.7954i |
| 238 | −0.5694 − 0.8910i | −0.6276 − 0.8501i | −0.6846 − 0.8841i | −0.3580 − 0.6532i |
| 239 | −0.5692 − 0.8911i | −0.5452 − 0.9052i | −0.5165 − 1.0034i | −0.3841 − 0.8207i |
| 240 | −1.5992 − 0.3183i | −1.7041 − 0.1683i | −1.6489 − 0.1630i | −0.0576 − 0.0745i |
| 241 | −1.5991 − 0.3186i | −1.6386 − 0.4972i | −1.5848 − 0.4983i | −0.0581 − 0.2241i |
| 242 | −1.3848 − 0.2756i | −1.3560 − 0.1495i | −1.3437 − 0.1389i | −0.1720 − 0.0742i |
| 243 | −1.3847 − 0.2759i | −1.3099 − 0.3814i | −1.2850 − 0.4025i | −0.1753 − 0.2222i |
| 244 | −1.3557 − 0.9060i | −1.3238 − 1.0862i | −1.2728 − 1.0661i | −0.0652 − 0.5269i |
| 245 | −1.3559 − 0.9058i | −1.5101 − 0.8074i | −1.4509 − 0.7925i | −0.0611 − 0.3767i |
| 246 | −1.1739 − 0.7846i | −1.0644 − 0.8534i | −1.0249 − 0.8794i | −0.1972 − 0.5178i |
| 247 | −1.1741 − 0.7843i | −1.1958 − 0.6568i | −1.1758 − 0.6545i | −0.1836 − 0.3695i |
| 248 | −0.9956 − 0.2257i | −0.9481 − 0.1552i | −0.9629 − 0.1113i | −0.4145 − 0.0709i |
| 249 | −0.9956 − 0.2259i | −0.9352 − 0.2200i | −0.9226 − 0.2849i | −0.4266 − 0.2100i |
| 250 | −1.0326 − 0.2276i | −1.0449 − 0.1577i | −1.1062 − 0.1118i | −0.2912 − 0.0730i |
| 251 | −1.0326 − 0.2278i | −1.0255 − 0.2548i | −1.0674 − 0.3393i | −0.2982 − 0.2177i |
| 252 | −0.8635 − 0.5446i | −0.7800 − 0.5609i | −0.7234 − 0.6223i | −0.4766 − 0.4821i |
| 253 | −0.8636 − 0.5445i | −0.8167 − 0.5060i | −0.8211 − 0.4860i | −0.4497 − 0.3448i |
| 254 | −0.8910 − 0.5694i | −0.8501 − 0.6276i | −0.8457 − 0.7260i | −0.3334 − 0.5025i |
| 255 | −0.8911 − 0.5692i | −0.9052 − 0.5452i | −0.9640 − 0.5518i | −0.3125 − 0.3601i |

Table 31 illustrates an example of a constellation defined by the non-uniform 256-QAM method, but this is merely exemplary. Constellation points can be defined diversely in the non-uniform 256-QAM method, and the constellation points can be defined diversely in other modulation methods such as non-uniform 16-QAM, non-uniform 64-QAM, non-uniform 1024-QAM, non-uniform 4096-QAM, and the like.

The interleaving is performed in the above-described method for the following reasons.

When LDPC codeword bits are mapped onto modulation symbols, the bits may have different reliabilities (that is, receiving performance or receiving probability) according to where the bits are mapped onto in the modulation symbols. The LDPC codeword bits may have different codeword characteristics according to the configuration of a parity check matrix. That is, the LDPC codeword bits may have different codeword characteristics according to the number of 1 existing in the column of the parity check matrix, that is, the column degree.

Accordingly, the interleaver 120 may interleave to map LDPC codeword bits having specific codeword characteristics onto specific bits in a modulation symbol by considering both the codeword characteristics of the LDPC codeword bits and the reliability of the bits constituting the modulation symbol.

For example, when the LDPC codeword formed of bit groups $X_0$ to $X_{44}$ is group-interleaved based on Equation 21 and Table 16, the group interleaver 122 may output the bit groups in the order of $X_{13}, X_{16}, X_4, \ldots, X_{41}, X_{29}$.

In this case, the number of columns of the block interleaver 124 is eight (8) and the number of rows in the first part is 1800 and the number of rows in the second part is 225.

Accordingly, from among the 45 groups constituting the LDPC codeword, five (5) bit groups ($X_{13}, X_{16}, X_4, X_{12}, X_{44}$) may be input to the first part of the first column of the block interleaver 124, five (5) bit groups ($X_{15}, X_8, X_{14}, X_0, X_3$) may be input to the first part of the second column of the block interleaver 124, five (5) bit groups ($X_{30}, X_{20}, X_{35}, X_{21}, X_{10}$) may be input to the first part of the third column of the block interleaver 124, five (5) bit groups ($X_6, X_{19}, X_{17}, X_{26}, X_{39}$) may be input to the first part of the fourth column of the block interleaver 124, five (5) bit groups ($X_7$, $X_{24}$, $X_9$, $X_{27}$, $X_5$) may be input to the first part of the fifth column of the block interleaver 124, five (5) bit groups ($X_{37}$, $X_{23}$, $X_{32}$, $X_{40}$, $X_{31}$) may be input to the first part of the sixth column of the block interleaver 124, five (5) bit groups ($X_{38}$, $X_{42}$, $X_{34}$, $X_{25}$, $X_{36}$) may be input to the first part of the seventh column of the block interleaver 124, and five (5) bit groups ($X_2$, $X_{22}$, $X_{43}$, $X_{33}$, $X_{28}$) may be input to the first part of the eighth column of the block interleaver 124.

In addition, bit group $X_1$, bit group $X_{18}$, bit group $X_{11}$, bit group $X_{41}$, and bit group $X_{29}$ are input to the second part of the block interleaver 124.

That is, the block interleaver 124 may write 225 bits out of 360 bits included in the bit group ($X_1$) from the $1^{st}$ row to the $225^{th}$ row of the second part of the first column in a column direction, and write remaining 135 bits from the $1^{st}$ row to the $135^{th}$ row of the second part of the second column in a column direction. The block interleaver 124 may write 90 bits from among 360 bits included in the bit group ($X_{18}$) from the $136^{th}$ row to the $225^{th}$ row of the second part of the second column in a column direction, write 225 bits from among remaining 270 bits from the $1^{st}$ row to the $225^{th}$ row of the second part of the third column in a column direction, and write 45 bits from the $1^{st}$ row to the $45^{th}$ row of the second part of the fourth column in a column direction. In addition, the block interleaver 124 may write 180 bits out of 360 bits included in the bit group ($X_{11}$) from the $46^{th}$ row to the $225^{th}$ row of the second part of the fourth column in a column direction, and write remaining 180 bits from the $1^{st}$ row to the $180^{th}$ row of the second part of the fifth column in a column direction. In addition, the block interleaver 124 may write 45 bits from among 360 bits included in the bit group ($X_{41}$) from the $181^{st}$ row to the $225^{th}$ row of the second part of the fifth column in a column direction, write 225 bits out of remaining 315 bits from the $1^{st}$ row to the $225^{th}$ row of the second part of the sixth column in a column direction, and write 90 bits from the $1^{st}$ row to the $90^{th}$ row of the second part of the seventh column in a column direction. The block interleaver 124 may write 135 bits from among 360 bits included in the bit group ($X_{29}$) from the $91^{st}$ row to the $225^{th}$ row of the second part of the seventh column in a column direction, and write remaining 225 bits from the $1^{st}$ row to the $225^{th}$ row of the second part of the eighth column in a column direction.

In addition, the block interleaver 124 may output the bits inputted to the $1^{st}$ row to the last row of each column serially, and the bits outputted from the block interleaver 124 may be input to the modulator 130 serially. In this case, the demultiplexer (not shown) may be omitted or the bits may be outputted serially without changing the order of bits inputted to the demultiplexer (not shown). Accordingly, the bits included in each of the bit groups $X_{13}$, $X_{15}$, $X_{30}$, $X_6$, $X_7$, $X_{37}$, $X_{38}$, and $X_2$ may constitute a modulation symbol.

As described above, since a specific bit is mapped onto a specific bit in a modulation symbol through interleaving, a receiver side can achieve high receiving performance and high decoding performance.

Hereinafter, a method for determining $\pi(j)$, which is a parameter used for group interleaving, according to various exemplary embodiments, will be explained. The criteria which needs to be considered is as shown below:

Criteria 1) Determine different interleaving orders based on a modulation method and a code rate.

Criteria 2) Consider functional features of each bit group of an LDPC codeword and functional features of bits constituting a modulation symbol at the same time.

For example, in an LDPC codeword, the leftmost bits may have a better performance than the other bits, and also in a modulation symbol, the leftmost bits may have a better performance that the other bits. In other words, a performance $P(y_i)$ of each bit among eight (8) bits ($y_0$, $y_1$, $y_2$, $y_3$, $y_4$, $y_5$, $y_6$, $y_7$) constituting a non-uniform 256-QAM symbol is represented as following: $P(y_0) \geq P(y_1) \geq P(y_2) \geq P(y_3) \geq P(y_4) \geq P(y_5) \geq P(y_6) \geq P(y_7)$.

Therefore, when a length of an LDPC codeword is 16200, and non-uniform 256-QAM (or, referred to as 256-NUQ) is used, it is determined which bit from among the eight (8) bits of a 256-NUQ symbol is mapped with 45 bit groups, considering characteristics of the code rate and the modulation method simultaneously, and a case of the highest estimated performance is determined by using a density evolution method.

That is, many cases in which 45 bit groups can be mapped onto the eight (8) bits are considered, and a theoretically estimated threshold value for each case is calculated by the density evolution method. Here, the threshold is a signal-to-noise ratio (SNR) value and an error probability is '0' in an SNR region higher than the threshold value when an LDPC codeword is transmitted. Therefore, when the LDPC codeword is transmitted in a method of the case in which the threshold value is small from among the many cases for mapping, a high performance can be guaranteed. Designing an interleaver based on the density evolution is a theoretical approach. Therefore, the interleaver should be designed by verifying a code performance based on a really designed parity check matrix and based on cycle distribution, as well as the theoretical approach of the density evolution.

Here, considering the many cases in which 45 bit groups can be mapped onto the eight (8) bits refers to re-grouping the bit groups into groups related to the rows of the same degree of the parity check matrix and considering how many groups will be mapped onto the eight (8) 256 QAM bits.

For example, it is assumed that a parity check matrix includes rows having degrees of 16, 10, 3 and 2, and the numbers of bit groups related to each of these rows are 3, 5, 19, 18.

Meanwhile, in the case of the non-uniform 256-QAM method, a relative size of a receiving function $P(y_i)$ of each bit constituting a modulation symbol is represented as following: $P(y_0) \geq P(y_1) \geq P(y_2) \geq P(y_3) \geq P(y_4) \geq P(y_5) \geq P(y_6) \geq P(y_7)$ Here, $y_0$, $y_1$ have the largest impact on a receiving performance of the bits constituting a modulation symbol, and accordingly, which bit group is to be mapped with respect to $y_0$, $y_1$ needs to be determined.

For bit groups which are mapped to $y_0$ and $y_1$, $P(y_0)$ and $P(y_1)$ are used, and for bit groups which are mapped to other bits (that is, $y_2$, $y_3$, $y_4$, $y_5$, $y_6$, $y_7$), an average probability is used, and the number of cases where bit groups are mapped to $y_0$ and $y_1$ is calculated as shown below.

| modulated bits | degree | the number of cases where bit groups are mapped |
|---|---|---|
| $y_0$, $y_1$ | 16 | $_3C_{x1}$ |
| | 10 | $_5C_{w1}$ |
| | 3 | $_{19}C_{z1}$ |
| | 2 | $_{18}C_{l1}$ |
| $y_2$, $y_3$, $y_4$, $y_5$, $y_6$, $y_7$ | 16 | $_3C_{(3-x1)}$ |
| | 10 | $_5C_{(5-w1)}$ |
| | 3 | $_{19}C_{(19-z1)}$ |
| | 2 | $_{18}C_{(18-l1)}$ |
| sum | | 45 |

That is, from among the bit groups mapped to $y_0$ and $y_i$, when $x_i$ number of bit groups from among bit groups related to a row of which degree is 16 is selected; $w_1$ number of bit groups from among bit groups related to a row of which degree is 16 is selected; $z_1$ number of bit groups from among bit groups related to a row of which degree is 2 is selected; and $l_1$ number of bit groups from among bit groups related to a row of which degree is 2 is selected, the number of cases can be ${}_3C_{x1}+{}_5C_{w1}+{}_{19}C_{z1}+{}_{18}C_{l1}$.

Accordingly, the number of cases with respect to bit groups mapped with remaining bits can be ${}_3C_{(3-x1)}+{}_5C_{(5-w1)}+{}_{19}C_{(19-z1)}+{}_{18}C_{(18-l1)}$.

Then, after estimating functions through density evolution for each case, the case in which the performance would be best will be selected. In other words, to have the best performance through the density evolution, some bit groups are selected from each of the bit groups related to a row of which degree is 16, 10, 3, 2, and it should be determined whether the bit groups need to be mapped with $y_0$ and $y_1$, and then, $x_1$, $w_1$, $z_1$, $l_1$ are determined.

In addition, based on determined $x_1$, $w_1$, $z_1$, $l_1$, which bit group is to be mapped with respect to $y_2$, $y_3$, which has an influence on a receiving performance will be determined.

In this case, with respect to the bit groups mapped with $y_2$ and $y_3$, $P(y_2)$ and $P(y_3)$ are used, and with respect to the bit groups mapped with other bits (that is, $y_4$, $y_5$, $y_6$, $y_7$), an average probability is used. Accordingly, the number of cases in which the bit groups are mapped with $y_2$ and $y_3$ is calculated as shown below.

| modulated bits | degree | the number of cases where bit groups are mapped |
|---|---|---|
| $y_0$, $y_1$ | 16 | $x_1$ |
| | 10 | $w_1$ |
| | 3 | $z_1$ |
| | 2 | $l_1$ |
| $y_2$, $y_3$ | 16 | ${}_{(3-x1)}C_{x2}$ |
| | 10 | ${}_{(5-w1)}C_{w2}$ |
| | 3 | ${}_{(19-z1)}C_{z2}$ |
| | 2 | ${}_{(18-l1)}C_{l2}$ |
| $y_4$, $y_5$, $y_6$, $y_7$ | 16 | ${}_3C_{(3-x1-x2)}$ |
| | 10 | ${}_5C_{(5-w1-w2)}$ |
| | 3 | ${}_{19}C_{(19-z1-z2)}$ |
| | 2 | ${}_{18}C_{(18-l1-l2)}$ |
| sum | | 45 |

In other words, from bit groups mapped with $y_2$ and $y_3$, if $x_2$ is selected from among the bit groups related to a row of which degree is 16, $w_2$ is selected from among the bit groups related to a row of which degree is 10, $z_2$ is selected from among the bit groups related to a row of which degree is 3, and $l_2$ is selected from among the bit groups related to a row of which degree is 2, the number of cases can be ${}_{(3-x1)}C_{x2}+{}_{(5-w1)}C_{w2}+{}_{(19-z1)}C_{z2}+{}_{(18-l1)}C_{l2}$.

Accordingly, the number of cases for the bit groups mapped with remaining bits can be ${}_3C_{(3-x1-x2)}\pm{}_5C_{(5-w1-w2)}\pm{}_{19}C_{(19-z1-z2)}\pm{}_{18}C_{(18-l1-l2)}$.

Then, after estimating a performance through density evolution for each case, the case where the performance would be best will be selected. That is, in order to have the best performance through density evolution, by selecting some bit groups from each of the bit groups related to rows of which degree is 16, 10, 3, 2 and determining whether the bit groups are mapped with $y_2$ and $y_3$, the number of $x_2$, $w_2$, $z_2$, $l_2$ will be determined.

Based on the determined $x_2$, $w_2$, $z_2$, $l_2$, by determining how many number of bit groups are mapped with respect to $y_4$, $y_5$ which have an influence over a receiving performance, how many bit groups are mapped with each of the bits constituting a modulation symbol is finally determined from among bit groups related to rows of which degree is 16, 10, 3, and 2.

Accordingly, the case where how many bit groups are mapped with 256-QAM bits from each of the bit groups related to rows having each degree has the best performance can be determined, and to satisfy this case, the interleaver 120 which can map a specific group of the LDPC with a specific bit in a modulation symbol will be designed.

Consequently, the group interleaving method according to the present exemplary embodiments may be designed based on the method as described above.

Hereinbelow, the group interleaver design will be described in greater detail.

Meanwhile, as described above, in that each of bit groups constituting the LDPC codeword correspond to each column group of the parity check matrix, a degree of each column group has an effect on decoding performance of the LDPC codeword.

For example, that a degree of column groups is relatively high indicates that there are relatively larger number of parity check equations which are related to bit groups corresponding to column groups, the bit groups which correspond to column groups having a relatively high degree within a parity check matrix formed of a plurality of column groups may have a greater effect on decoding performance of the LDPC codeword rather than bit groups which correspond to column groups having a relatively low degree. In other words, if column groups having a relatively high degree are not mapped appropriately, the performance of the LDPC codeword will be substantially degraded.

Therefore, the group interleaver may be designed such that a bit group(s) having the highest degree, from among the bit groups constituting the LDPC codeword, is interleaved according to the $\pi(j)$ and mapped to a specific bit of the modulation symbol (or transmission symbol), and the other bit groups not having the highest degree is randomly mapped to the modulation symbol. Under this condition, by observing actual BER/FER performance, the case where the performance of the LDPC codeword is substantially degraded may be avoided.

Hereinbelow, a case where the encoder 110 performs LDPC encoding by using the code rate 5/15 to generate an LDPC codeword having the length of 16200, and constitutes a modulation symbol by using 256-NUQ will be described in a greater detail.

In this case, the encoder 110 may perform LDPC encoding based on the parity check matrix comprising the information word submatrix defined by Table 14 and the parity submatrix having a diagonal configuration.

Accordingly, the parity check matrix is formed of 45 column groups, and from among the 45 column groups, 10 column groups have the degree of 10, 7 column groups have the degree of 9, 28 column groups have the degree of 1.

Therefore, with respect to only 10 column groups of which the degree is 10, from among the 45 column groups, several $\pi(j)$ for the 10 column groups may be generated to satisfy a predetermined condition in the group interleaver design, and $\pi(j)$ for the other column groups may be remain as a blank. The bit groups which correspond to the other column groups may be set to be mapped randomly onto bits constituting a modulation symbol. Then, $\pi(j)$ for 10 column groups having the most excellent performance is selected by observing actual BER/FER performance regarding a specific SNR value. By fixing a part of $\pi(j)$, i.e. $\pi(j)$ for 10 column groups selected as described above, substantial degradation of the performance of the LDPC codeword may be avoided.

TABLE 32

| | Order of group to be block interleaved π(j) (0 ≤ j < 45) | | | | | | | | | | | | | | | | | | | | | | |
|---|---|---|---|---|---|---|---|---|---|---|---|---|---|---|---|---|---|---|---|---|---|---|---|
| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| π(j)-th block of Group-wise interleaver input | | | | 6 | | 5 | | | 7 | | | | | | | | | | | | | | |
| | | | 9 | | | | | 11 | 10 | | | 13 | 12 | | | 14 | | | 8 | | | | |

Meanwhile, Table 32 maybe be presented as below Table 32-1.

TABLE 32-1

| | Order of group to be block interleaved π(j) (0 ≤ j < 45) | | | | | | | | | |
|---|---|---|---|---|---|---|---|---|---|---|
| j-th block of Group-wise interleaver output | 3 | 5 | 8 | 25 | 30 | 31 | 34 | 35 | 38 | 41 |
| π(j)-th block of Group-wise interleaver input | 6 | 5 | 7 | 9 | 11 | 10 | 13 | 12 | 14 | 8 |

In case of Table 32, Equation 21 may be expressed as $Y_3=X_{\pi(3)}=X_6$, $Y_5=X_{\pi(5)}=X_5$, $Y_8=X_{\pi(8)}=X_7$, $Y_{25}=X_{\pi(25)}=X_9$, $Y_{30}=X_{\pi(30)}=X_{11}$, $Y_{31}=X_{\pi(31)}=X_{10}$, $Y_{34}=X_{\pi(34)}=X_{13}$, $Y_{35}=X_{\pi(35)}=X_{12}$, $Y_{38}=X_{\pi(38)}=X_{14}$, $Y_{41}=X_{\pi(41)}=X_8$.

That is, the group interleaver 122 may rearrange the order of the plurality of bit groups by changing the $6^{th}$ bit group to the $3^{rd}$ bit group, the $5^{th}$ bit group to the $5^{th}$ bit group, the $7^{th}$ bit group to the $8^{th}$ bit group, the $9^{th}$ bit group to the $25^{th}$ bit group, the $11^{th}$ bit group to the $30^{th}$ bit group, the $10^{th}$ bit group to the $31^{st}$ bit group, the $13^{th}$ bit group to the $34^{th}$ bit group, the $12^{th}$ bit group to the $35^{th}$ bit group, the $14^{th}$ bit group to the $38^{th}$ bit group, and the $8^{th}$ bit group to the $41^{st}$ bit group, and by rearranging randomly the other bit groups.

In a case where some bit groups are already fixed, the aforementioned feature is applied in the same manner. In other words, bit groups which correspond to column groups having a relatively high degree from among the other bit groups which are not fixed may have a greater effect on decoding performance of the LDPC codeword than bit groups which correspond to column groups having a relatively low degree. That is, even in the case where degradation of the performance of the LDPC codeword is prevented by fixing the bit groups having the highest degree, the performance of the LDPC codeword may vary according to a method of mapping the other bit groups. Accordingly, a method of mapping bit groups having the next highest degree needs to be selected appropriately, to avoid the case where the performance is relatively poor.

Therefore, in a case where bit groups having the highest degree are already fixed, bit groups having the next highest degree, from among the bit groups constituting the LDPC codeword, may be interleaved according to the π(j) and mapped to a specific bit of a modulation symbol, and the other bit groups may be randomly mapped. Under this condition, by observing actual BER/FER performance, the case where the performance of the LDPC codeword is substantially degraded may be avoided.

Hereinbelow, a case where the encoder 110 performs LDPC encoding by using the code rate 5/15 to generate an LDPC codeword having the length of 16200, and constitutes a modulation symbol by using 256-NUQ will be described in a greater detail.

In this case, the encoder 110 may perform LDPC encoding based on the parity check matrix comprising the information word submatrix defined by Table 14 and the parity submatrix having a diagonal configuration.

Accordingly, the parity check matrix is formed of 45 column groups, and from among the 45 column groups, 10 column groups have the degree of 10, 7 column groups have the degree of 9, and 28 column groups have the degree of 1.

Therefore, in a case where 10 column groups of which the degree is 10 are already fixed as in Table 32, so that, with respect to only 7 column groups of which the degree is 9, from among the other 35 column groups, several π(j) for the 7 column groups may be generated to satisfy a predetermined condition in a group interleaver design, and π(j) for the other column groups may be remain as a blank. The bit groups which correspond to the other column groups may be set to be mapped randomly onto bits constituting a modulation symbol. Then, π(j) for 7 column groups having the most excellent performance is selected by observing actual BER/FER performance regarding a specific SNR value. By fixing a part of π(j), i.e. π(j) for 7 column groups selected as described above, substantial degradation of the performance of the LDPC codeword may be avoided.

TABLE 33

| | Order of group to be block interleaved π(j) (0 ≤ j < 45) | | | | | | | | | | | | | | | | | | | | | | |
|---|---|---|---|---|---|---|---|---|---|---|---|---|---|---|---|---|---|---|---|---|---|---|---|
| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| π(j)-th block of Group-wise interleaver input | | | | 6 | | 5 | | | 7 | | | | | | | | | | | | | | |
| | | | 9 | | | | | 11 | 10 | | | 13 | 12 | | | 14 | | | 8 | | | | |

TABLE 34

Order of group to be block interleaved
π(j) (0 ≤ j < 45)

| j-th block of Group-wise interleaver output | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| | 23 | 24 | 25 | 26 | 27 | 28 | 29 | 30 | 31 | 32 | 33 | 34 | 35 | 36 | 37 | 38 | 39 | 40 | 41 | 42 | 43 | 44 | |
| π(j)-th block of Group-wise interleaver input | 4 | | 3 | 6 | | 5 | 0 | 2 | 7 | | | | | | | | 1 | | | | | | |
| | | 9 | | | | | | 11 | 10 | | | 13 | 12 | | 15 | 14 | | 16 | 8 | | | | |

Meanwhile, Table 34 may be presented as below Table 34-1.

TABLE 34-1

Order of group to be block interleaved
π(j) (0 ≤ j < 45)

| j-th block of Group-wise interleaver output | 0 | 2 | 3 | 5 | 6 | 7 | 8 | 16 | 25 | 30 | 31 | 34 | 35 | 37 | 38 | 40 | 41 |
|---|---|---|---|---|---|---|---|---|---|---|---|---|---|---|---|---|---|
| π(j)-th block of Group-wise interleaver input | 4 | 3 | 6 | 5 | 0 | 2 | 7 | 1 | 9 | 11 | 10 | 13 | 12 | 15 | 14 | 16 | 8 |

In case of Table 34, Equation 21 may be expressed as $Y_0=X_{\pi(0)}=X_4$, $Y_2=X_{\pi(2)}=X_3$, $Y_3=X_{\pi(3)}=X_6$, ..., $Y_{38}=X_{\pi(38)}=X_{14}$, $Y_{40}=X_{\pi(40)}=X_{16}$, $Y_{41}=X_{\pi(41)}=X_8$.

That is, the group interleaver 122 may rearrange the order of the plurality of bit groups by changing the $4^{th}$ bit group to the $0^{th}$ bit group, the $3^{rd}$ bit group to the $2^{nd}$ bit group, the $6^{th}$ bit group to the $3^{rd}$ bit group, ..., the $14^{th}$ bit group to the $38^{th}$ bit group, the $16^{th}$ bit group to the $40^{th}$ bit group, and the $8^{th}$ bit group to the $41^{st}$ bit group, and by rearranging randomly the other bit groups.

In the exemplary embodiments described above, the case of performing LDPC encoding based on the coding rate of 5/15 and the parity check matrix formed of the information word submatrix defined by Table 14 and the parity submatrix having a diagonal configuration is described, but this is merely exemplary, and even in a case of performing LDPC encoding based on different code rates and different parity check matrix, π(j) can be determined based on the aforementioned method.

Figure 34:
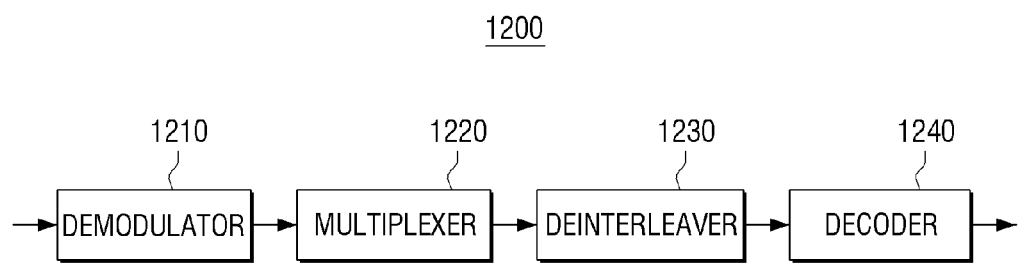
FIG. 34 is a block diagram to illustrate a configuration of a receiving apparatus, according to an exemplary embodiment.

The transmitting apparatus 100 may transmit a signal mapped onto a constellation to a receiving apparatus (for example, 1200 of FIG. 34). For example, the transmitting apparatus 100 may map the signal mapped onto the constellation onto an Orthogonal Frequency Division Multiplexing (OFDM) frame, and transmit the signal to the receiving apparatus 1200 through an allocated channel.

FIG. 34 is a block diagram to illustrate a configuration of a receiving apparatus according to an exemplary embodiment. Referring to FIG. 34, the receiving apparatus 1200 includes a demodulator 1210, a multiplexer 1220, a deinterleaver 1230 and a decoder 1240.

The demodulator 1210 receives and demodulates a signal transmitted from the transmitting apparatus 100 illustrated in FIG. 19. The demodulator 1210 generates a value corresponding to an LDPC codeword by demodulating the received signal, and outputs the value to the multiplexer 1220. In this case, the demodulator 1210 may use a demodulation method corresponding to a modulation method used in the transmitting apparatus 100. To do so, the transmitting apparatus 100 may transmit information regarding the modulation method to the receiving apparatus 1200, or the transmitting apparatus 100 may perform modulation using a pre-defined modulation method between the transmitting apparatus 100 and the receiving apparatus 1500.

The value corresponding to the LDPC codeword may be expressed as a channel value for the received signal. There are various methods for determining the channel value, and for example, a method for determining a Log Likelihood Ratio (LLR) value may be the method for determining the channel value.

The LLR value is a log value for a ratio of a probability that a bit transmitted from the transmitting apparatus 100 is 0 and a probability that the bit is 1. In addition, the LLR value may be a bit value which is determined by a hard decision, or may be a representative value which is determined according to a section to which the probability that the bit transmitted from the transmitting apparatus 100 is 0 or 1 belongs.

The multiplexer 1220 multiplexes an output value of the demodulator 1210 and outputs the value to the deinterleaver 1230.

The multiplexer 1220 is an element corresponding to a demultiplexer of FIG. 33 provided in the transmitting apparatus 100, and performs an operation corresponding to the demultiplexer. That is, the multiplexer 1220 performs an inverse operation of an operation of the demultiplexer, and performs cell-to-bit conversion with respect to the output value of the demodulator 1210 and outputs the LLR value in a unit of a bit. However, when the demultiplexer is omitted from the transmitting apparatus 100, the multiplexer 1220 may be omitted from the receiving apparatus 1200.

The information regarding whether the demultiplexing operation was performed or not may be provided by the transmitting apparatus 100, or may be pre-defined between the transmitting apparatus 100 and the receiving apparatus 1200.

The deinterleaver 1230 deinterleaves an output value of the multiplexer 1220 and outputs the values to the decoder 1240.

The deinterleaver 1230 is an element corresponding to the interleaver 120 of the transmitting apparatus 100, and performs an operation corresponding to the interleaver 120.

That is, the deinterleaver 1230 deinterleaves an LLR value by performing an interleaving operation of the interleaver 120 inversely.

Figure 35:
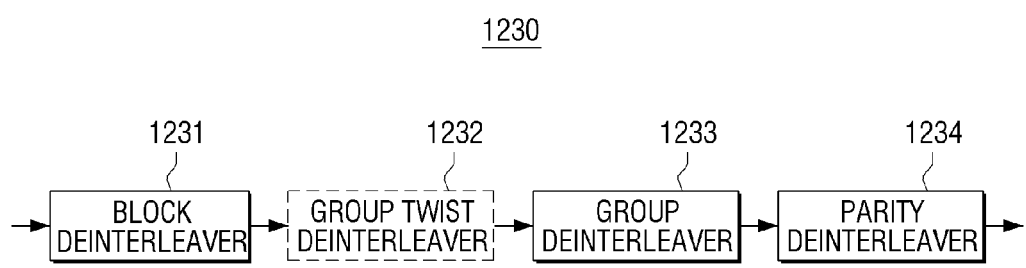
FIG. 35 is a block diagram to illustrate a configuration of a deinterleaver, according to an exemplary embodiment.

To do so, the deinterleaver 1230 may include a block deinterleaver 1231, a group twist deinterleaver 1232, a group deinterleaver 1233, and a parity deinterleaver 1234 as shown in FIG. 35.

The block deinterleaver 1231 deinterleaves the output value of the multiplexer 1220 and outputs the value to the group twist deinterleaver 1232.

The block deinterleaver 1231 is an element corresponding to the block interleaver 124 provided in the transmitting apparatus 100 and performs an interleaving operation of the block interleaver 124 inversely.

That is, the block deinterleaver 1231 deinterleaves by writing the LLR value output from the multiplexer 1220 in each row in the row direction and reading each column of the plurality of rows in which the LLR value is written in the column direction by using at least one row formed of the plurality of columns.

In this case, when the block interleaver 124 interleaves by dividing each column into two parts, the block deinterleaver 1231 may deinterleave by dividing each row into two parts.

In addition, when the block interleaver 124 writes and read a bit group that does not belong to the first part in the row direction, the block deinterleaver 1231 may deinterleave by writing and reading values corresponding to the bit group that does not belong to the first part in the row direction.

Figure 36:
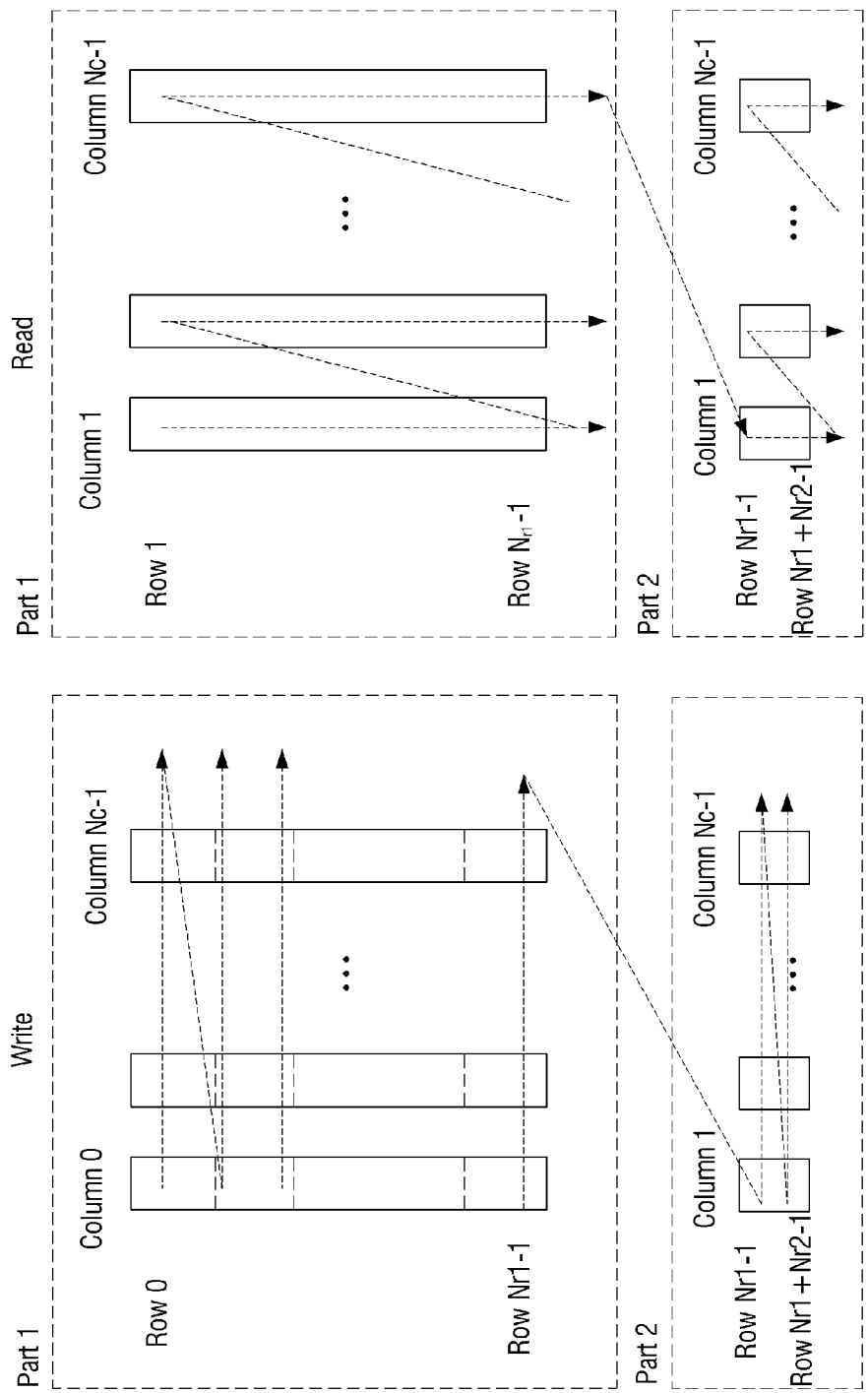
FIG. 36 is a view to illustrate a deinterleaving method of a block deinterleaver, according to an exemplary embodiment.

Hereinafter, the block deinterleaver 1231 will be explained with reference to FIG. 36. However, this is merely an example and the block deinterleaver 1231 may be implemented in other methods.

An input LLR $v_i$ ($0 \leq i < N_{ldpc}$) is written in $r_i$ row and $c_i$ column of the block deinterleaver 1231. Herein, $c_i = (i \bmod N_c)$ and $$r_i = \left\lfloor \frac{i}{N_c} \right\rfloor,$$

On the other hand, an output LLR $q_i (0 \leq i < N_c \times N_{r1})$ is read from $c_i$ column and $r_i$ row of the first part of the block deinterleaver 1231. Herein, $$c_i = \left\lfloor \frac{i}{N_{r1}} \right\rfloor, r_i = (i \bmod N_{r1}).$$

In addition, an output LLR $q_i(N_c \times N_{r1} \leq i < N_{ldpc})$ is read from $c_i$ column and $r_i$ row of the second part. Herein, $$c_i = \left\lfloor \frac{(i - N_c \times N_{r1})}{N_{r2}} \right\rfloor, r_i = N_{r1} + \{(i - N_c \times N_{r1}) \bmod N_{r2}\}.$$

The group twist deinterleaver 1232 deinterleaves an output value of the block deinterleaver 1231 and outputs the value to the group deinterleaver 1233.

The group twist deinterleaver 1232 is an element corresponding to the group twist interleaver 123 provided in the transmitting apparatus 100, and may perform an interleaving operation of the group twist interleaver 123 inversely.

That is, the group twist deinterleaver 1232 may rearrange LLR values of a same bit group by changing the order of the LLR values existing in the same bit group. When the group twist operation is not performed in the transmitting apparatus 100, the group twist deinterleaver 1232 may be omitted.

The group deinterleaver 1233 (or the group-wise deinterleaver) deinterleaves an output value of the group twist deinterleaver 1232 and outputs the value to the parity deinterleaver 1234.

The group deinterleaver 1233 is an element corresponding to the group interleaver 122 provided in the transmitting apparatus 100 and may perform an interleaving operation of the group interleaver 122 inversely.

That is, the group deinterleaver 1233 may rearrange the order of the plurality of bit groups in bit group wise. In this case, the group deinterleaver 1233 may rearrange the order of the plurality of bit groups in bit group wise by applying the interleaving method of Tables 15 to 27 inversely according to a length of the LDPC codeword, a modulation method and a code rate.

The parity deinterleaver 1234 performs parity deinterleaving with respect to an output value of the group deinterleaver 1233 and outputs the value to the decoder 1240.

The parity deinterleaver 1234 is an element corresponding to the parity interleaver 121 provided in the transmitting apparatus 100 and may perform an interleaving operation of the parity interleaver 121 inversely. That is, the parity deinterleaver 1234 may deinterleave LLR values corresponding to parity bits from among the LLR values output from the group deinterleaver 1233. In this case, the parity deinterleaver 1234 may deinterleave the LLR values corresponding to the parity bits inversely to the parity interleaving method of Equation 18.

However, the parity deinterleaver 1234 may be omitted depending on a decoding method and embodiment of the decoder 1240.

Although the deinterleaver 1230 of FIG. 34 includes three (3) or four (4) elements as shown in FIG. 35, operations of the elements may be performed by a single element. For example, when bits each of which belongs to each of bit groups $X_a$, $X_b$, $X_c$, $X_d$ constitute a single modulation symbol, the deinterleaver 1230 may deinterleave these bits to locations corresponding to their bit groups based on a received single modulation symbol.

For example, when the code rate is 7/15 and the modulation method is 256-QAM, the group deinterleaver 1233 may perform deinterleaving based on Table 16.

In this case, bits each of which belongs to each of bit groups $X_{13}$, $X_{15}$, $X_{30}$, $X_6$, $X_7$, $X_{37}$, $X_{38}$, $X_2$ may constitute a single modulation symbol. Since one bit in each of the bit groups $X_{13}$, $X_{15}$, $X_{30}$, $X_6$, $X_7$, $X_{37}$, $X_{38}$, $X_2$ constitutes a single modulation symbol, the deinterleaver 1230 may map bits onto decoding initial values corresponding to the bit groups $X_{13}$, $X_{15}$, $X_{30}$, $X_6$, $X_7$, $X_{37}$, $X_{38}$, $X_2$ based on the received single modulation symbol.

The decoder 1240 may perform LDPC decoding by using an output value of the deinterleaver 1230. To achieve this, the decoder 1240 may include an LDPC decoder (not shown) to perform LDPC decoding.

The decoder 1240 is an element corresponding to the encoder 110 of the transmitting apparatus 100 and may correct an error by performing the LDPC decoding by using LLR values output from the deinterleaver 1230.

For example, the decoder 1240 may perform the LDPC decoding in an iterative decoding method based on a sum-product algorithm. The sum-product algorithm is one example of a message passing algorithm, and the message passing algorithm refers to an algorithm which exchanges messages (e.g., LLR values) through an edge on a bipartite graph, calculates an output message from messages input to variable nodes or check nodes, and updates.

The decoder 1240 may use a parity check matrix when performing the LDPC decoding. In this case, a parity check matrix used in the decoding may have the same configuration as that of a parity check matrix used in encoding at the encoder 110, and this has been described above with reference to FIGS. 20 to 22.

In addition, information on the parity check matrix and information on the code rate, etc. which are used in the LDPC encoding may be pre-stored in the receiving apparatus 1200 or may be provided by the transmitting apparatus 100.

Figure 37:
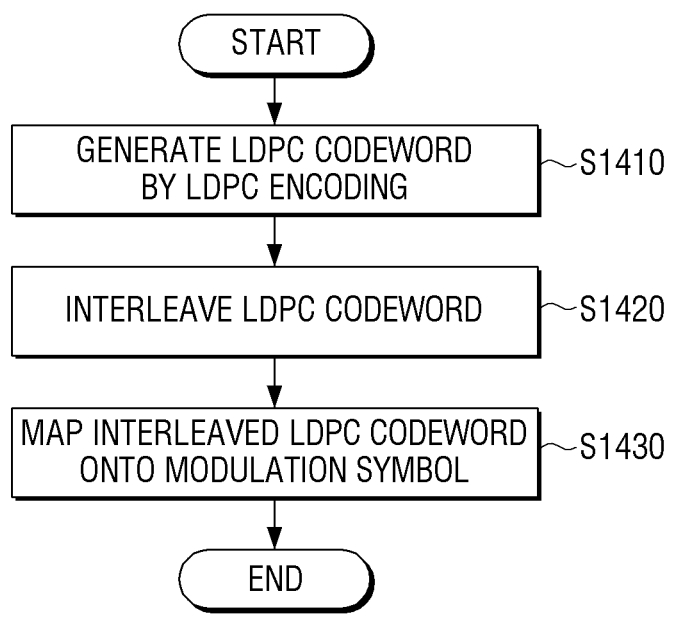
FIG. 37 is a flowchart to illustrate an interleaving method, according to an exemplary embodiment.

FIG. 37 is a flowchart to illustrate an interleaving method of a transmitting apparatus according to an exemplary embodiment.

First, an LDPC codeword is generated by LDPC encoding based on a parity check matrix (S1410), and the LDPC codeword is interleaved (S1420).

Then, the interleaved LDPC codeword is mapped onto a modulation symbol (S1430). In this case, a bit included in a predetermined bit group from among a plurality of bit groups constituting the LDPC codeword may be mapped onto a predetermined bit in the modulation symbol.

Each of the plurality of bit groups may be formed of M number of bits, and M may be a common divisor of $N_{ldpc}$ and $K_{ldpc}$ and may be determined to satisfy $Q_{ldpc}=(N_{ldpc}-K_{ldpc})/M$. Here, $Q_{ldpc}$ is a cyclic shift parameter value regarding columns in a column group of an information word submatrix of the parity check matrix, $N_{ldpc}$ is a length of the LDPC codeword, and $K_{ldpc}$ is a length of information word bits of the LDPC codeword.

In addition, operation S1420 may include interleaving parity bits of the LDPC codeword, dividing the parity-interleaved LDPC codeword by a plurality of bit groups and rearranging the order of the plurality of bit groups in bit group wise, and interleaving the plurality of bit groups the order of which is rearranged.

The order of the plurality of bit groups may be rearranged in bit group wise based on above-described Equation 21.

In this case, $\pi(j)$ in Equation 21 may be determined based on at least one of a length of an LDPC codeword, a modulation method, and a code rate.

For example, when the LDPC codeword has the length of 16200, the modulation method is 256-QAM, and the code rate is 7/15, $\pi(j)$ may be defined as in Table 16.

As another example, when the LDPC codeword has a length of 16200, the modulation method is 256-QAM, and the code rate may be defined as in Table 17.

As still another example, when the length of the LDPC codeword is 16200, the modulation method is 256-QAM, and the code rate is 13/15, $\pi(j)$ can be defined as Table 19.

Meanwhile, at S1420, dividing the LDPC codeword into a plurality of bit groups, rearranging an order of the plurality of bit groups in bit group wise, and interleaving the rearranged plurality of bit groups are included.

Based on Equation 21, the order of the plurality of bit groups can be rearranged in bit group wise.

In this case, in Equation 21, $\pi(j)$ can be determined based on at least one of the length of the LDPC codeword, the modulation method, and the code rate.

As an example, when the length of the LDPC codeword is 16200, the modulation method is 256-QAM, and the code rate is 5/15, $\pi(j)$ can be determined as Table 15.

Meanwhile, this is merely exemplary, and $\pi(j)$ may be defined as Tables 15-27 described above.

As still another example, $\pi(j)$, when the length of the LDPC codeword is 16200, the modulation method is 256-QAM, and the code rate is 13/15, may be defined as Table 19.

Meanwhile, at S1420, dividing the LDPC codeword into the plurality of bit groups, rearranging the order of the plurality of bit groups in bit group wise, and interleaving the plurality of bit groups of which the order is rearranged are included.

Based on Equation 21, the order of a plurality of bit groups may be rearranged in bit group wise.

In this case, in Equation 21, $\pi(j)$ may be determined based on at least one of the length of the LDPC codeword, the modulation method, and the code rate.

As an example, when the length of the LDPC codeword is 16200, the modulation method is 256-QAM, and the code rate is 5/15, $\pi(j)$ can be defined as Table 15.

However, this is merely exemplary, and $\pi(j)$ can be defined as Tables 15-27 as described above.

The interleaving the plurality of bit groups of which the order is rearranged may include: writing the plurality of bit groups in each of a plurality of columns in bit group wise in a column direction, and reading each row of the plurality of columns in which the plurality of bit groups are written in bit group wise in a row direction.

In addition, the interleaving the plurality of bit groups may include: serially write, in the plurality of columns, at least some bit groups which are writable in the plurality of columns in bit group wise from among the plurality of bit groups, and then dividing and writing the other bit groups in an area which remains after the at least some bit groups are written in the plurality of columns in bit group wise.

Figure 38:
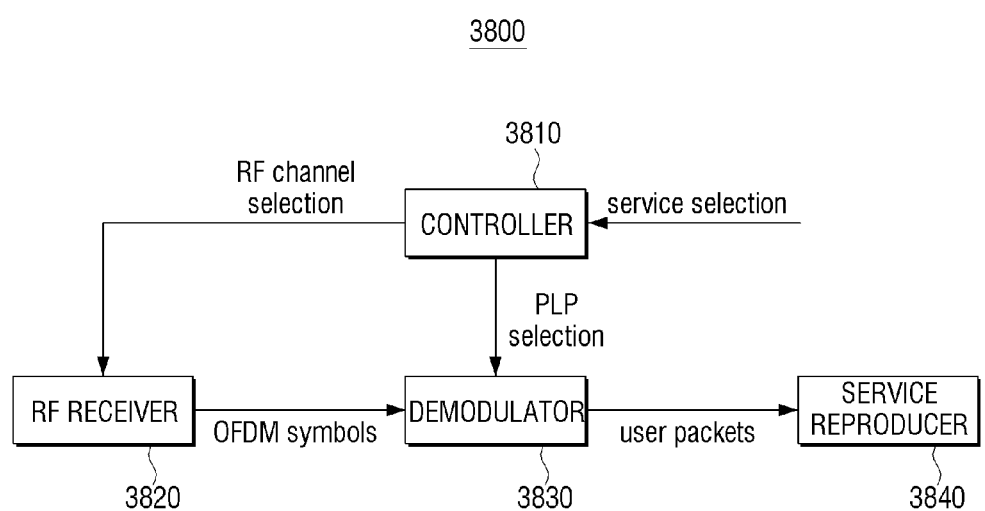
FIG. 38 is a block diagram illustrating a configuration of a receiving apparatus according to an exemplary embodiment.

FIG. 38 is a block diagram illustrating a configuration of a receiving apparatus according to an exemplary embodiment.

Referring to FIG. 38, a receiving apparatus 3800 may comprise a controller 3810, an RF receiver 3820, a demodulator 3830 and a service regenerator 3840.

The controller 3810 determines an RF channel and a PLP through which a selected service is transmitted. The RF channel may be identified by a center frequency and a bandwidth, and the PLP may be identified by its PLP ID. A specific service may be transmitted through at least one PLP included in at least one RF channel, for each component constituting the specific service. Hereinafter, for the sake of convenience of explanation, it is assumed that all of data needed to play back one service is transmitted as one PLP which is transmitted through one RF channel. In other words, a service has only one data obtaining path to reproduce the service, and the data obtaining path is identified by an RF channel and a PLP.

The RF receiver 3820 detects an RF signal from an RF channel selected by a controller 3810 and delivers OFDM symbols, which are extracted by performing signal processing on the RF signal, to the demodulator 3830. Herein, the signal processing may include synchronization, channel estimation, equalization, etc. Information required for the signal processing may be a value predetermined by the receiving apparatus 3810 and a transmitter according to use and implementation thereof and included in a predetermined OFDM symbol among the OFDM symbols and then transmitted to the receiving apparatus.

The demodulator 3830 performs signal processing on the OFDM symbols, extracts user packet and delivers the user packet to a service reproducer 3740, and the service reproducer 3840 uses the user packet to reproduce and then output a service selected by a user. Here, a format of the user packet may differ depending on a service implementation method and may be, for example, a TS packet or a IPv4 packet.

Figure 39:
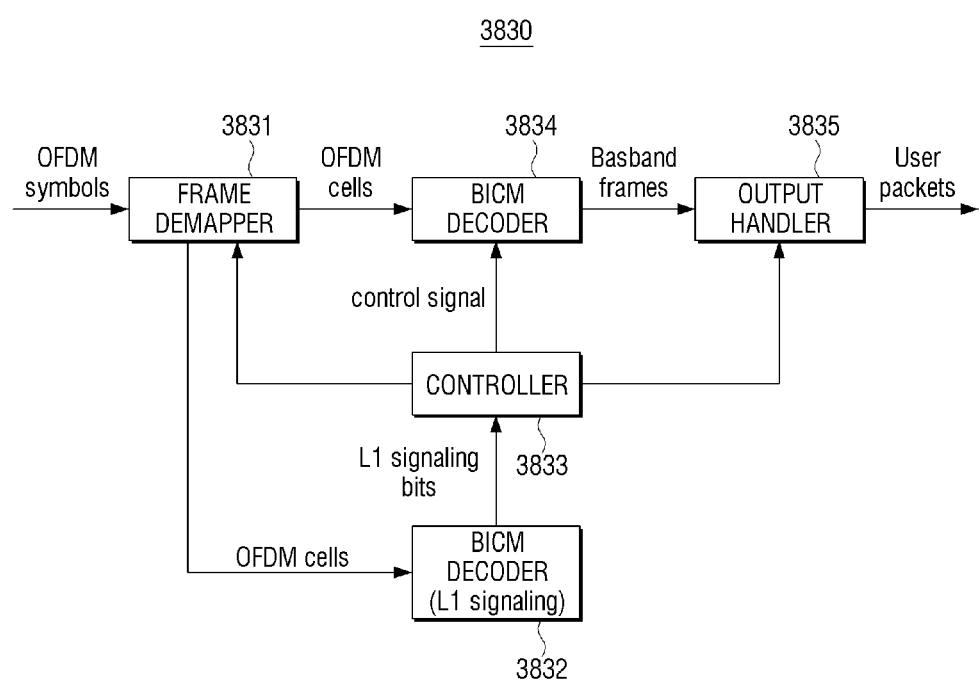
FIG. 39 is a block diagram illustrating a demodulator according to an exemplary embodiment.

FIG. 39 is a block diagram illustrating a demodulator according to an exemplary embodiment.

Referring to FIG. 39, a demodulator 3830 may include a frame demapper 3831, a BICM decoder 3832 for L1 signaling, a controller 3833, a BICM decoder 3834 and an output handler 3835.

The frame demapper 3831 selects a plurality of OFDM cells constituting an FEC block which belongs to a selected PLP in a frame including OFDM symbols, based on control information from the controller 3833, and provides the selected OFDM cells to the BICM decoder 3834. The frame demapper 3831 also selects a plurality of OFDM cells corresponding to at least one FEC block which includes L1 signaling, and delivers the selected OFDM cells to the BICM decoder 3832 for L1 signaling.

The BICM decoder for L1 signaling 3832 performs signal processing on an OFDM cell corresponding to an FEC block which includes L1 signaling, extracts L1 signaling bits and delivers the L1 signaling bits to the controller 3833. In this case, the signal processing may include an operation of extracting an LLR value for decoding an LDPC codeword and a process of using the extracted LLR value to decode the LDPC codeword.

The controller 3833 extracts an L1 signaling table from the L1 signaling bits and uses the L1 signaling table value to control operations of the frame demapper 3831, the BICM decoder 3834 and the output handler 3835. FIG. 39 illustrates that the BICM decoder 3832 for L1 signaling does not use control information of the controller 3833. However, when the L1 signaling has a layer structure similar to the layer structure of the above described L1 pre signaling and L1 post signaling, it is obvious that the BICM decoder 3832 for L1 signaling may be constituted by at least one BICM decoding block, and operation of this BICM decoding block and the frame demapper 3831 may be controlled by L1 signaling information of an upper layer.

The BICM decoder 3834 performs signal processing on the OFDM cells constituting FEC blocks which belong to a selected PLP to extract BBF (Baseband frame)s and delivers the BBFs to the output handler 3835. In this case, the signal processing may include an operation of extracting an LLR value for decoding an LDPC codeword and an operation of using the extracted LLR value to decode the LDPC codeword, which may be performed based on control information output from the controller 3833.

The output handler 3835 performs signal processing on a BBF, extracts a user packet and delivers the extracted user packet to a service reproducer 3840. In this case, the signal processing may be performed based on control information output from the controller 3833.

According to an exemplary embodiment, the output handler 3835 comprises a BBF handler (not shown) which extracts BBP (Baseband packet) from the BBF.

Figure 40:
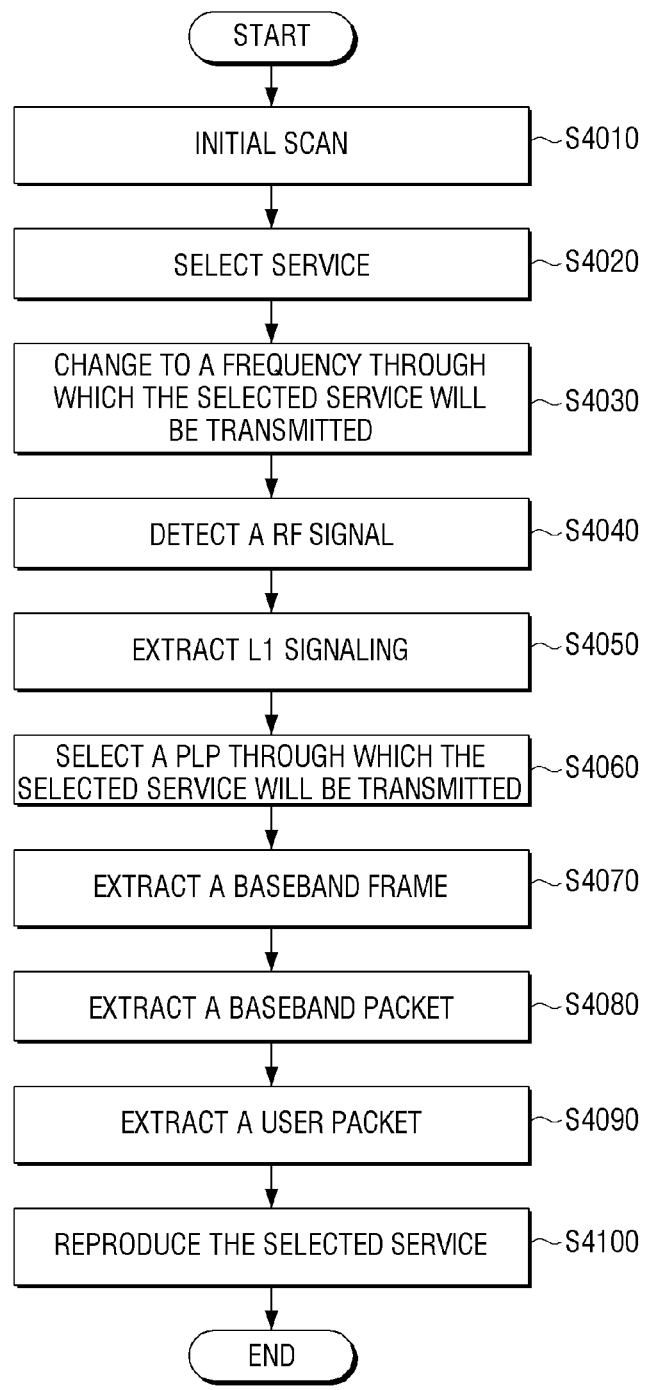
FIG. 40 is a flowchart provided to illustrate an operation of a receiving apparatus from a moment when a user selects a service until the selected service is reproduced, according to an exemplary embodiment.

FIG. 40 is a flowchart provided to illustrate an operation of a receiving apparatus from a moment when a user selects a service until the selected service is reproduced, according to an exemplary embodiment.

It is assumed that service information on all services selectable by a user are acquired at an initial scan (S4010) prior to the user's service selection (S4020). Service information may include information on a RF channel and a PLP which transmits data required to reproduce a specific service in a current receiving apparatus. As an example of the service information, program specific information/service information (PSI/SI) in an MPEG2-TS is available, and normally can be achieved through L2 signaling and an upper-layer signaling.

In the initial scan (S4010), comprehensive information on a payload type of PLPs which are transmitted to a specific frequency band. As an example, there may be information on whether every PLP transmitted to the frequency band includes a specific type of data.

When the user selects a service (S4020), the receiving apparatus transforms the selected service to a transmitting frequency and performs RF signaling detection (S4030). In the frequency transforming operation (S4020), the service information may be used.

When an RF signal is detected, the receiving apparatus performs an L1 signaling extracting operation from the detected RF signal (S4050). Then, the receiving apparatus selects a PLP transmitting the selected service, based on the extracted L1 signaling, (S4060) and extracts a BBF from the selected PLP (S4070). In S4060, the service information may be used.

The operation to extract a BBF (S4070) may include an operation of demapping the transmitted frame and selecting OFDM cells included in a PLP, an operation of extracting an LLR value for LDPC coding/decoding from an OFDM cell, and an operation of decoding the LDPC codeword using the extracted LLR value.

The receiving apparatus, using header information of an extracted BBF, extracts a BBP from the BBF (S4080). The receiving apparatus also uses header information of an extracted BBP to extract a user packet from the extracted BBP (S4090). The extracted user packet is used to reproduce the selected service (S4100). In the BBP extraction operation (S4080) and user packet extraction operation (S4090), L1 signaling information extracted in the L1 signaling extraction operation may be used.

According to an exemplary embodiment, the L1 signaling information includes information on types of a user packet transmitted through a corresponding PLP, and information on an operation used to encapsulate the user packet in a BBF. The foregoing information may be used in the user packet extraction operation (S1480). Specifically, this information may be used in an operation of extracting the user packet which is a reverse operation of encapsulation of the user packet in the BBF. In this case, process for extracting user packet from the BBP (restoring null TS packet and inserting TS sync byte) is same as above description.

A non-transitory computer readable medium, which stores a program for performing the above encoding and/or interleaving methods according to various exemplary embodiments in sequence, may be provided.

The non-transitory computer readable medium refers to a medium that stores data semi-permanently rather than storing data for a very short time, such as a register, a cache, and a memory, and is readable by an apparatus. The above-described various applications or programs may be stored in a non-transitory computer readable medium such as a compact disc (CD), a digital versatile disk (DVD), a hard disk, a Blu-ray disk, a universal serial bus (USB), a memory card, and a read only memory (ROM), and may be provided. Although a bus is not illustrated in the block diagrams of the transmitter apparatus and the receiver apparatus, communication may be performed between each element of each apparatus via the bus. In addition, each apparatus may further include a processor such as a central processing unit (CPU) or a microprocessor to perform the above-described various operations.

At least one of the components, elements or units represented by a block in illustrating the above-described transmitting apparatus and receiving apparatus may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing steps may employ any number of related art techniques for electronics configuration, signal processing and/or control, data processing and the like.

The foregoing exemplary embodiments and advantages are merely exemplary and are not to be construed as limiting the present inventive concept. The exemplary embodiments can be readily applied to other types of apparatuses. Also, the description of the exemplary embodiments is intended to be illustrative, and not to limit the scope of the inventive concept, and many alternatives, modifications, and variations will be apparent to those skilled in the art.

What is claimed is:

1. An interleaving method of a transmitting apparatus, comprising:
    generating a codeword comprising input bits and parity bits, wherein the parity bits are generated based on Low Density Parity Check (LDPC) code according to a code rate of 5/15 and a code length of 16200;
    splitting the codeword into a plurality of bit groups;
    interleaving the plurality of bit groups to provide an interleaved codeword;
    demultiplexing the interleaved codeword into data cells; and
    mapping the data cells onto constellation points based on 256-QAM scheme,
    wherein the interleaving interleaves the plurality of bit groups using a following equation:

$$Y_j = X_{\pi(j)} \text{ for } (0 \leq j < N_{group}),$$

where $X_j$ is a $j^{th}$ group among the plurality of bit groups, $Y_j$ is an interleaved $j^{th}$ bit group, $N_{group}$ is a total number of the plurality of bit groups, and $\pi(j)$ denotes a permutation order for the interleaving, and
wherein the $\pi(j)$ is defined as a table below:

| Code Rate | Order of bits group to be block interleaved π(j) (0 ≤ j < 45) | | | | | | | | | | | |
|---|---|---|---|---|---|---|---|---|---|---|---|---|
| | 0 | 1 | 2 | 3 | 4 | 5 | 6 | 7 | 8 | 9 | 10 | 11 |
| | 23 | 24 | 25 | 26 | 27 | 28 | 29 | 30 | 31 | 32 | 33 | 34 |
| | | 12 | 13 | 14 | 15 | 16 | 17 | 18 | 19 | 20 | 21 | 22 |
| | | 35 | 36 | 37 | 38 | 39 | 40 | 41 | 42 | 43 | 44 | |
| 5/15 | 4 | 23 | 3 | 6 | 18 | 5 | 0 | 2 | 7 | 26 | 21 | 27 |
| | 25 | 33 | 9 | 22 | 36 | 30 | 35 | 11 | 10 | 17 | 32 | 13 |
| | | 39 | 42 | 38 | 31 | 1 | 34 | 20 | 37 | 40 | 24 | 43 |
| | | 12 | 41 | 15 | 14 | 19 | 16 | 8 | 44 | 29 | 28. | |

2. The interleaving method of claim 1, wherein each of the plurality of bit groups comprises 360 bits.

3. The interleaving method of claim 1, wherein $\pi(j)$ is determined based on at least one of the code length, a modulation method for the mapping and the code rate.

* * * * *

UNITED STATES PATENT AND TRADEMARK OFFICE
CERTIFICATE OF CORRECTION

| | |
|---|---|
| PATENT NO. | : 9,602,245 B2 |
| APPLICATION NO. | : 14/716124 |
| DATED | : March 21, 2017 |
| INVENTOR(S) | : Hong-sil Jeong et al. |

It is certified that error appears in the above-identified patent and that said Letters Patent is hereby corrected as shown below:

In the Claims

Column 84, Line 26: In Claim 1, delete "Order of bits group to be block interleaved" and insert --Order of Interleaving--.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*